(12) United States Patent
Prasad et al.

(10) Patent No.: US 11,996,462 B2
(45) Date of Patent: May 28, 2024

(54) FERROELECTRIC FIELD EFFECT TRANSISTORS HAVING ENHANCED MEMORY WINDOW AND METHODS OF MAKING THE SAME

(71) Applicant: SANDISK TECHNOLOGIES LLC, Addison, TX (US)

(72) Inventors: Bhagwati Prasad, San Jose, CA (US); Joyeeta Nag, San Jose, CA (US); Seung-Yeul Yang, Pleasanton, CA (US); Adarsh Rajashekhar, Santa Clara, CA (US); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 691 days.

(21) Appl. No.: 17/097,841

(22) Filed: Nov. 13, 2020

(65) Prior Publication Data

US 2022/0157966 A1    May 19, 2022

(51) Int. Cl.
| | |
|---|---|
| *H01L 29/51* | (2006.01) |
| *H01L 21/28* | (2006.01) |
| *H01L 21/3115* | (2006.01) |
| *H01L 29/66* | (2006.01) |
| *H01L 29/78* | (2006.01) |
| *H10B 51/20* | (2023.01) |
| *H10B 51/30* | (2023.01) |

(52) U.S. Cl.
CPC ...... *H01L 29/516* (2013.01); *H01L 21/31155* (2013.01); *H01L 29/40111* (2019.08); *H01L 29/6684* (2013.01); *H01L 29/78391* (2014.09); *H10B 51/20* (2023.02); *H10B 51/30* (2023.02)

(58) Field of Classification Search
CPC ......... H01L 21/31555; H01L 29/40111; H01L 29/516; H01L 29/6684; H01L 29/78391; H10B 51/20; H10B 51/30; H19B 51/30
See application file for complete search history.

(56) References Cited

U.S. PATENT DOCUMENTS

| | | |
|---|---|---|
| 9,842,839 B1 | 12/2017 | Sills et al. |
| 10,700,093 B1 | 6/2020 | Kalitsov et al. |
| 2002/0061604 A1 | 5/2002 | Sitaram et al. |

(Continued)

FOREIGN PATENT DOCUMENTS

| | | |
|---|---|---|
| CN | 109994477 A | 7/2019 |
| CN | 111739935 A | 10/2020 |

(Continued)

OTHER PUBLICATIONS

USPTO Office Communication, Non-Final Office Action for U.S. Appl. No. 17/097,757, dated Mar. 31, 2022, 21 pages.

(Continued)

*Primary Examiner* — Matthew E Warren
(74) *Attorney, Agent, or Firm* — THE MARBURY LAW GROUP PLLC

(57) ABSTRACT

A ferroelectric transistor includes a semiconductor channel comprising a semiconductor material, a strained and/or defect containing ferroelectric gate dielectric layer located on a surface of the semiconductor channel, a source region located on a first end portion of the semiconductor channel, and a drain region located on a second end portion of the semiconductor channel.

5 Claims, 63 Drawing Sheets

(56) References Cited

U.S. PATENT DOCUMENTS

| | | | |
|---|---|---|---|
| 2002/0090517 A1 | 7/2002 | Zhang et al. | |
| 2002/0108927 A1 | 8/2002 | Hsu | |
| 2002/0140011 A1 | 10/2002 | Zhang et al. | |
| 2002/0154532 A1 | 10/2002 | Miyazawa et al. | |
| 2003/0015497 A1 | 1/2003 | Gill et al. | |
| 2004/0056276 A1 | 3/2004 | Zhang et al. | |
| 2005/0196878 A1 | 9/2005 | Zhang et al. | |
| 2006/0042060 A1 | 3/2006 | Goat | |
| 2006/0088731 A1 | 4/2006 | Kijima et al. | |
| 2006/0091434 A1 | 5/2006 | Eom et al. | |
| 2009/0155931 A1 | 6/2009 | Ma et al. | |
| 2010/0208573 A1 | 8/2010 | Adams | |
| 2010/0288983 A1 | 11/2010 | Gawith et al. | |
| 2011/0241091 A1* | 10/2011 | Dubourdieu | H01L 29/40111 257/532 |
| 2011/0309415 A1 | 12/2011 | Ng et al. | |
| 2012/0177902 A1 | 7/2012 | Driscoll et al. | |
| 2012/0307550 A1* | 12/2012 | Yu | H10B 10/12 365/156 |
| 2014/0042574 A1 | 2/2014 | Carman et al. | |
| 2014/0206107 A1 | 7/2014 | Tanabe | |
| 2015/0358151 A1 | 12/2015 | You et al. | |
| 2015/0364682 A1 | 12/2015 | You et al. | |
| 2016/0276014 A1 | 9/2016 | Fox et al. | |
| 2017/0103988 A1 | 4/2017 | Nishida et al. | |
| 2017/0162587 A1 | 6/2017 | Chavan et al. | |
| 2017/0243875 A1 | 8/2017 | Khan | |
| 2018/0166448 A1 | 6/2018 | Cheng et al. | |
| 2018/0265967 A1 | 9/2018 | Lei et al. | |
| 2018/0269057 A1 | 9/2018 | Lei et al. | |
| 2019/0023817 A1 | 1/2019 | Sodano | |
| 2019/0326836 A1 | 10/2019 | Finkel et al. | |
| 2019/0378977 A1 | 12/2019 | Wu et al. | |
| 2020/0212193 A1 | 7/2020 | Gosavi et al. | |
| 2020/0212194 A1 | 7/2020 | Gosavi et al. | |
| 2020/0227517 A1 | 7/2020 | Shifren et al. | |
| 2020/0287017 A1* | 9/2020 | Chang | H01L 29/516 |
| 2020/0365733 A1* | 11/2020 | Song | H01L 29/7848 |
| 2021/0358952 A1 | 11/2021 | Makala et al. | |
| 2022/0093150 A1 | 3/2022 | Lv et al. | |

FOREIGN PATENT DOCUMENTS

| | | | | |
|---|---|---|---|---|
| JP | 2000243854 A | * | 9/2000 | ....... H01L 21/26506 |
| JP | 2005093753 A | * | 4/2005 | |
| KR | 10-2001-0089510 A | | 10/2001 | |
| KR | 10-2018-0059271 A | | 6/2018 | |
| WO | WO2005/063685 A1 | | 7/2005 | |
| WO | WO2019-139622 A1 | | 7/2019 | |

OTHER PUBLICATIONS

Nukala, P. et al., "Direct Epitaxial Growth of Polar (1-x)HfO2—(x)ZrO2 Ultrathin Films on Silicon," *ACS Appl. Electron. Mater.* 2019, vol. 1, No. 12, 2585-2593, (2019), https://pubs.acs.org/doi/10.1021/acsaelm.9b00585?goto=supporting-info.

U.S. Appl. No. 16/737,088, filed Jan. 8, 2020, SanDisk Technologies LLC.

U.S. Appl. No. 16/778,245, filed Jan. 31, 2020, SanDisk Technologies LLC.

U.S. Appl. No. 16/798,643, filed Feb. 24, 2020, SanDisk Technologies LLC.

U.S. Appl. No. 16/876,816, filed May 18, 2020, SanDisk Technologies LLC.

U.S. Appl. No. 16/876,877, filed May 18, 2020, SanDisk Technologies LLC.

U.S. Appl. No. 16/886,179, filed May 28, 2020, SanDisk Technologies LLC.

Boscke, T.S. et al., "Ferroelectricity in hafnium oxide thin films," Appl. Phys. Lett., vol. 99, 102903 (2011); https://doi.org/10.1063/1.3634052.

Lyu, J. et al., "Epitaxial Integration on Si(001) of Ferroelectric Hf0.5Zr0.5O2 Capacitors with High Retention and Endurance," ACS Appl. Mater. Interfaces, vol. 11, pp. 6224-6229, (2019); DOI: 10.1021/acsami.8b18762.

Machado, P. et al., "Band Gap Tuning of Solution-Processed Ferroelectric Perovskite BiFe1—xCoxO3 Thin Films," Chem. Mater. vol. 31, pp. 947-954, (2019); DOI: 10.1021/acs.chemmater.8b04380.

Pantel, D. et al., "Switching kinetics in epitaxial BiFeO 3 thin films," Journal of Applied Physics, vol. 107, p. 084111 (2010); http://dx.doi.org/10.1063/1.3392884.

Saremi, S. et al., "Electronic Transport and Ferroelectric Switching in Ion-Bombarded, Defect-Engineered BiFeO3 Thin Films," Adv. Mater. Interfaces, vol. 5, p. 1700991, (2018); https://doi.org/10.1002/admi.201700991.

Saremi, S. et al., "Local control of defects and switching properties in ferroelectric thin films," Physical Review Materials, vol. 2, p. 084414, (2018); DOI: 10.1103/PhysRevMaterials.2.084414.

Prasad, B. et al., "Ferroelectric Field Effect Transistors Having Enhanced Memory Window and Methods of Making The Same," U.S. Appl. No. 17/097,757, filed Nov. 13, 2020.

Notification of Transmittal of the International Search Report and the Written Opinion of the International Searching Authority for International Patent Application No. PCT/US2021/036447, dated Nov. 11, 2021, 14 pages.

* cited by examiner

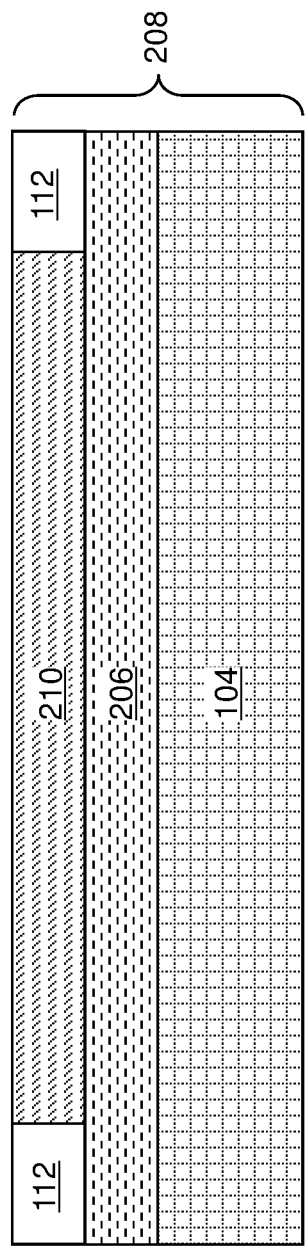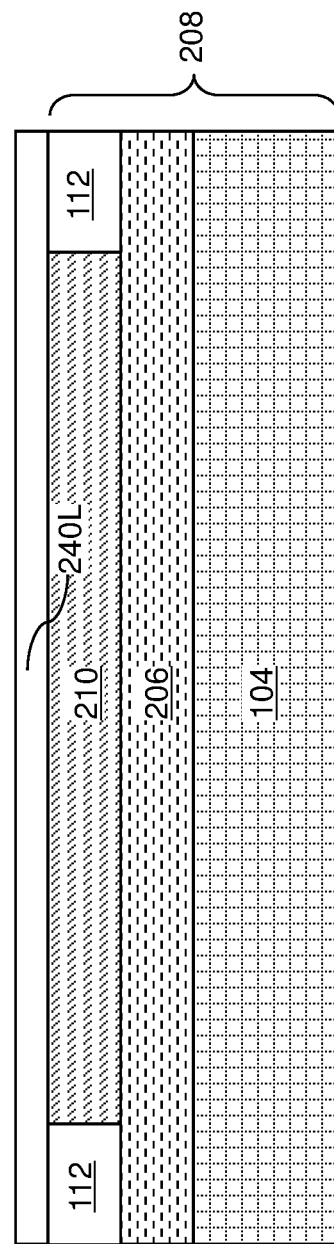

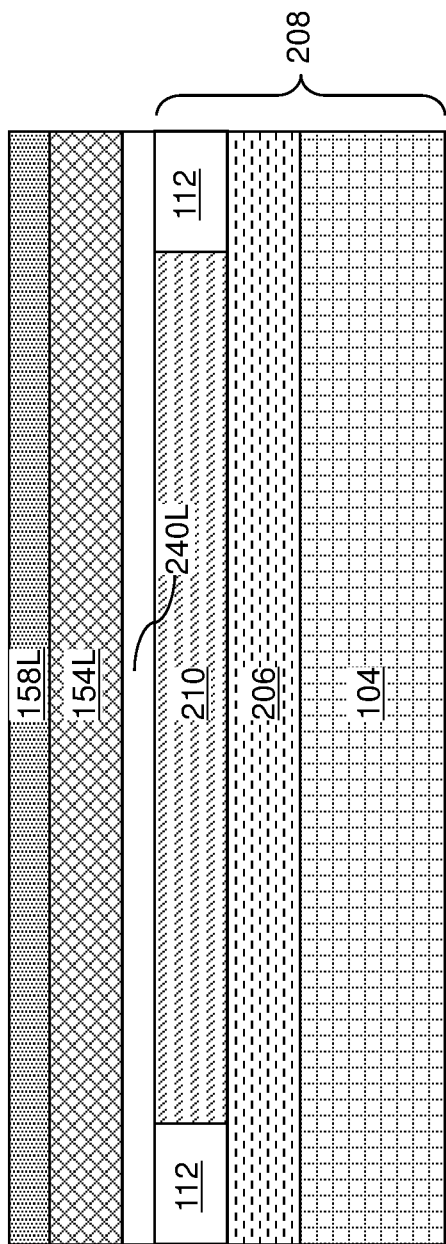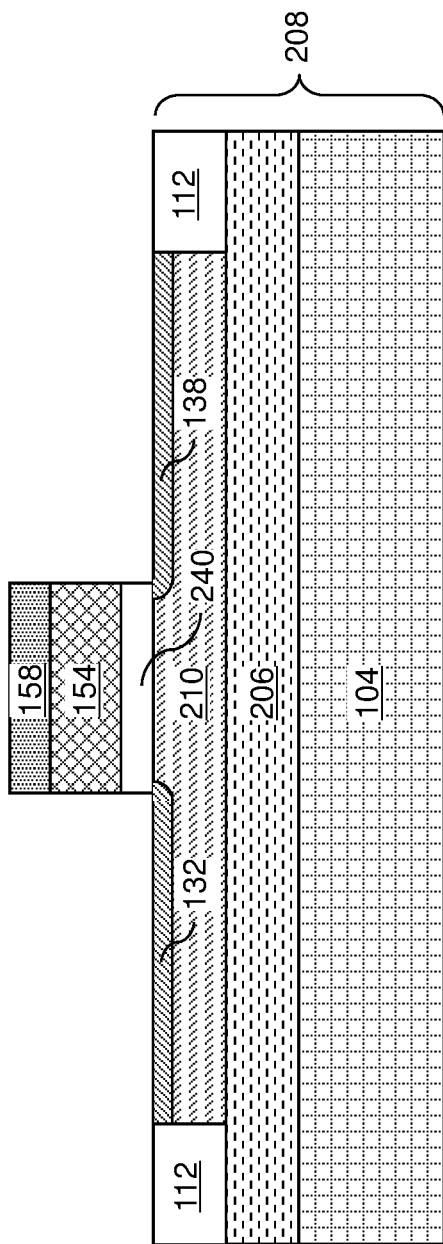

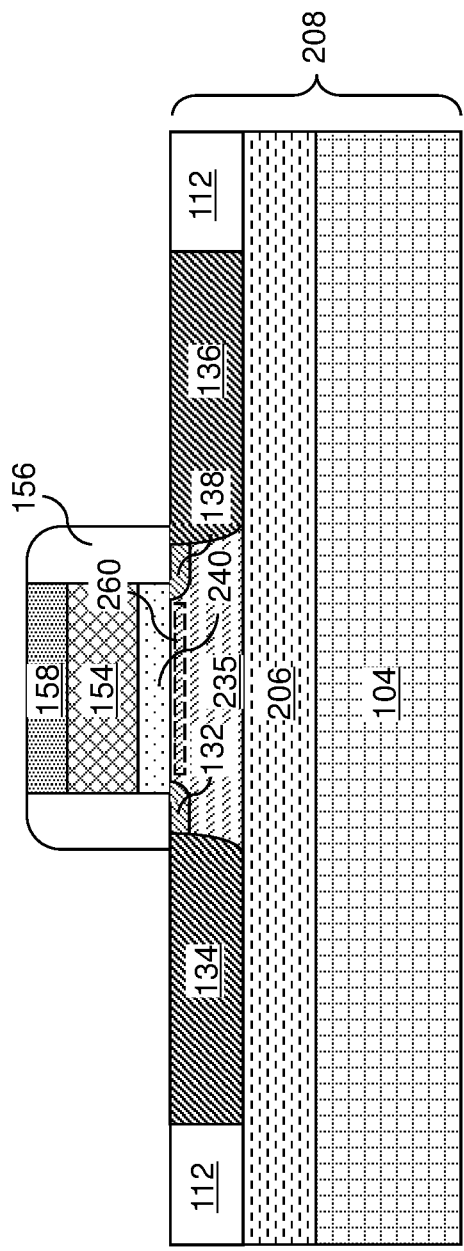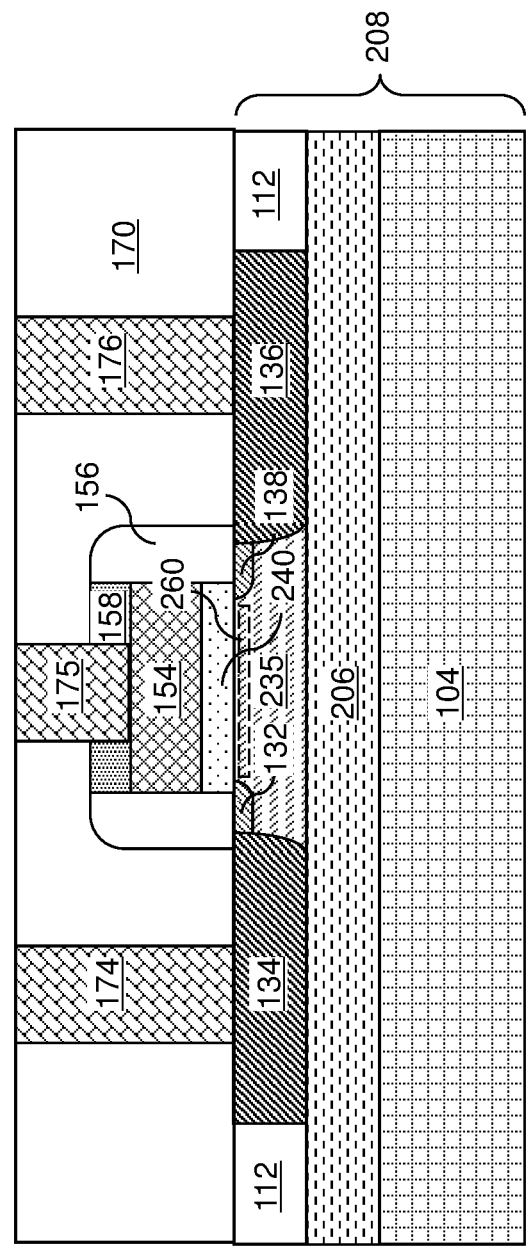

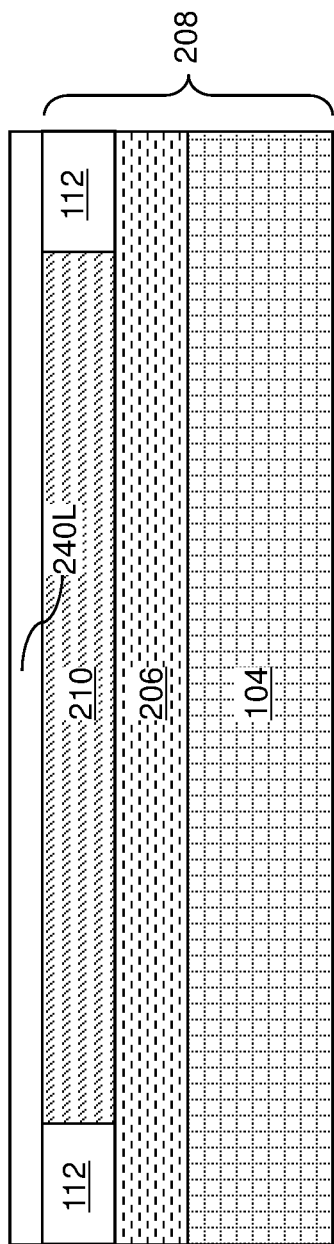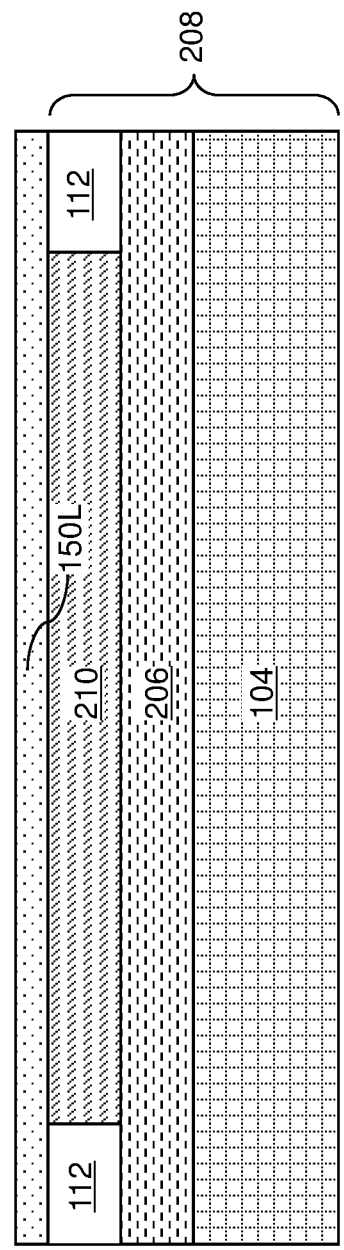
FIG. 2A
FIG. 2B

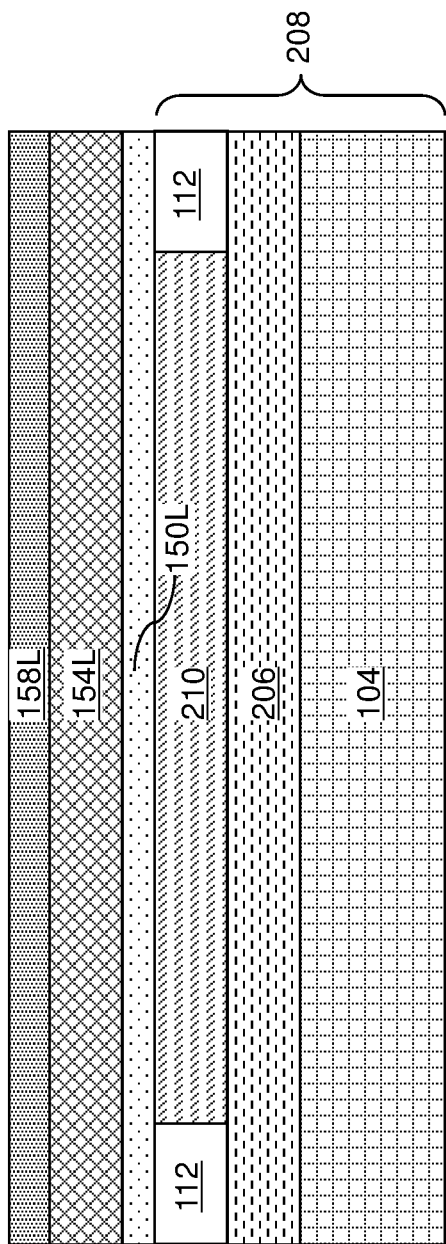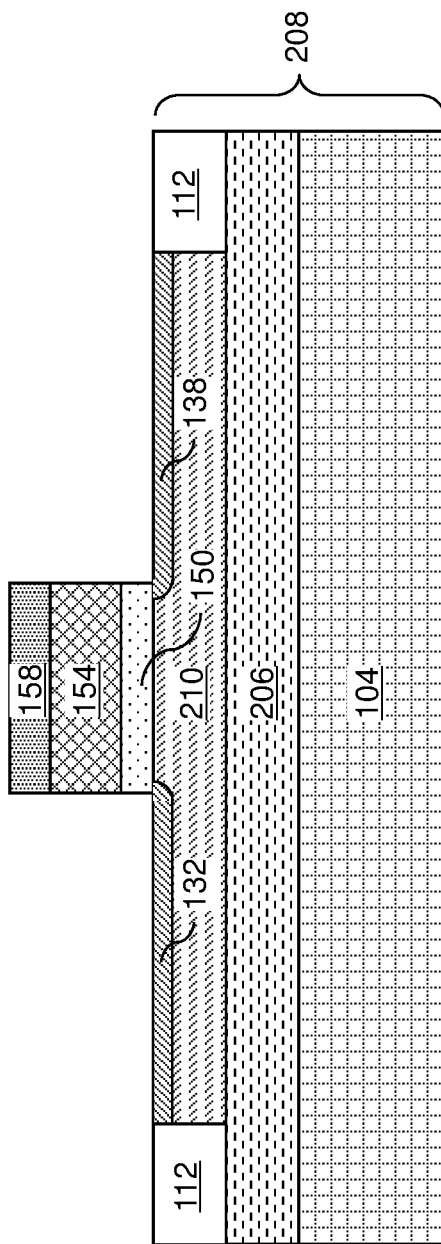

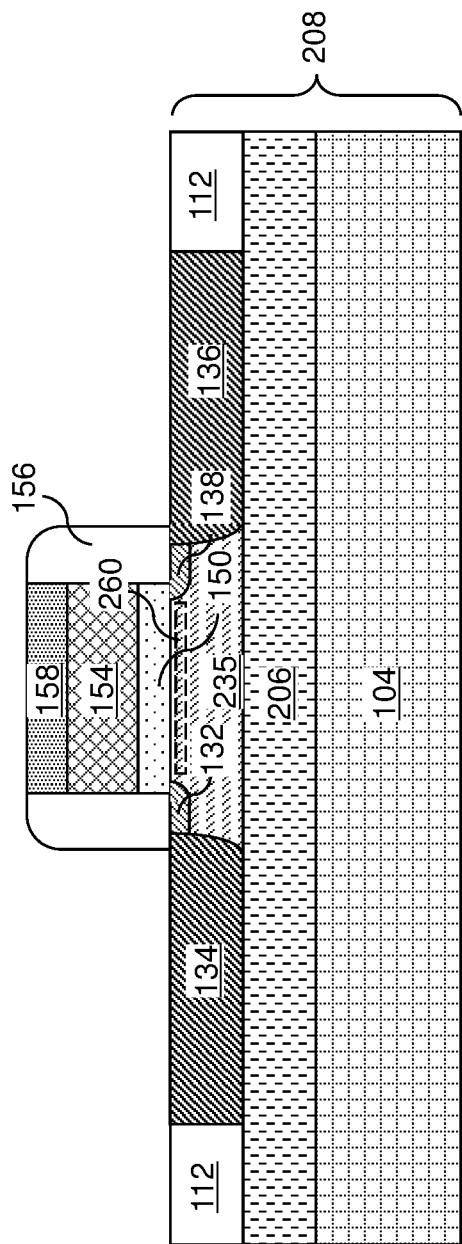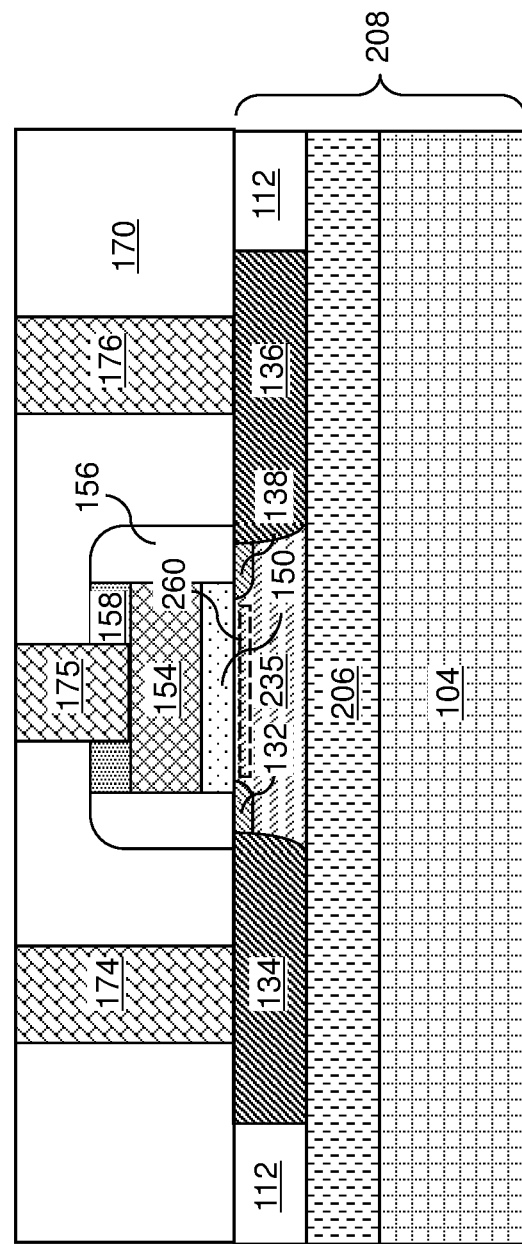

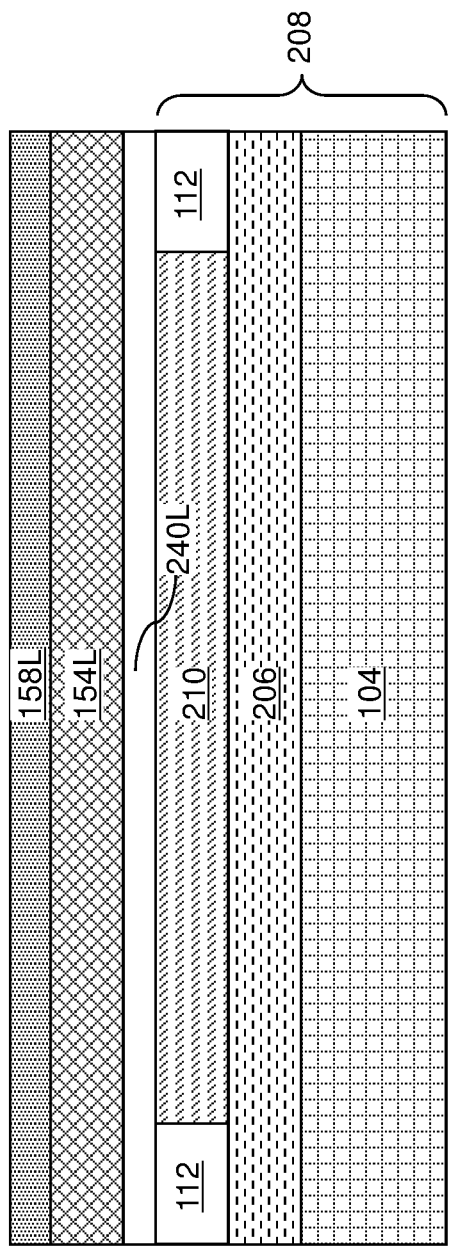
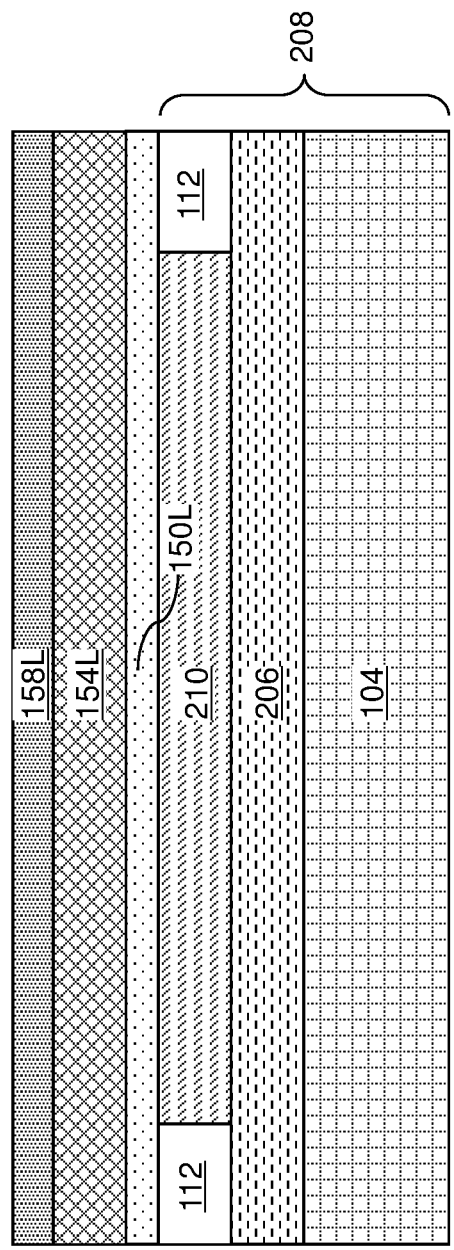
FIG. 3A
FIG. 3B

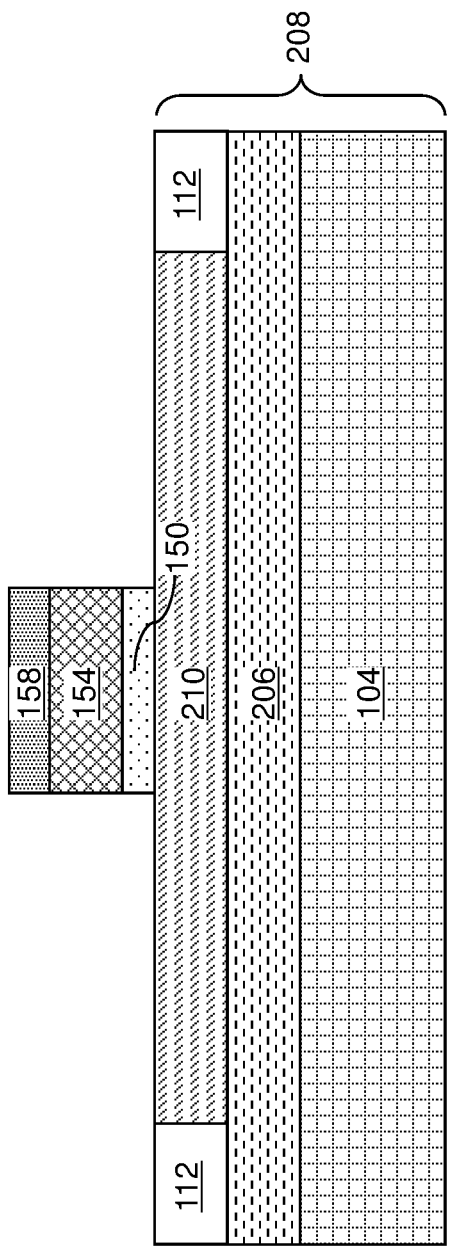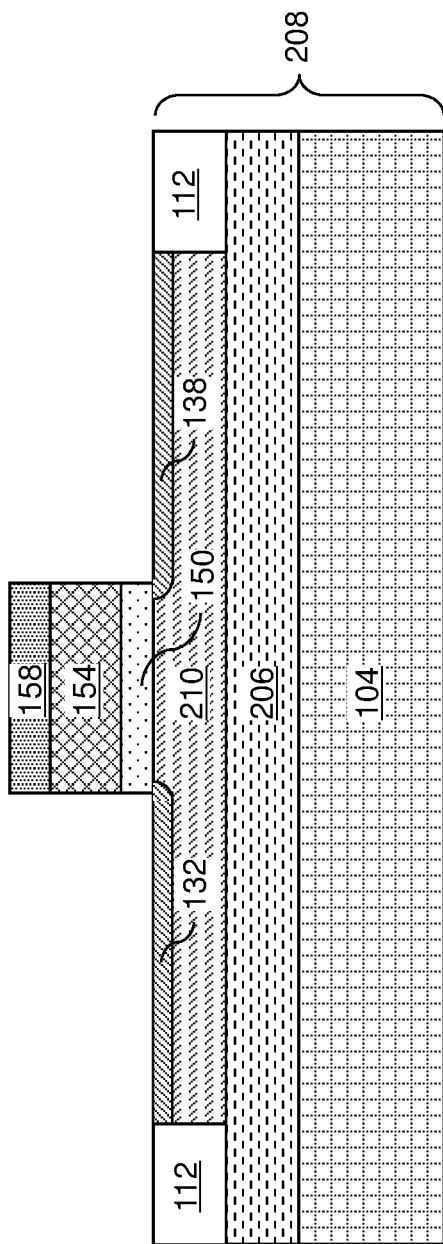

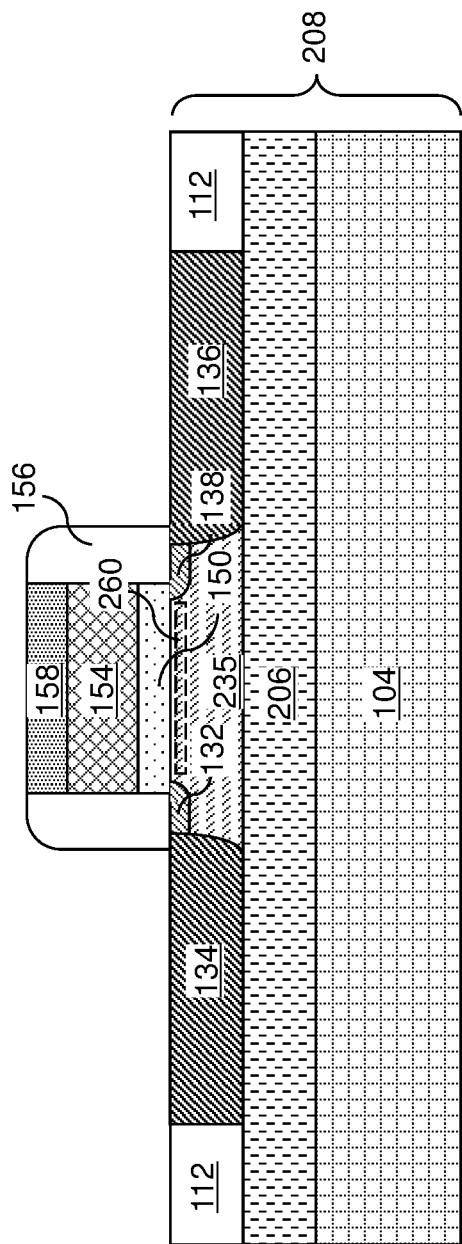
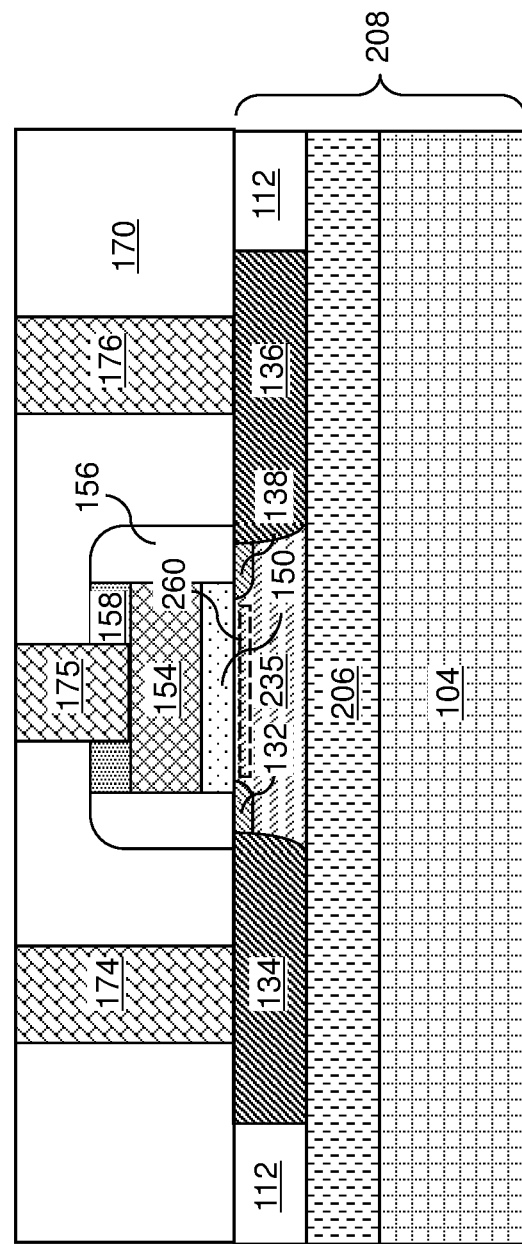

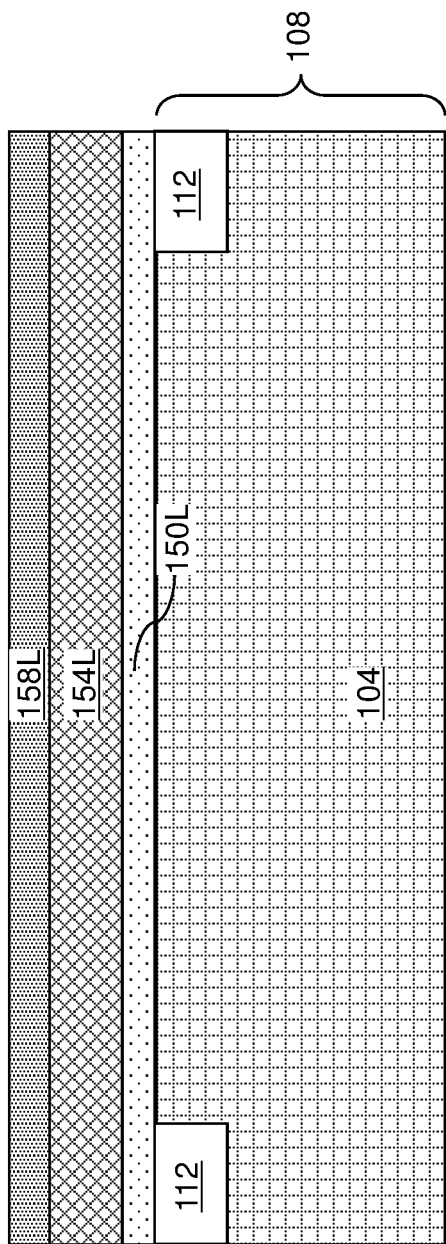
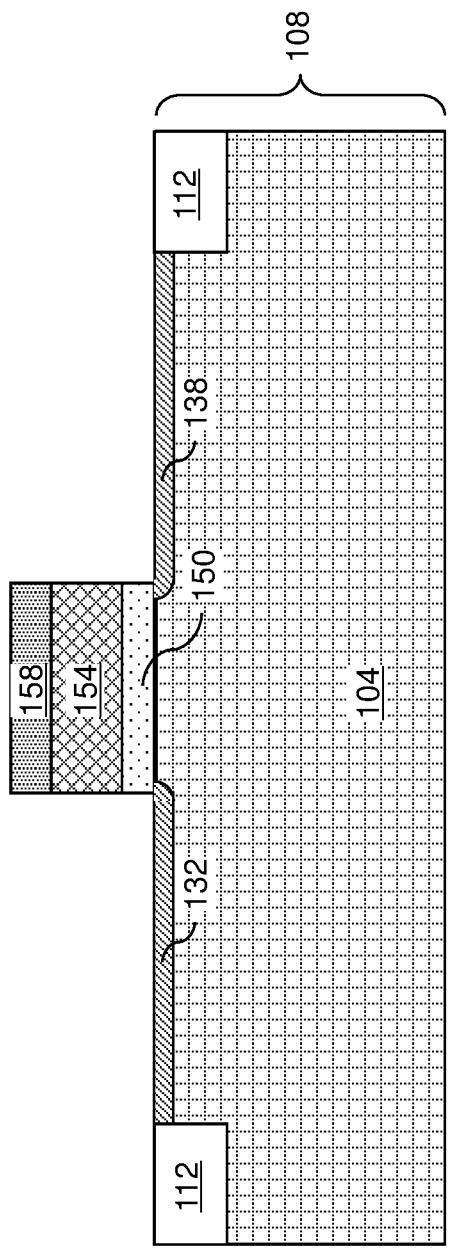

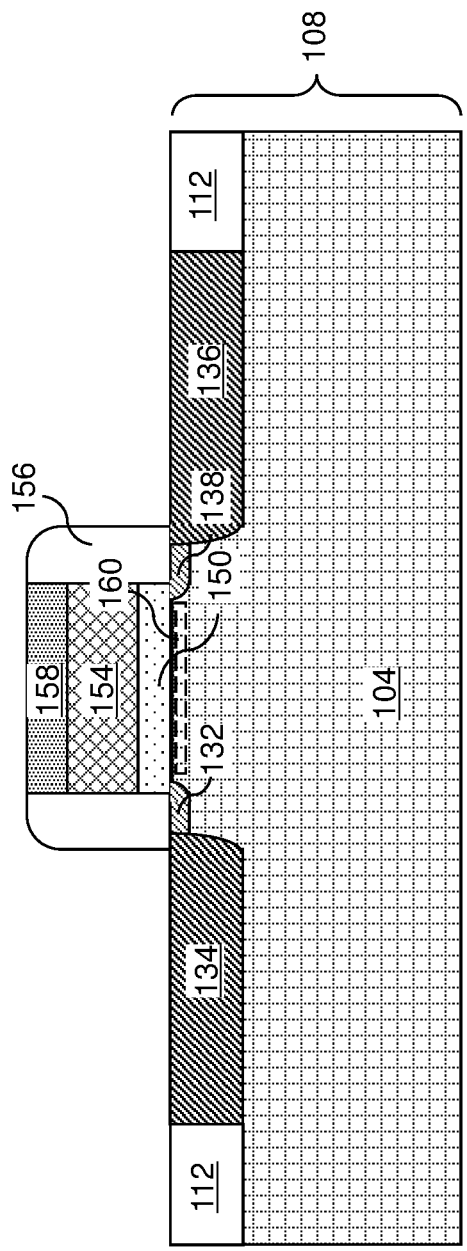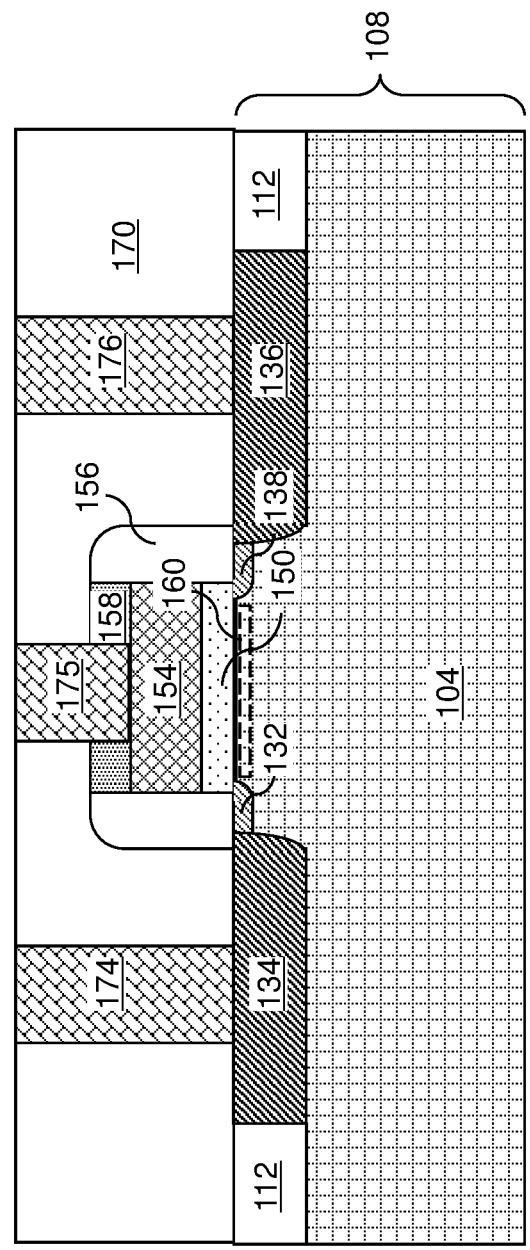

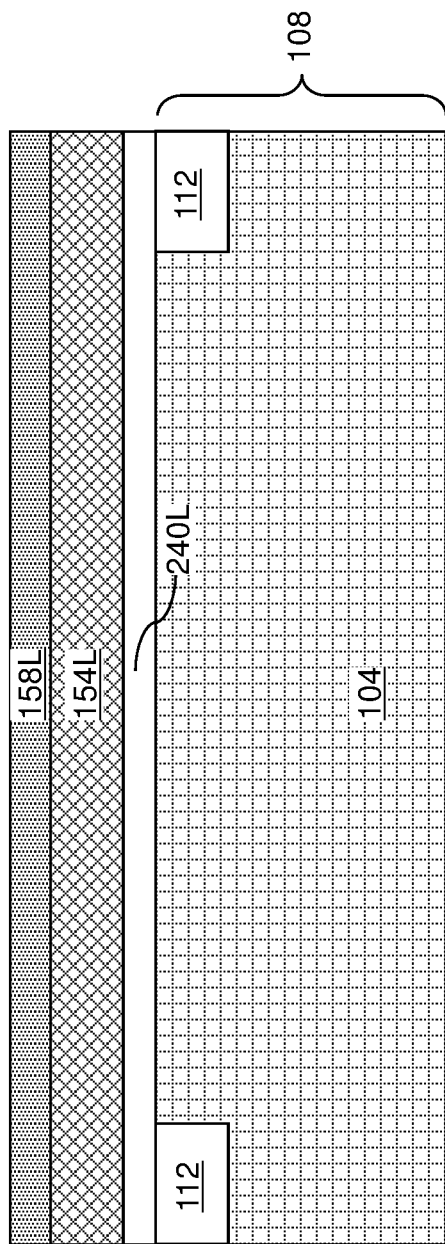
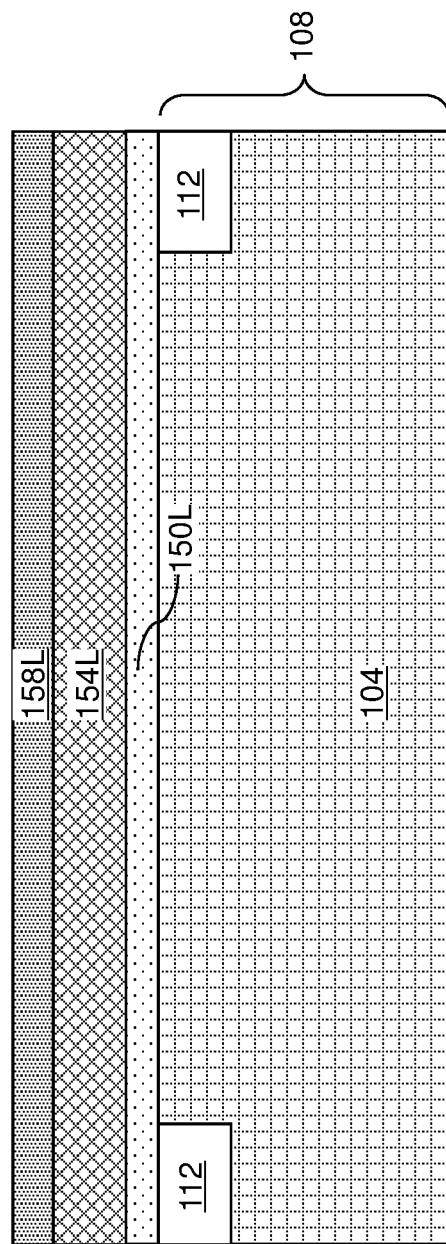

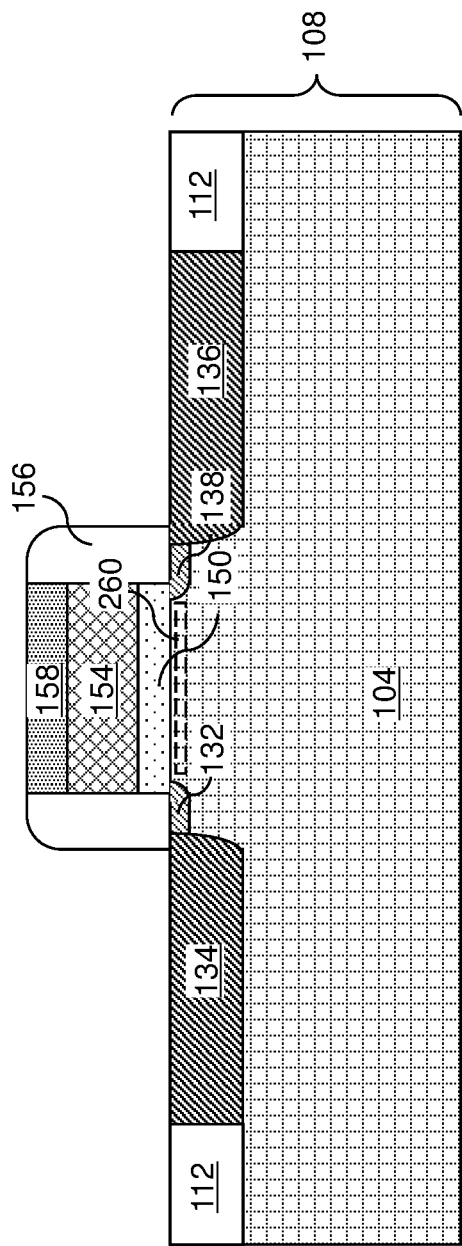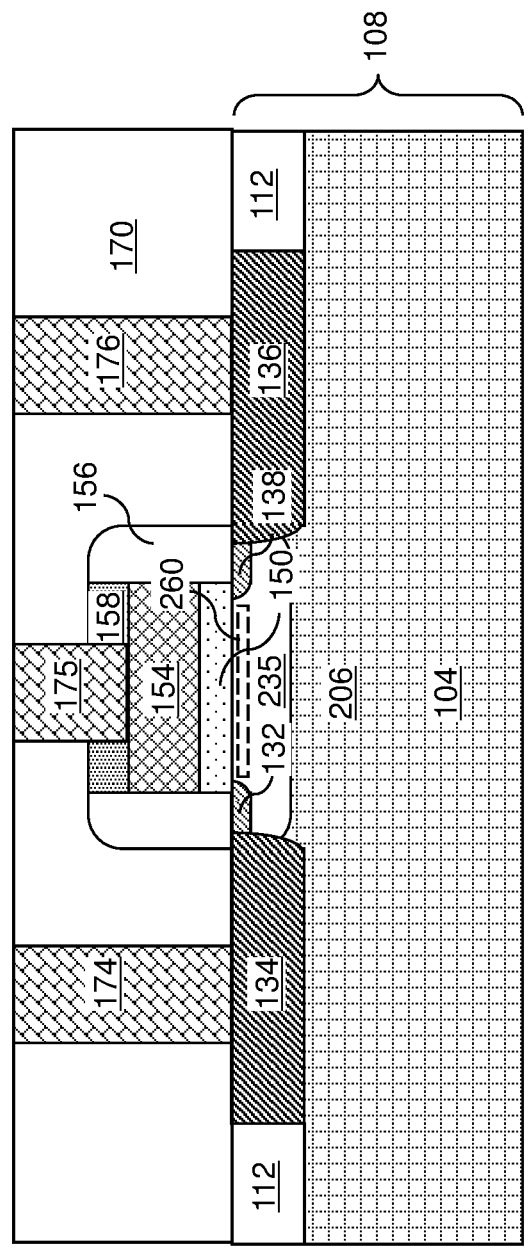

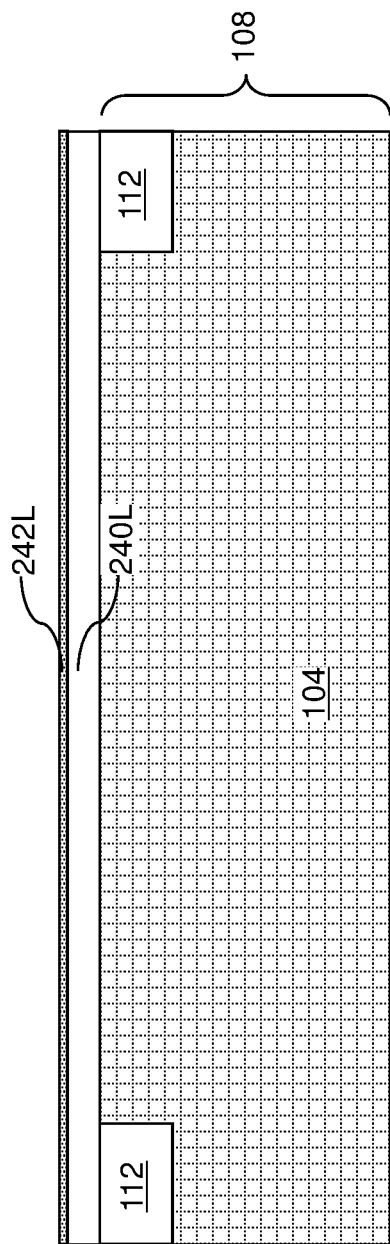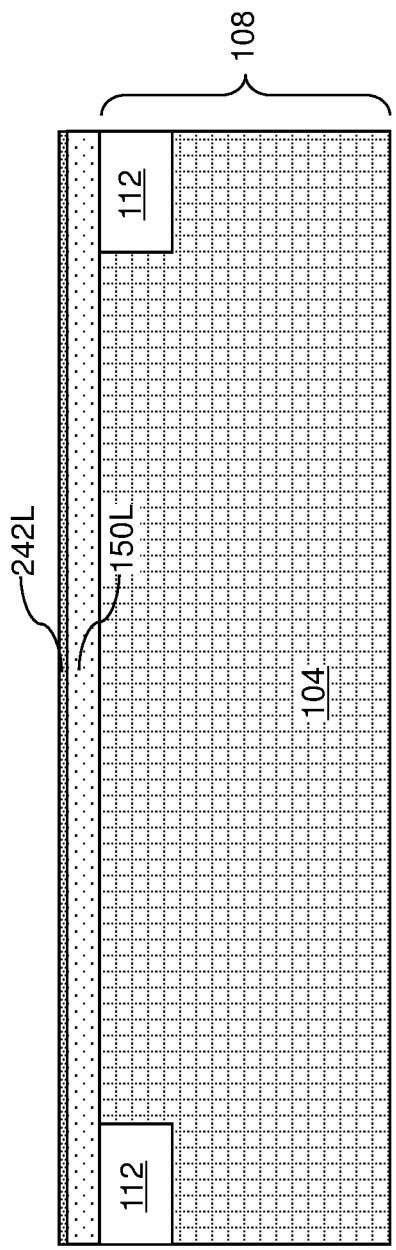

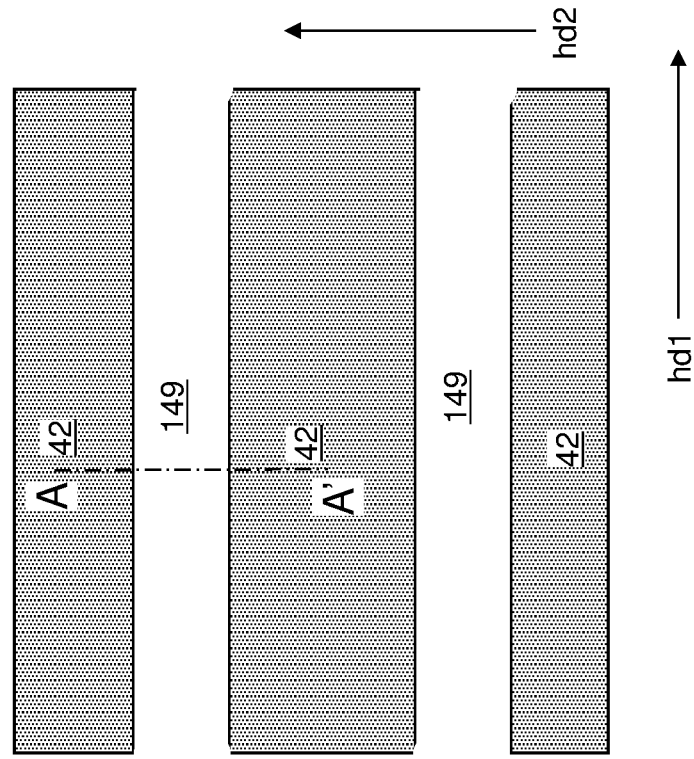
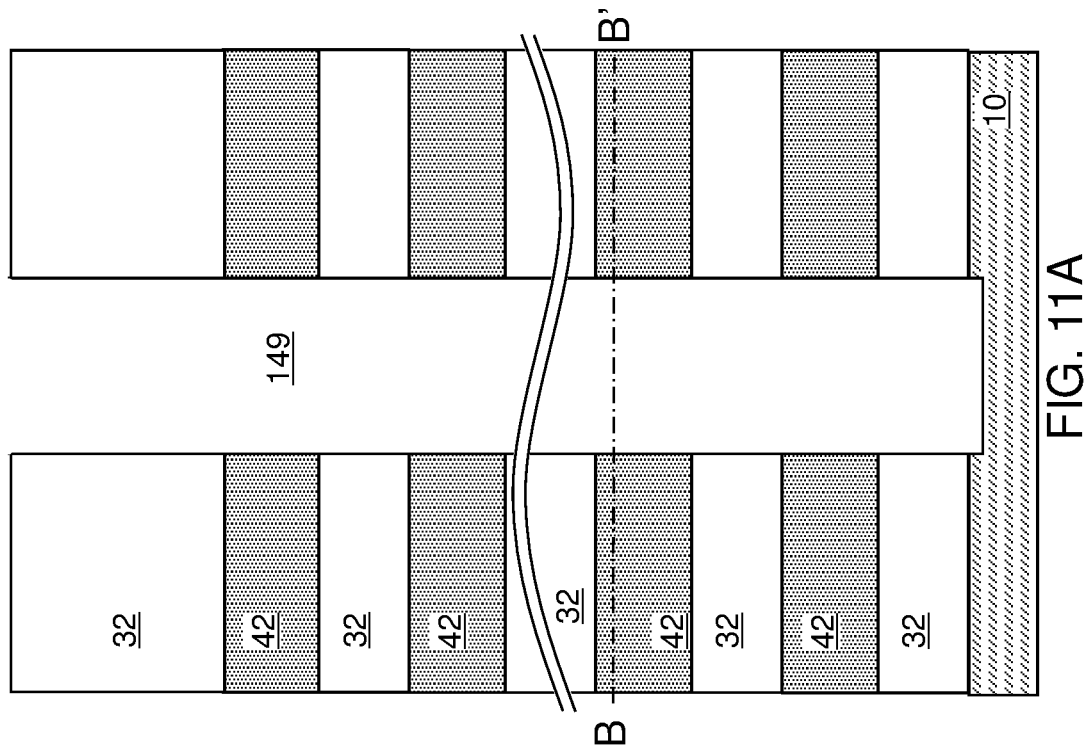
FIG. 11B
FIG. 11A

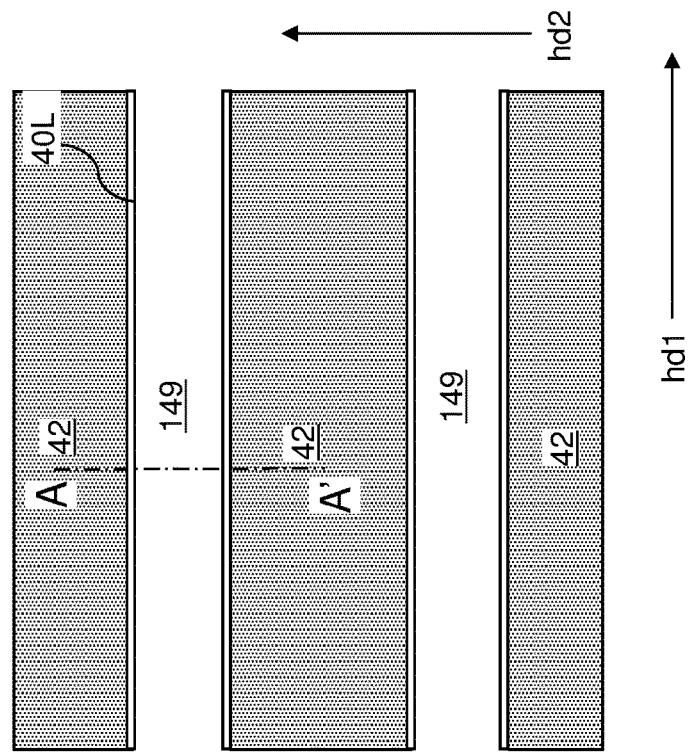
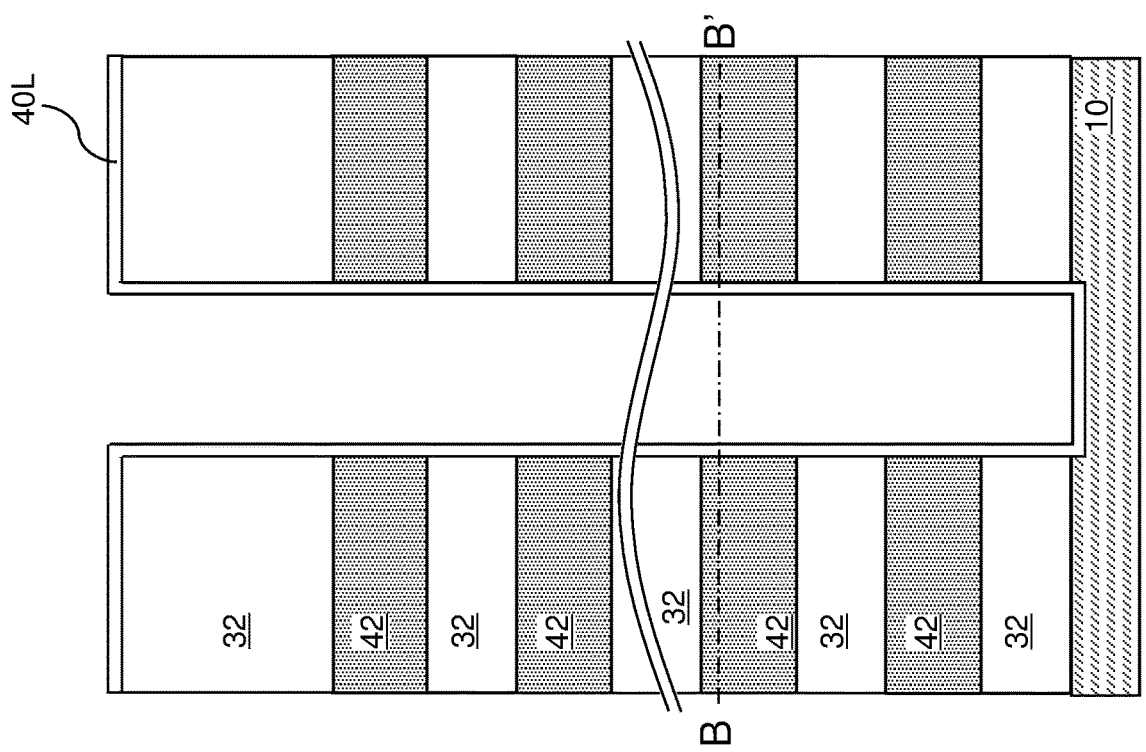
FIG. 12B
FIG. 12A

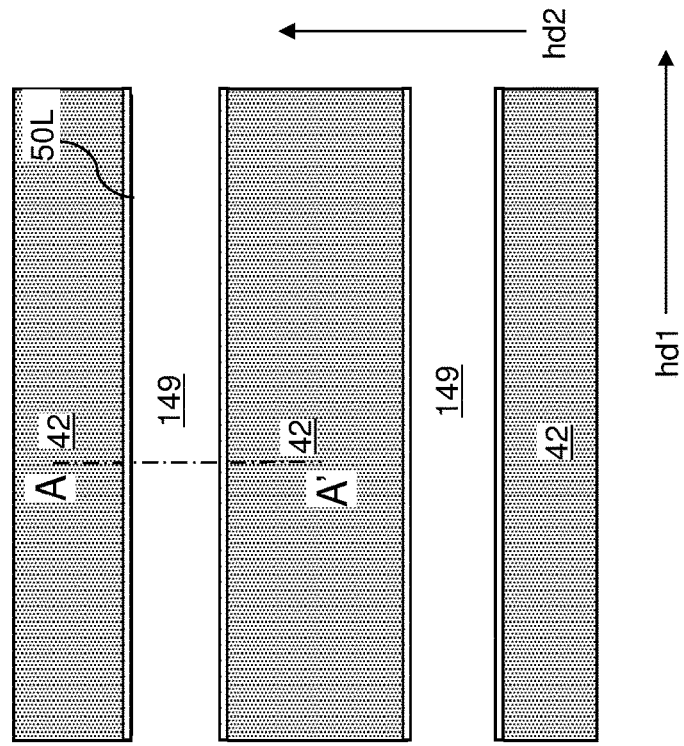
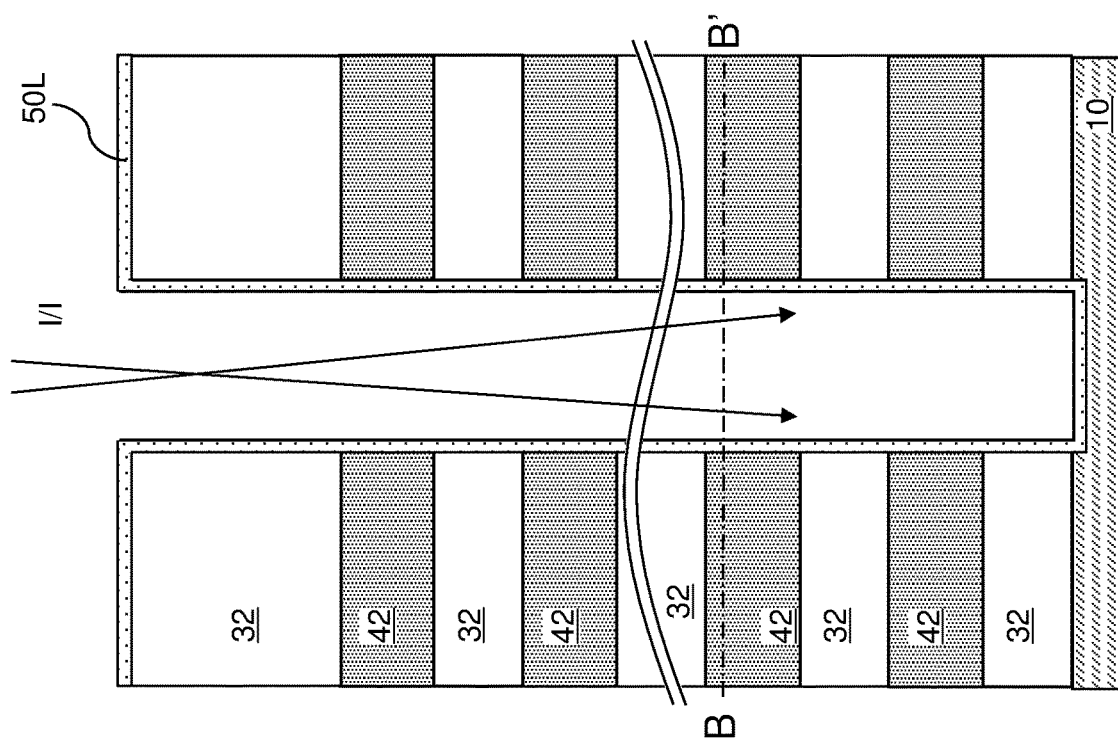
FIG. 13B
FIG. 13A

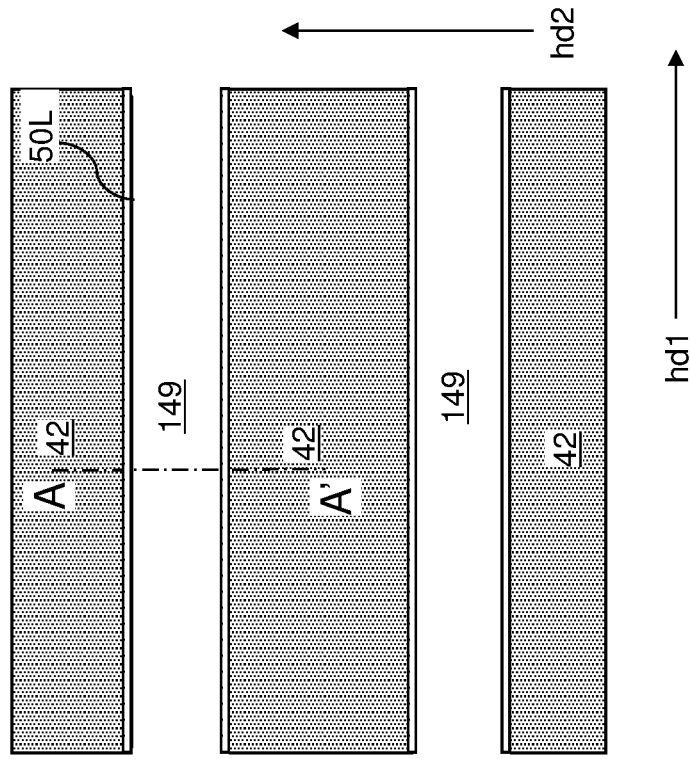
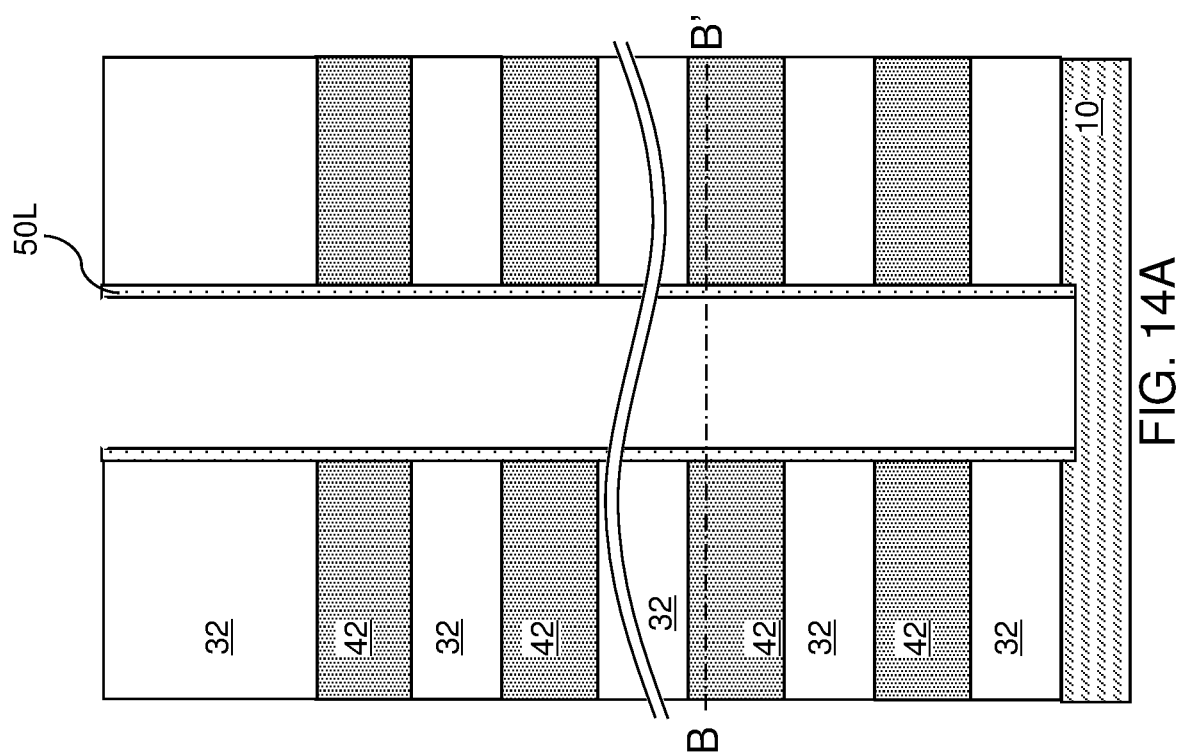
FIG. 14B
FIG. 14A

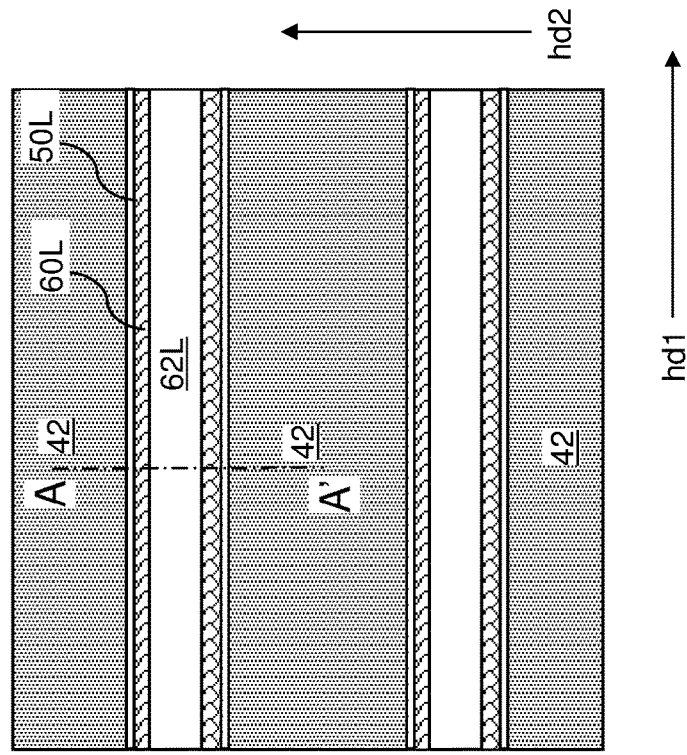
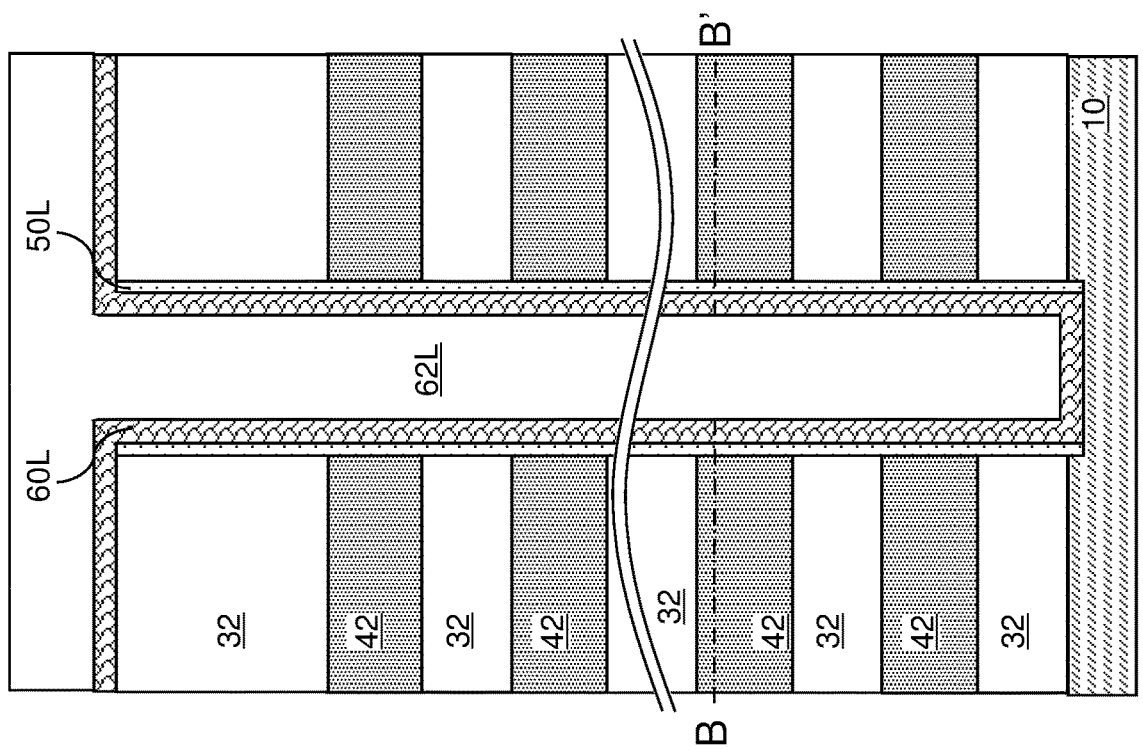
FIG. 15B
FIG. 15A

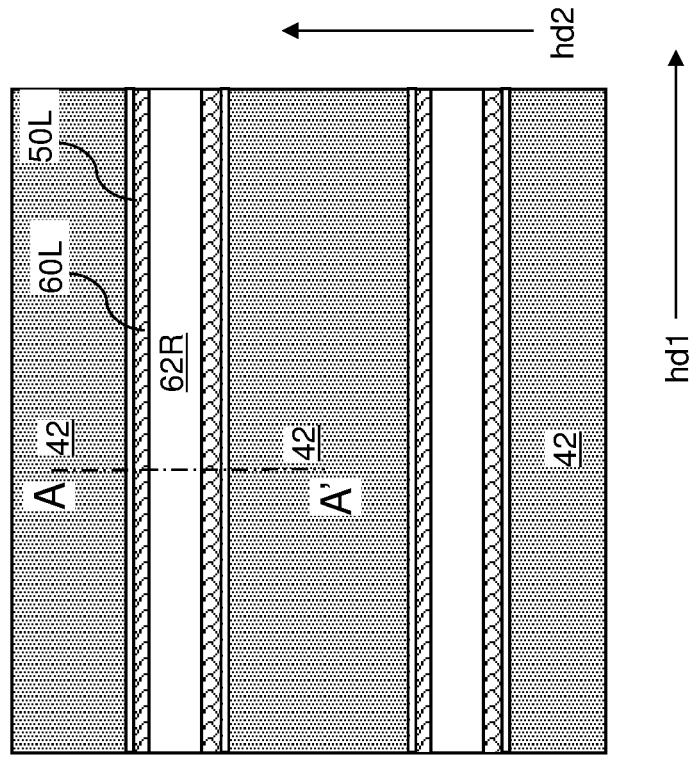
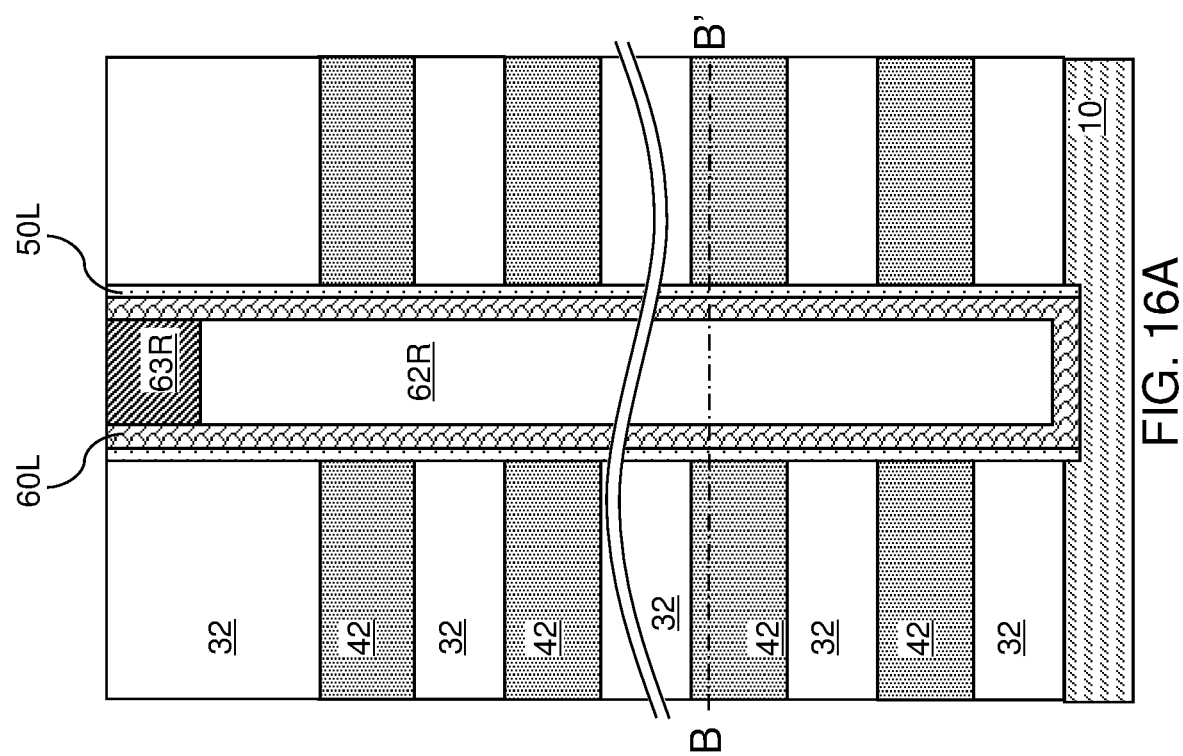
FIG. 16B
FIG. 16A

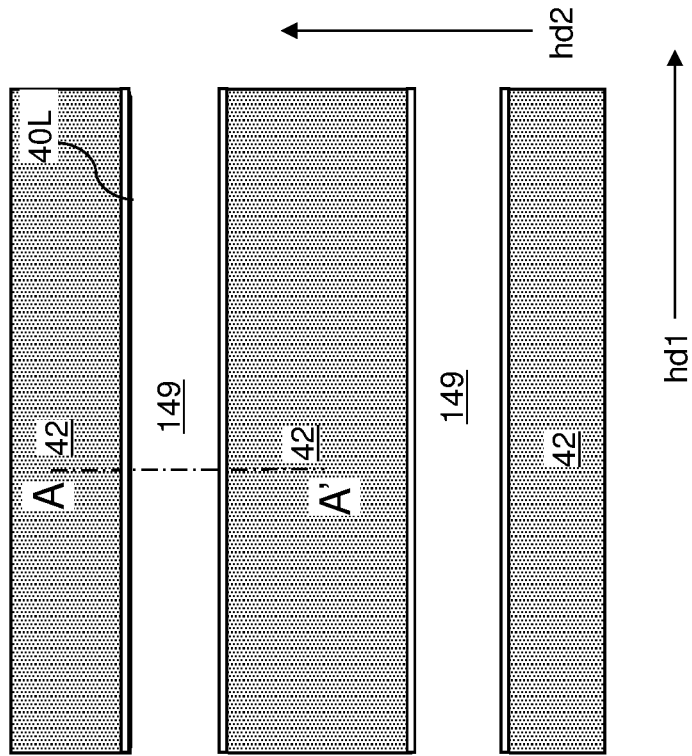
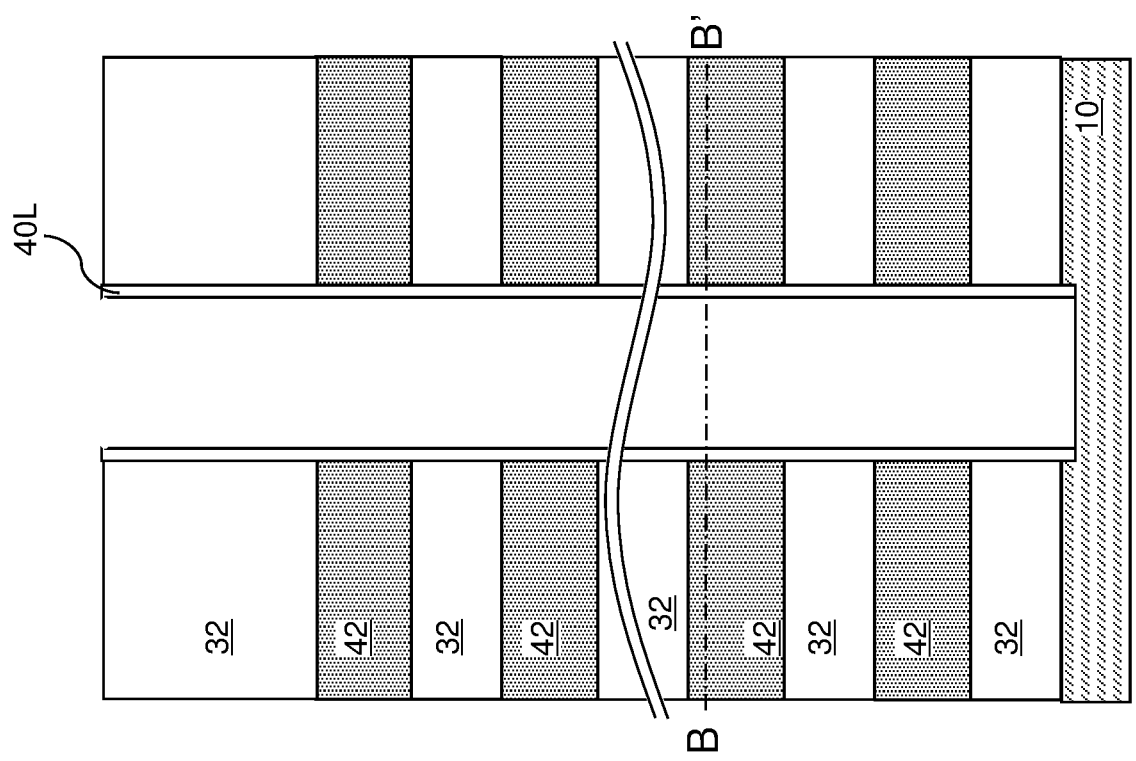
FIG. 23B
FIG. 23A

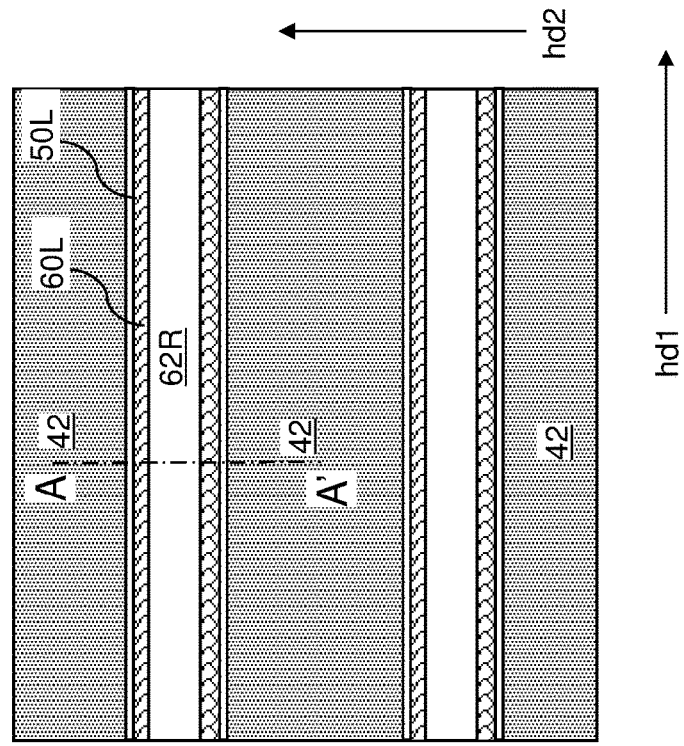
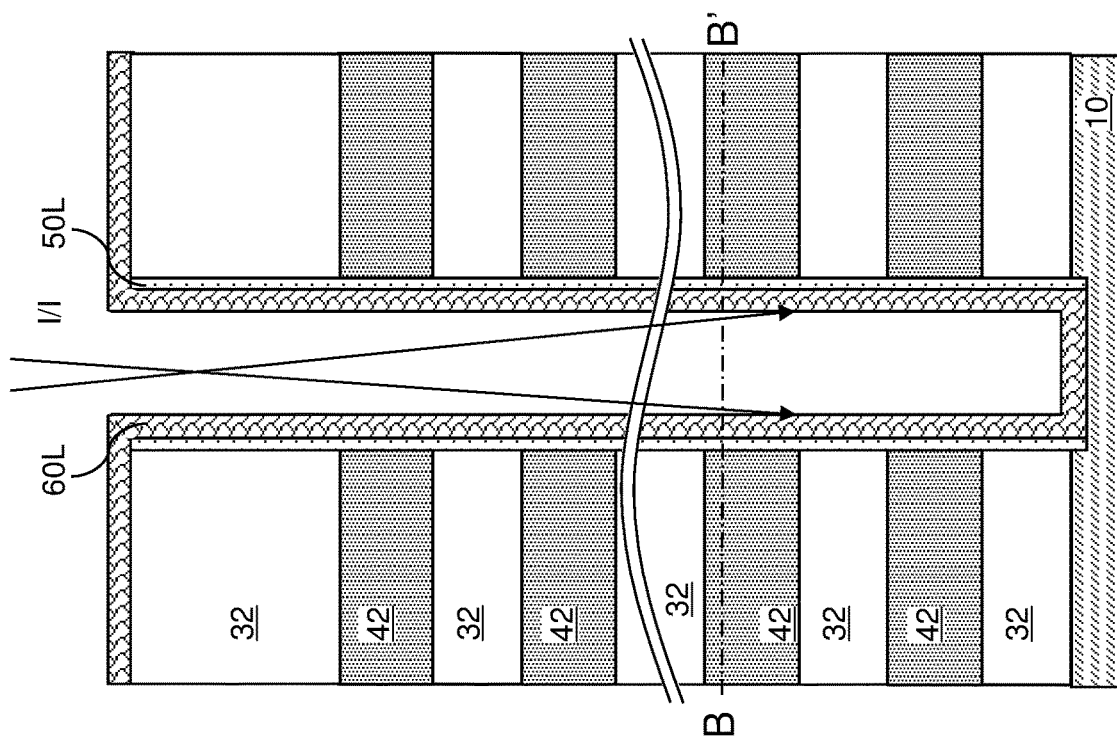
FIG. 24B
FIG. 24A

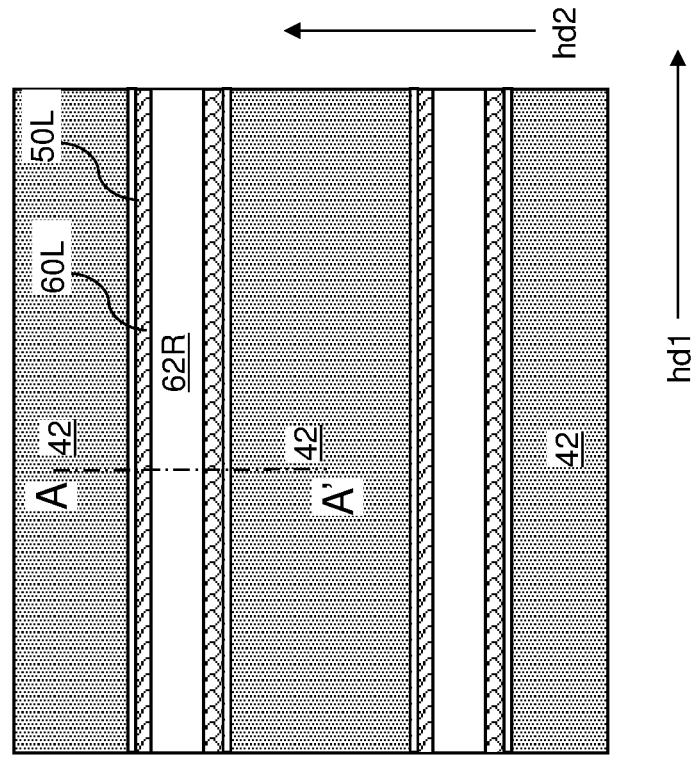
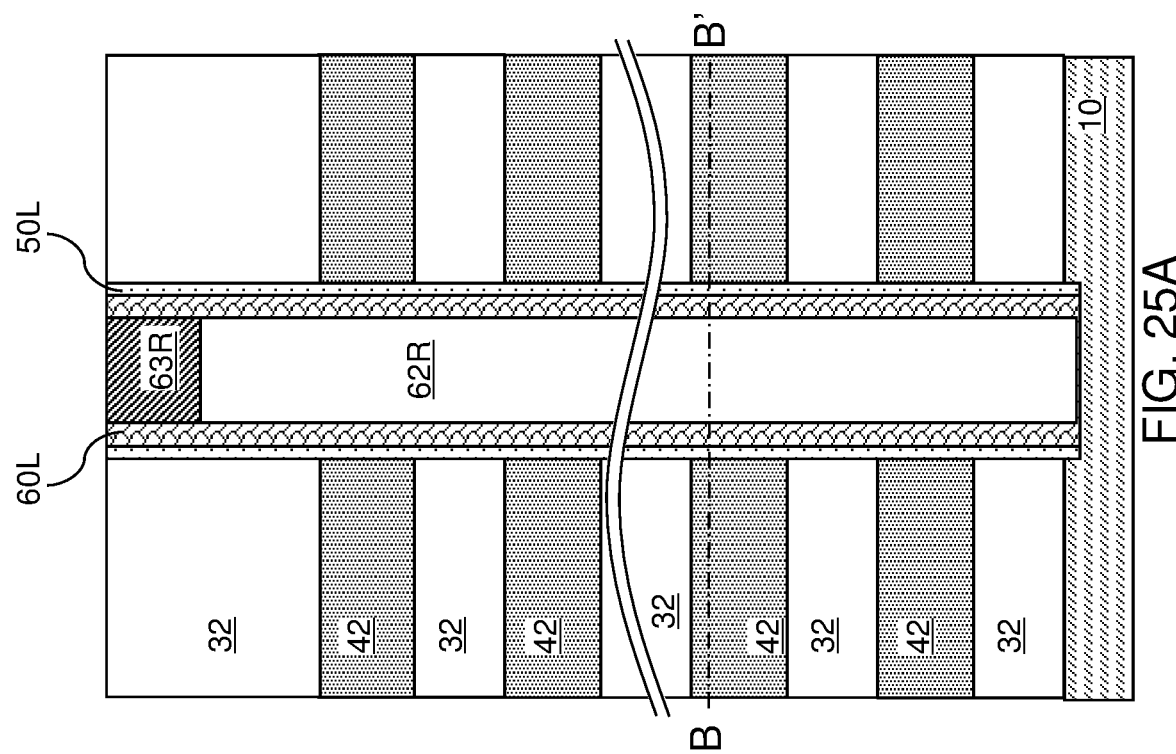
FIG. 25B
FIG. 25A

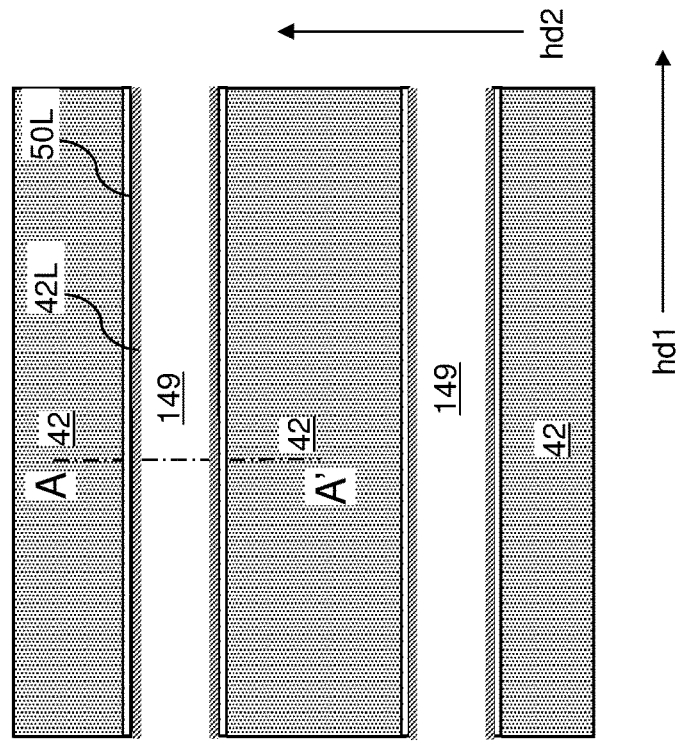
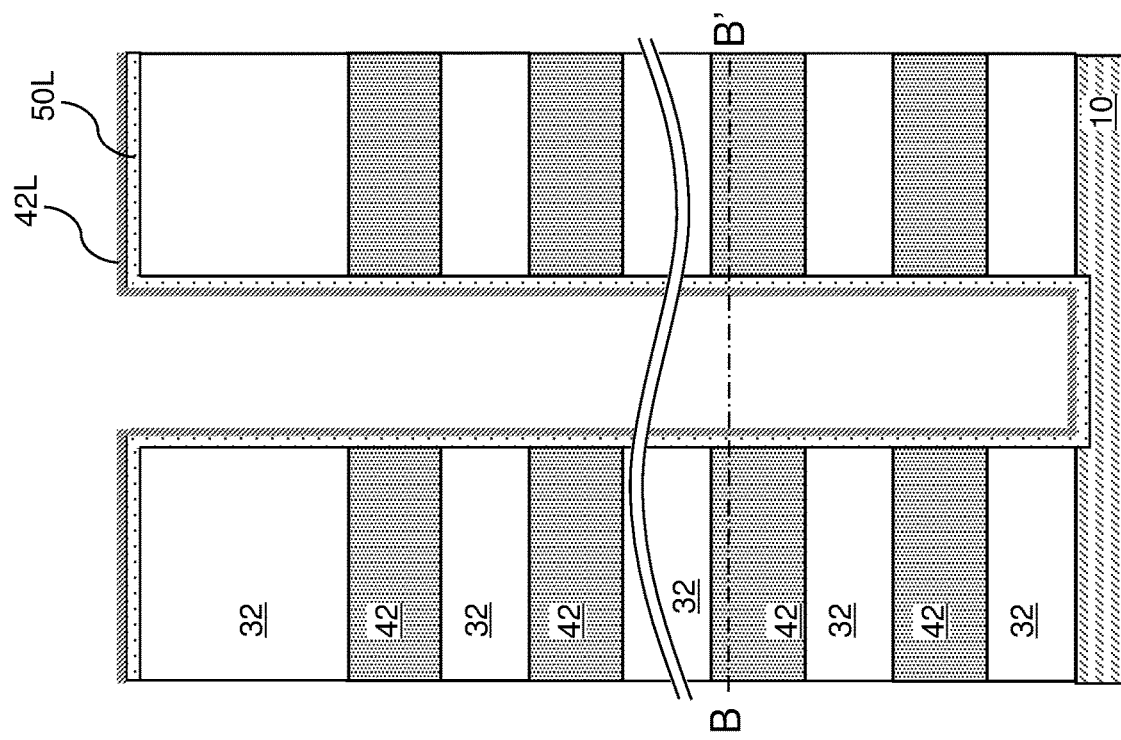
FIG. 26B
FIG. 26A

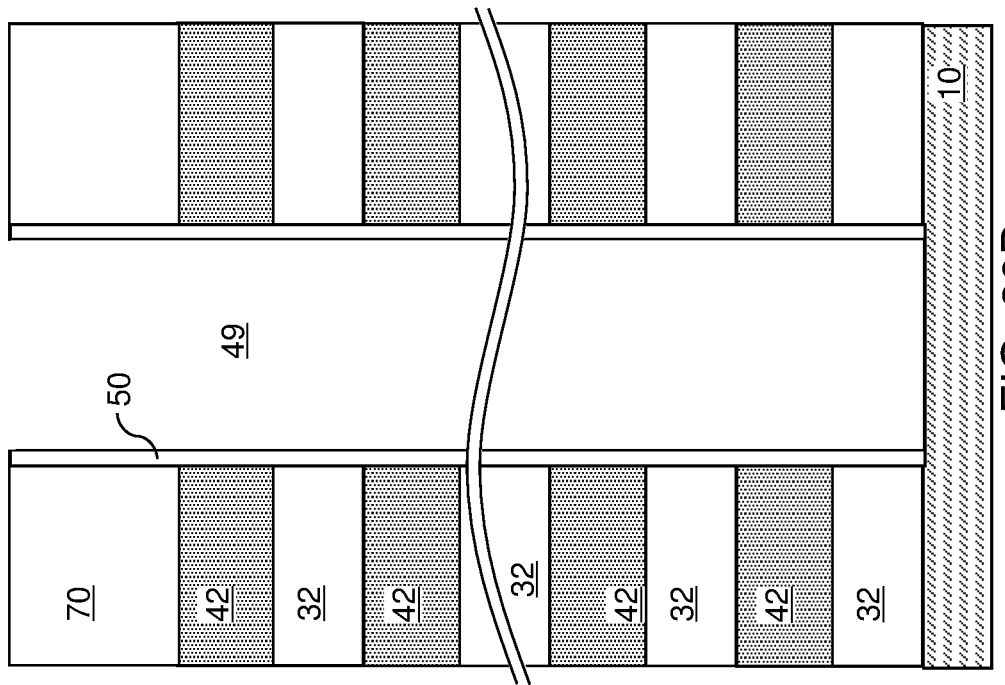
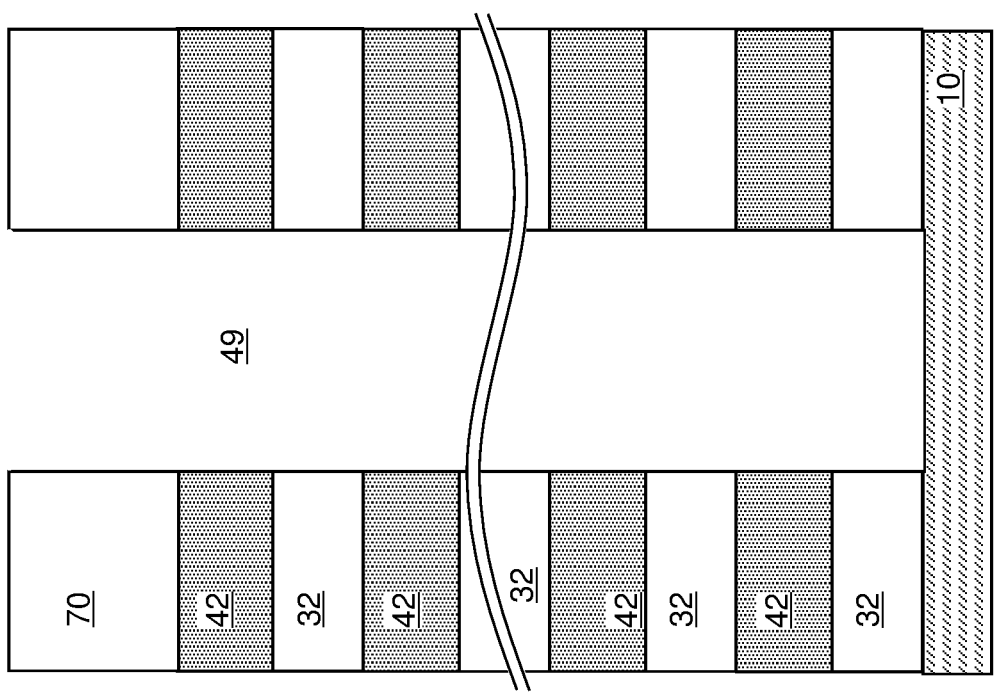

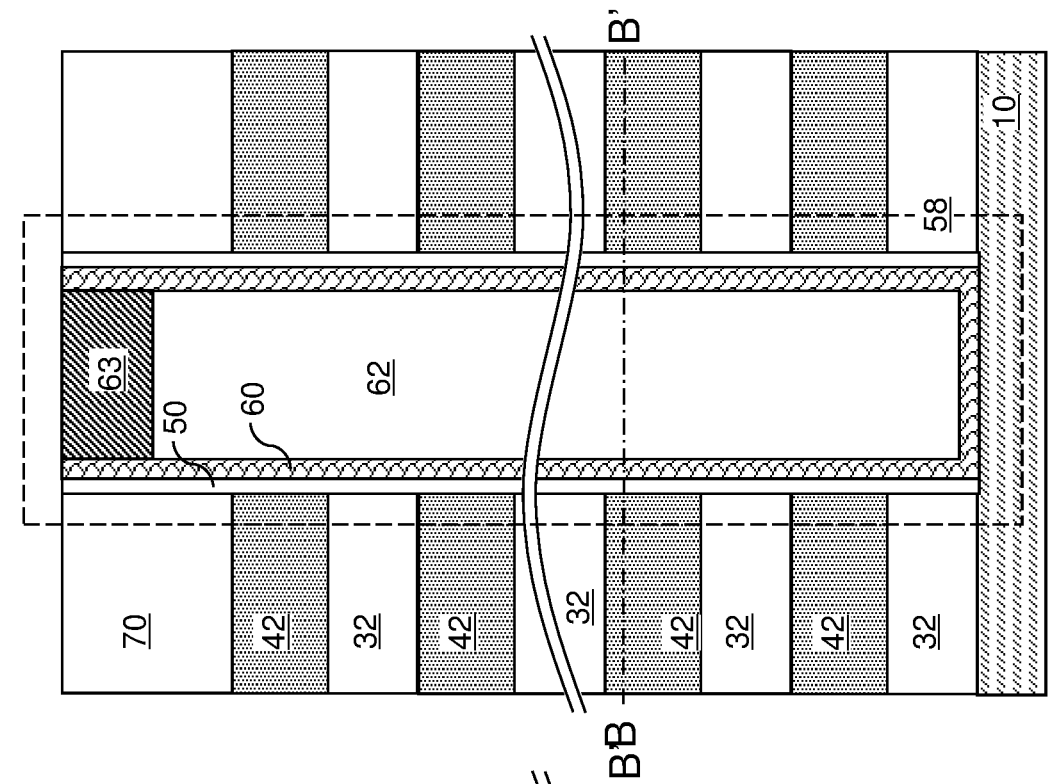
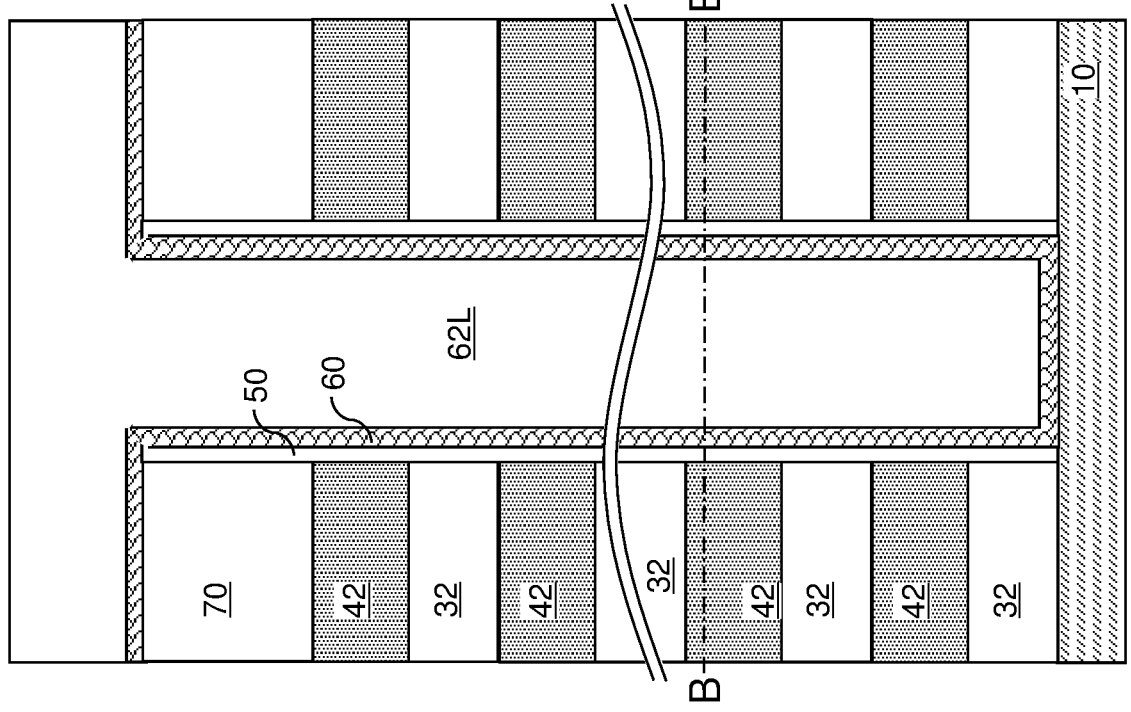
FIG. 30D
FIG. 30C

FERROELECTRIC FIELD EFFECT TRANSISTORS HAVING ENHANCED MEMORY WINDOW AND METHODS OF MAKING THE SAME

FIELD

The present disclosure relates generally to the field of semiconductor devices, and particularly to ferroelectric field effect transistors having enhanced memory windows and methods of making the same.

BACKGROUND

A ferroelectric memory device can store data in the form of a polarization direction of the dipole moment of a ferroelectric material portion, which can be detected, for example, by the threshold voltage of a field effect transistor having a channel adjacent to the ferroelectric material portion. The threshold voltage of the field effect transistor changes depending on the polarization direction of the dipole moment of the ferroelectric material portion. The data bit stored in the ferroelectric material portion can be read, i.e., sensed, by measuring the threshold voltage of the field effect transistor.

SUMMARY

According to an aspect of the present disclosure, a ferroelectric transistor is provided, which comprises: a semiconductor channel comprising a semiconductor material; a defect containing ferroelectric gate dielectric layer located on a surface of the semiconductor channel and comprising at least one of a noble gas element or nanoclusters of a non-polar metallic element that does not form a ferroelectric oxide material upon combination with oxygen at an atomic percentage in a range from 0.01% to 10%; a gate electrode located on the defect containing ferroelectric gate dielectric layer; a source region located on a first end portion of the semiconductor channel; and a drain region located on a second end portion of the semiconductor channel.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming cavities vertically extending through the alternating stack; forming a ferroelectric gate dielectric layer on a sidewall of each of the cavities; incorporating a non-polar metallic element that does not form a ferroelectric oxide material upon combination with oxygen into each ferroelectric gate dielectric layer at an atomic percentage in a range from 0.01% to 10%; and forming a vertical semiconductor channel on each ferroelectric gate dielectric layer, wherein portions of the ferroelectric gate dielectric layers located at levels of the electrically conductive layers comprise a three-dimensional array of ferroelectric memory elements.

According to yet another aspect of the present disclosure, a method of forming a ferroelectric transistor is provided, which comprises: forming a ferroelectric gate dielectric layer located on a surface of a semiconductor layer; incorporating a non-polar metallic element that does not form a ferroelectric oxide material upon combination with oxygen into the ferroelectric gate dielectric layer at an atomic percentage in a range from 0.01% to 10%; forming a gate electrode prior to, or after, incorporation of the non-polar metallic element into the ferroelectric gate dielectric layer; and forming a source region and a drain region on, or within, the semiconductor layer.

According to an aspect of the present disclosure, a ferroelectric transistor is provided, which comprises: a strained single crystalline semiconductor layer; a strained ferroelectric gate dielectric layer located on a top surface of the strained single crystalline semiconductor layer; a gate electrode located on the strained ferroelectric gate dielectric layer; and a source region and a drain region embedded within or in contact with the strained single crystalline semiconductor layer and laterally spaced apart from each other by a semiconductor channel located within the strained single crystalline semiconductor layer and underlying the strained ferroelectric gate dielectric layer.

According to another aspect of the present disclosure, a method of forming a ferroelectric transistor is provided, which comprises: forming a strained single crystalline semiconductor layer over a substrate semiconductor layer, wherein the substrate semiconductor layer comprises a first single crystalline semiconductor material and has a first in-plane average lattice constant, and the strained single crystalline semiconductor layer comprises a second single crystalline semiconductor material and is in epitaxial alignment with the first single crystalline semiconductor material and has a second in-plane average lattice constant that is different from the first in-plane average lattice constant; forming a gate structure including a strained ferroelectric gate dielectric layer and a gate electrode over a top surface of the strained single crystalline semiconductor layer; and forming a source region and a drain region embedded within, or on, the strained single crystalline semiconductor layer, wherein the source region and the drain region are laterally spaced apart from each other by a semiconductor channel located within the strained single crystalline semiconductor layer and underlies the strained ferroelectric gate dielectric layer.

BRIEF DESCRIPTION OF THE DRAWINGS

FIGS. 1A-1F are sequential vertical cross-sectional views of a first exemplary structure according to an embodiment of the present disclosure.

FIG. 2A-2F are sequential vertical cross-sectional views of a second exemplary structure according to an embodiment of the present disclosure.

FIG. 3A-3F are sequential vertical cross-sectional views of a third exemplary structure according to an embodiment of the present disclosure.

FIG. 4A-4F are sequential vertical cross-sectional views of a fourth exemplary structure according to an embodiment of the present disclosure.

FIG. 5A-5F are sequential vertical cross-sectional views of a fifth exemplary structure according to an embodiment of the present disclosure.

FIG. 6A-6F are sequential vertical cross-sectional views of a sixth exemplary structure according to an embodiment of the present disclosure.

FIG. 7A-7F are sequential vertical cross-sectional views of a seventh exemplary structure according to an embodiment of the present disclosure.

FIG. 11A is a vertical cross-sectional view of a line trench in the eighth exemplary structure of FIGS. 10A and 10B.

FIG. 11B is a horizontal cross-sectional view along the plane B-B' of the structure of FIG. 11A. The vertical plane A-A' corresponds to the plane of the vertical cross-sectional view of FIG. 11A.

FIG. 12A is a vertical cross-sectional view of a line trench in the eighth exemplary structure after formation of a continuous ferroelectric gate dielectric layer according to an embodiment of the present disclosure.

FIG. 12B is a horizontal cross-sectional view along the plane B-B' of FIG. 12A. The vertical plane A-A' corresponds to the plane of the vertical cross-sectional view of FIG. 12A.

FIG. 13A is a vertical cross-sectional view of a line trench in the eighth exemplary structure after implantation of non-polar dopants according to an embodiment of the present disclosure.

FIG. 13B is a horizontal cross-sectional view along the plane B-B' of FIG. 13A. The vertical plane A-A' corresponds to the plane of the vertical cross-sectional view of FIG. 13A.

FIG. 14A is a vertical cross-sectional view of a line trench in the eighth exemplary structure patterning the continuous ferroelectric gate dielectric layer into a plurality of ferroelectric gate dielectric layer according to an embodiment of the present disclosure.

FIG. 14B is a horizontal cross-sectional view along the plane B-B' of FIG. 14A. The vertical plane A-A' corresponds to the plane of the vertical cross-sectional view of FIG. 14A.

FIG. 15A is a vertical cross-sectional view of a line trench in the eighth exemplary structure after formation of a semiconductor channel layer and a dielectric rail in each line trench according to an embodiment of the present disclosure.

FIG. 15B is a horizontal cross-sectional view along the plane B-B' of FIG. 15A. The vertical plane A-A' is the plane of the cross-section for FIG. 15A.

FIG. 16A is a vertical cross-sectional view of a line trench in the eighth exemplary structure after formation of a drain rail structure in each line trench according to an embodiment of the present disclosure.

FIG. 16B is a horizontal cross-sectional view along the plane B-B' of 16A. The vertical plane A-A' is the plane of the cross-section for FIG. 16A.

FIG. 23A is a vertical cross-sectional view of a first alternative configuration of the eighth exemplary structure after formation of a ferroelectric gate dielectric layer in each line trench according to an embodiment of the present disclosure.

FIG. 23B is a horizontal cross-sectional view along the horizontal plane B-B' of FIG. 23A. The vertical plane A-A' is the plane of the cross-section for FIG. 23A.

FIG. 24A is a vertical cross-sectional view of the first alternative configuration of the eighth exemplary structure after formation of a semiconductor channel layer and implantation of non-polar dopants according to an embodiment of the present disclosure.

FIG. 24B is a horizontal cross-sectional view along the horizontal plane B-B' of FIG. 24A. The vertical plane A-A' is the plane of the cross-section for FIG. 24A.

FIG. 25A is a vertical cross-sectional view of the first alternative configuration of the eighth exemplary structure after formation of a line trench fill structure in each line trench according to an embodiment of the present disclosure.

FIG. 25B is a horizontal cross-sectional view along the horizontal plane B-B' of FIG. 25A. The vertical plane A-A' is the plane of the cross-section for FIG. 25A.

FIG. 26A is a vertical cross-sectional view of a second alternative configuration of the eighth exemplary structure after formation of a dusting layer and outdiffusion of non-polar dopants into the continuous ferroelectric gate dielectric layer according to an embodiment of the present disclosure.

FIG. 26B is a horizontal cross-sectional view along the horizontal plane B-B' of FIG. 26A. The vertical plane A-A' is the plane of the cross-section for FIG. 26A.

FIGS. 30A-30D are sequential schematic vertical cross-sectional views of a memory opening within the ninth exemplary structure during formation of a memory stack assembly therein according to an embodiment of the present disclosure.

DETAILED DESCRIPTION

Figure 3E:
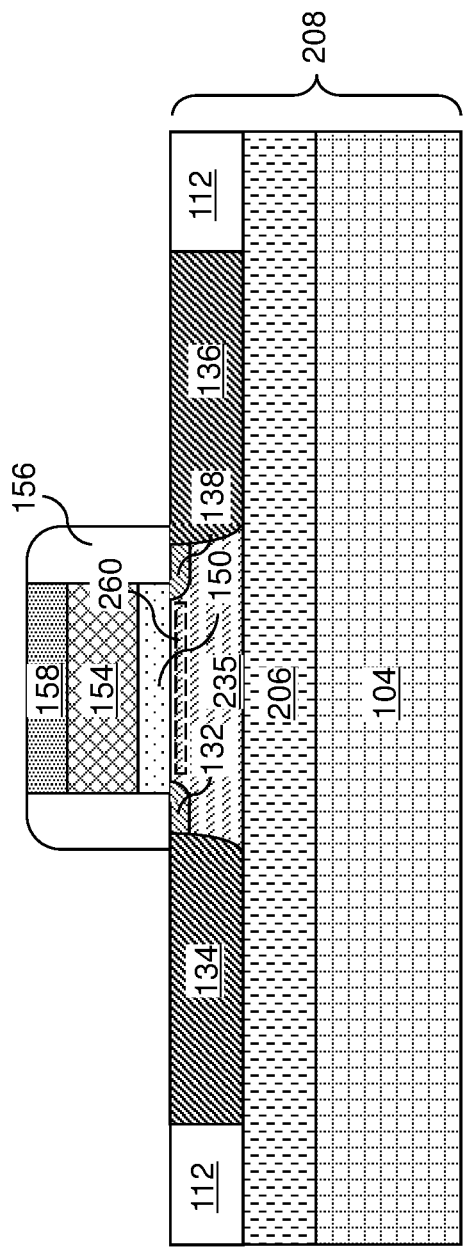

The ferroelectric memory device can be programmed by applying a positive bias voltage or a negative bias voltage across the ferroelectric material portion. The sensing of the state of the ferroelectric material portion is performed at a low enough voltage that does not disturb programming of the ferroelectric material portion. Many ferroelectric materials have low programming voltages, and thus, make the sensing operation difficult. A ferroelectric memory device that can provide enhanced memory window, i.e., a voltage range in which the ferroelectric material portion does not get programmed into another state, is desired. Embodiments of the present disclosure are directed to ferroelectric memory devices, such as ferroelectric field effect transistors having enhanced memory windows and methods of making the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "semiconducting material" refers to a material having electrical conductivity in the range from $1 \times 10^{-6}$ S/cm to $1 \times 10^5$ S/cm. As used herein, a "semiconductor material" refers to a material having electrical conductivity in the range from $1\times10^{-6}$ S/cm to $1\times10^5$ S/cm in the absence of electrical dopants therein, and is capable of producing a doped material having electrical conductivity in a range from 1 S/cm to $1\times10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure.

As used herein, a "conductive material" refers to a material having electrical conductivity greater than $1\times10^5$ S/cm. As used herein, an "insulator material" or a "dielectric material" refers to a material having electrical conductivity less than $1\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1\times10^5$ S/cm.

A "doped semiconductor material" may be a heavily doped semiconductor material, or may be a semiconductor material that includes electrical dopants (i.e., p-type dopants and/or n-type dopants) at a concentration that provides electrical conductivity in the range from $1\times10^{-6}$ S/cm to $1\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

According to an aspect of the present disclosure, methods for enhancing the memory window for ferroelectric field effect transistors are provided. Specifically, defect engineering and/or control of epitaxial strain in a ferroelectric material can be employed increase the ferroelectric coercive field. The ferroelectric coercive field of a ferroelectric material may be enhanced more than 3 times by introducing the defects therein, and/or by inducing epitaxial strain therein. Defects induce pinning of ferroelectric domains, which induces an increase in the coercive field $E_c$, i.e., the switching field. Since the memory window is a function of the coercive field, an increase in the coercive field also increases the memory window. The embodiments of the present disclosure are now described in detail with reference to the drawings.

Referring to FIG. 1A, a first exemplary structure according to a first embodiment of the present disclosure is illustrated. The first exemplary structure includes a substrate 208 containing a substrate semiconductor layer 104. The substrate 208 may be a semiconductor, insulating or conductive substrate. For example, the substrate 208 may be a single crystal silicon wafer and the substrate semiconductor layer 104 may comprise a doped well in the top major surface of the silicon wafer, an epitaxial silicon layer on top of the major surface of the silicon wafer or simply a top portion of the silicon wafer. Alternatively, the substrate 208 may be a silicon on insulator (SOI) substrate and the substrate semiconductor layer may comprise a silicon layer located over an insulating layer. The substrate semiconductor layer 104 may include a first single crystalline semiconductor material having a first in-plane average lattice constant, such as single crystal silicon. A "major surface" refers to a surface that has at least ⅙ of the total area of an element. For example, a rectangular parallelopiped may have two major surfaces, four major surfaces, or six major surfaces. Commercially available semiconductor (e.g., silicon) wafers have two major surfaces. As used herein, an "in-plane average lattice constant" refers to an average of two major crystallographic orientations located within a horizontal plane that is parallel to major surfaces of the substrate semiconductor layer 104. As used herein, "two major crystallographic orientations" within a plane refers to two crystallographic orientations located within the plane and having one of the two lowest values for the sum of absolute values for the Miller indices. For example, two major crystallographic orientations for a semiconductor material layer having a (001) surface can include a [100] direction and a [010] direction.

An optional single crystalline buffer semiconductor layer 206 may be grown on the major surface (which may be a top surface) of the substrate semiconductor layer 104 by an epitaxial deposition process. The single crystalline buffer semiconductor layer 206 includes a graded epitaxial single crystalline semiconductor alloy material in which the material composition of a semiconductor material changes gradually within a vertical distance from the substrate semiconductor layer 104. For example, each of the substrate semiconductor layer 104 and the single crystalline buffer semiconductor layer 206 comprises silicon atoms at an atomic percentage greater than 50%, and at least one of the substrate semiconductor layer 104 and the single crystalline buffer semiconductor layer 206 comprises germanium or carbon. In an illustrative example, the substrate semiconductor layer 104 may include silicon at an atomic percentage greater than 99.5%, such as greater than 99.9%, and the single crystalline buffer semiconductor layer 206 may include carbon atoms or germanium atoms such that the atomic concentration of the carbon atoms or the germanium atoms increases with a vertical distance from the substrate semiconductor layer 104.

In case the atomic concentration of the germanium atoms increases with a vertical distance from the substrate semiconductor layer 104, the in-plane average lattice constant of the single crystalline buffer semiconductor layer 206 increases with a vertical distance from the substrate semiconductor layer 104. The atomic concentration of germanium atoms at a top surface of the single crystalline buffer semiconductor layer 206 may be in a range from 5% to 49%, although lesser and greater atomic concentrations may also be employed.

In case the atomic concentration of the carbon atoms increases with a vertical distance from the substrate semiconductor layer 104, the in-plane average lattice constant of the single crystalline buffer semiconductor layer 206 decreases with a vertical distance from the substrate semiconductor layer 104. The atomic concentration of carbon atoms at a top surface of the single crystalline buffer semiconductor layer 206 may be in a range from 0.1% to 4%, although lesser and greater atomic concentrations may also be employed. The thickness of the single crystalline buffer semiconductor layer 206 may be in a range from 50 nm to 1,000 nm, such as from 100 nm to 500 nm, although lesser and greater thicknesses may also be employed.

A strained single crystalline semiconductor layer 210 can be epitaxially grown on the single crystalline buffer semiconductor layer 206 by performing an epitaxial semiconductor deposition process. The strained single crystalline semiconductor layer 210 comprises, and/or consists essentially of, a second single crystalline semiconductor material, which may, or may not, be the same in material composition as the first single crystalline semiconductor material of the substrate semiconductor layer 104.

In one embodiment, the second single crystalline semiconductor material may be in epitaxial alignment with the first single crystalline semiconductor material via the single crystalline semiconductor material of the single crystalline buffer semiconductor layer 206. In this case, the substrate semiconductor layer 104 may include single crystalline silicon, the single crystalline buffer semiconductor layer 206 may include a graded silicon-germanium alloy (i.e., compound semiconductor material) or a graded silicon-carbon alloy, and the strained single crystalline semiconductor layer 210 may include, and/or may consist essentially of, single crystalline silicon having strained in-plane lattice constants, a single crystalline silicon-germanium alloy having different in-plane lattice constants than single crystalline silicon having a same set of crystallographic orientations, or a single crystalline silicon-carbon alloy having different in-plane lattice constants than single crystalline silicon having a same set of crystallographic orientations.

Alternatively, the second single crystalline semiconductor material of the strained single crystalline semiconductor layer 210 may be in epitaxial alignment with the first single crystalline semiconductor material of the substrate semiconductor layer 104 through direct contact with, and through epitaxial registry with, the first single crystalline semiconductor material. In other words, the single crystalline buffer semiconductor layer 206 may be omitted. In this case, the second single crystalline semiconductor material of the strained single crystalline semiconductor layer 210 has a different in-plane average lattice constant than the first single crystalline semiconductor material of the substrate semiconductor layer 104.

Generally, the substrate semiconductor layer 104 comprises, and/or consists essentially of, the first single crystalline semiconductor material and having the first in-plane average lattice constant, and the strained single crystalline semiconductor layer 210 comprises, and/or consists essentially of, a second single crystalline semiconductor material that is in epitaxial alignment with the substrate semiconductor layer 104 and has the second in-plane average lattice constant that is different from the first in-plane average lattice constant.

In an illustrative example, each of the substrate semiconductor layer 104 and the strained single crystalline semiconductor layer 210 comprises silicon atoms at an atomic percentage greater than 50%, and at least one of the substrate semiconductor layer 104 and the strained single crystalline semiconductor layer 210 comprises germanium or carbon at an atomic percentage greater than 0.1%. For example, one of the substrate semiconductor layer 104 and the strained single crystalline semiconductor layer 210 may include silicon atoms at an atomic percentage greater than 99%, such as greater than 99.9% and another of the substrate semiconductor layer 104 and the strained single crystalline semiconductor layer 210 may include germanium at an atomic percentage in a range from 5% to 49% or may include carbon at an atomic percentage in a range from 0.1% to 4%. The thickness of the strained single crystalline semiconductor layer 210 may be in a range from 5 nm to 100 nm, such as from 10 nm to 50 nm, although lesser and greater thicknesses may also be employed.

Shallow trenches can be formed through the strained single crystalline semiconductor layer 210 and optionally through the single crystalline buffer semiconductor layer 206 and/or through an upper portion of the substrate semiconductor layer 104. For example, a photoresist layer (not shown) can be applied over the top surface of the strained single crystalline semiconductor layer 210, and can be lithographically patterned to cover each device area in which semiconductor devices (such as field effect transistors) are to be subsequently formed. For example, rectangular areas may be covered by patterned portions of the photoresist layer to form field effect transistors. An anisotropic etch process can be performed to transfer the pattern in the photoresist layer through the strained single crystalline semiconductor layer 210 and optionally through the single crystalline buffer semiconductor layer 206 and/or through an upper portion of the substrate semiconductor layer 104. The photoresist layer can be subsequently removed, for example, by ashing.

At least one dielectric material such as silicon oxide can be deposited in the shallow trenches. A dielectric liner such as a silicon nitride liner (not illustrated) may be optionally deposited before filling the shallow trenches with the at least one dielectric material. Excess portions of the at least one dielectric material can be removed from above the horizontal plane including the top surface of the strained single crystalline semiconductor layer 210. Remaining portions of the at least one dielectric material filling the shallow trenches comprise shallow trench isolation structures 112. Each device area may be laterally surrounded by a respective shallow trench isolation structure 112.

Referring to FIG. 1B, a continuous ferroelectric gate dielectric layer 240L can be formed on a top surface of the strained single crystalline semiconductor layer 210 and over the top surface of shallow trench isolation structure 112. In one embodiment, the continuous ferroelectric gate dielectric layer 240L can be formed by an atomic layer deposition (ALD) process, a chemical vapor deposition (CVD) process, or a physical vapor deposition (PVD) process such that the portion of the continuous ferroelectric gate dielectric layer 240L that is formed over the top surface of the strained single crystalline semiconductor layer 210 is epitaxially aligned to the single crystalline structure of the strained single crystalline semiconductor layer 210. Thus, each portion of the continuous ferroelectric gate dielectric layer 240L that overlies the strained single crystalline semiconductor layer 210 can be single crystalline, and can be in epitaxial alignment with the strained single crystalline semiconductor layer 210.

Generally, the continuous ferroelectric gate dielectric layer 240L includes a ferroelectric material having two stable directions for electrical polarization and can be formed with epitaxial alignment with the semiconductor material of the strained single crystalline semiconductor layer 210. For example, the ferroelectric material of the continuous ferroelectric gate dielectric layer 240L may include at least one material selected from hafnium oxide, zirconium oxide, hafnium-zirconium oxide, barium titanate (such as $BaTiO_3$; BT), colemanite (such as $Ca_2B_6O_{11} \cdot 5H_2O$), bismuth titanate (such as $Bi_{12}TiO_{20}$, $Bi_4Ti_3O_{12}$ or $Bi_2Ti_2O_7$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), ($LaAlO_3$)), polyvinylidene fluoride ($(CH_2CF_2)_n$, potassium niobate (such as $KNbO_3$), potassium sodium tartrate (such as $KNaC_4H_4O_6 \cdot 4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as (Pb,La)$TiO_3$ (PLT)), lead lanthanum zirconate titanate (such as (Pb,La)(Zr,Ti)$O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric dielectric material can include a polar phase hafnium oxide, such as an orthorhombic phase hafnium oxide, and preferably including at least one dopant selected from Al, Zr, Y, Gd, La, Sr, or Si. The thickness of the continuous ferroelectric gate dielectric layer 240L can be in a range from 2 nm to 50 nm, such as from 4 nm to 30 nm, although lesser and greater thicknesses can also be employed.

Hafnium oxide-based ferroelectric materials have a higher ferroelectric coercive field $E_c$, which is in a range from about 0.8 MV/cm to about 2.0 MV/cm. In conjunction with a rather low relative permittivity $\varepsilon_r$ of doped hafnium oxide-based ferroelectrics, which alleviates the scalability problem of ferroelectric field effect transistors. For example, the thickness and the gate length of a ferroelectric gate dielectric layer containing hafnium oxide may be reduced by about 80% compared to the perovskite-based devices. Further, despite its short development time of only about 10 years, the retention property of hafnium oxide-based ferroelectric field effect transistors is comparable with the best-reported retention properties from the perovskite-based ferroelectric field effect transistors.

Generally, epitaxial alignment between the continuous ferroelectric gate dielectric layer 240L and the strained single crystalline semiconductor layer 210 may, or may not, include crystalline defects, which may include point-type defects. The portion of the continuous ferroelectric gate dielectric layer 240L overlying the strained single crystalline semiconductor layer 210 may be single crystalline, or may be polycrystalline such that a predominant fraction of the entire volume of the continuous ferroelectric gate dielectric layer 240L that overlies the strained single crystalline semiconductor layer 210 is in epitaxial alignment with the strained single crystalline semiconductor layer 210, and/or such that the continuous ferroelectric gate dielectric layer 240L is otherwise strained by one or more underlying layers.

Referring to FIG. 1C, a gate electrode material layer 154L including a conductive material can be deposited over the continuous ferroelectric gate dielectric layer 240L. The gate electrode material layer 154L may include a metallic material and/or a heavily doped semiconductor material. In one embodiment, the gate electrode material layer 154L may include a metallic material that does not induce outdiffusion of metal into the continuous ferroelectric gate dielectric layer 240L. For example, the gate electrode material layer 154L may include, and/or may consist essentially of, a refractory metal such as tungsten, tantalum, rhenium, molybdenum, and/or niobium. Alternatively or additionally, the gate electrode material layer 154L may include, and/or may consist essentially of, a heavily doped semiconductor material such as heavily doped polysilicon. Generally, the gate electrode material layer 154L includes a conductive material that do not diffuse metallic dopants into the continuous ferroelectric gate dielectric layer 240L during a subsequent anneal process in order to prevent disturbing the ferroelectric properties of the continuous ferroelectric gate dielectric layer 240L.

A gate cap dielectric layer 158L can be deposited over the continuous ferroelectric gate dielectric layer 240L. The gate cap dielectric layer 158L includes a dielectric material such as silicon nitride. The thickness of the gate cap dielectric layer 158L may be in a range from 10 nm to 100 nm, such as from 20 nm to 50 nm, although lesser and greater thicknesses may also be employed.

Referring to FIG. 1D, a photoresist layer (not shown) can be applied over the gate cap dielectric layer 158L, and can be lithographically patterned into gate patterns. An anisotropic etch process can be performed to etch unmasked portions of the gate cap dielectric layer 158L, the gate electrode material layer 154L, and the continuous ferroelectric gate dielectric layer 240L. Each contiguous set of patterned portions of the gate cap dielectric layer 158L, the gate electrode material layer 154L, and the continuous ferroelectric gate dielectric layer 240L can be a gate stack structure (240, 154, 158). Each gate stack structure (240, 154, 158) includes a ferroelectric gate dielectric layer 240, a gate electrode 154, and a gate cap dielectric 158. Each ferroelectric gate dielectric layer 240 comprises a patterned portion of the continuous ferroelectric gate dielectric layer 240L. Each gate electrode 154 comprises a patterned portion of the gate electrode material layer 154L. Each gate cap dielectric 158 comprises a patterned portion of the gate cap dielectric layer 158L.

In one embodiment, each portion of the ferroelectric gate dielectric layer 240 overlying the strained single crystalline semiconductor layer 210 can be single crystalline, and can be epitaxially aligned to the strained single crystalline semiconductor layer 210. The epitaxial alignment between the ferroelectric gate dielectric layer 240 and the strained single crystalline semiconductor layer 210 causes the in-plane average lattice constant of the ferroelectric gate dielectric layer 240 to be affected by the in-plane average lattice constant of the strained single crystalline semiconductor layer 210. In one embodiment, the ferroelectric gate dielectric layer 240 is laterally strained within a horizontal plane with an average horizontal lattice constant that differs from an average horizontal lattice constant in an unstrained state at least by 0.01%, such as from 0.1% to 5% and/or from 0.2% to 2%. The percentage difference between the average horizontal lattice constant of the ferroelectric gate dielectric layer 240 from the average horizontal lattice constant in an unstrained state of the same material with the same thickness and the same crystallographic orientations is proportional to the strain within the strained single crystalline semiconductor layer 210.

According to an aspect of the present disclosure, the strain in the ferroelectric gate dielectric layer 240 can increase the ferroelectric coercive field of the single crystalline ferroelectric material within the ferroelectric gate dielectric layer 240. In an illustrative example, the ferroelectric coercive field of the single crystalline ferroelectric material within the ferroelectric gate dielectric layer 240 may increase by a percentage in a range from 1% to 400%, such as from 20% to 200%, depending on the magnitude of the strain within the ferroelectric gate dielectric layer 240 and the material of the ferroelectric gate dielectric layer 240. Generally, the ferroelectric gate dielectric layer 240 can have a coercive field that is greater than the coercive field of an unstrained ferroelectric material having a same thickness and a same crystallographic orientation and material composition by at least 1%.

Electrical dopants can be implanted in surface portions of the strained single crystalline semiconductor layer 210 that are not masked by the gate stack structure (240, 154, 158) to form a source extension region 132 and a drain extension region 138. For example, the strained single crystalline semiconductor layer 210 may include electrical dopants of a first conductivity type (which may be p-type or n-type) at an atomic concentration in a range from $1.0 \times 10^{14}/cm^3$ to $3.0 \times 10^{17}/cm^3$, although lesser and greater atomic concentrations may also be employed. The source extension region 132 and the drain extension region 138 may include electrical dopants of a second conductivity type that is the opposite of the first conductivity type at an atomic concentration in a range from $3.0 \times 10^{17}/cm^3$ to $1.0 \times 10^{20}/cm^3$, although lesser and greater atomic concentrations may also be employed.

Referring to FIG. 1E, a dielectric gate spacer 156 can be formed around the gate stack structure (240, 154, 158) by conformally depositing at least one dielectric material layer (such as a silicon nitride layer and/or a silicon oxide layer) and anisotropically etching horizontally-extending portions of the at least one dielectric material layer. A remaining vertically-extending portion of the at least one dielectric material layer that laterally surrounds the gate stack structure (240, 154, 158) comprise the dielectric gate spacer 156.

A source region 134 and a drain region 136 embedded within, and/or on, the strained single crystalline semiconductor layer 210 can be formed. The source region 134 and the drain region 136 may be formed by implantation of dopants of the second conductivity type into portions of the single crystalline semiconductor layer 210 and the source extension region 132 and the drain extension region 138 that are not masked by the gate stack structure (240, 154, 158) and the dielectric gate spacer 156, and/or by a selective semiconductor deposition process that can form the source region 134 and the drain region 136 as raised source and drain regions. The source region 134 and the drain region 136 may include electrical dopants of the second conductivity type that is the opposite of the first conductivity type at an atomic concentration in a range from $5.0 \times 10^{18}/cm^3$ to $2.0 \times 10^{21}/cm^3$, although lesser and greater atomic concentrations may also be employed. Remaining portions of the single crystalline semiconductor layer 210 having a doping of the first conductivity type comprise a body region 235, which includes a semiconductor channel 260. The semiconductor channel 260 is a single crystalline semiconductor material portion including a strained semiconductor material that underlies and contacts the ferroelectric gate electric layer 240.

In one embodiment, the source region 134 and the drain region 136 can be laterally spaced apart from each other by the semiconductor channel 260 that is located within the strained single crystalline semiconductor layer (235, 134, 136, 132, 138), and underlies the ferroelectric gate dielectric layer 240.

Referring to FIG. 1F, a contact-level dielectric layer 170 can be deposited over the gate stack structure (240, 154, 158). The top surface of the contact-level dielectric layer 170 may be planarized, for example, by a chemical mechanical planarization process. Contact via cavities can be formed through the contact-level dielectric layer 170 over each of the source region 134, the drain region 136, and the gate electrode 154.

At least one conductive material can be deposited in the contact via cavities, and excess portions of the at least one conductive material can be removed from above the top surface of the contact-level dielectric layer 170 by chemical mechanical planarization. Remaining portions of the at least one conductive material can include a source contact via structure 174, a drain contact via structure 176, and a gate contact via structure 175.

Referring to FIG. 2A, a second exemplary structure according to a second embodiment of the present disclosure can be the same as the first exemplary structure illustrated in FIG. 1B.

Referring to FIG. 2B, a non-polar metallic element can be implanted or otherwise incorporated into the continuous ferroelectric gate dielectric layer 240L. As used herein, a "non-polar metallic element" refers to a metallic element that does not form any ferroelectric oxide material upon combination with oxygen. In other words, compounds of any non-polar metallic element and oxygen atoms do not provide any ferroelectric material. For example, the continuous ferroelectric gate dielectric layer 240L can include any of the materials described above, the non-polar metallic element may be any metallic element does not form a ferroelectric oxygen-containing compound.

In one embodiment, the non-polar metallic element may include one or more elements which create defects, such as point defects, in the ferroelectric material. For hafnium oxide (e.g., Zr or Si doped hafnium oxide), the non-polar metallic element may include one or more elements selected from Mg, Ga, In, Sc, Y, rare earth elements, Ti, Ca, Ta, Pt, Mo, Ag, and/or Au, etc. In one embodiment, non-polar metallic element may comprise an element which does not form a chemical bond with the ferroelectric material but instead creates defects in the crystal lattice and/or at grain boundaries of the ferroelectric material. The continuous ferroelectric gate dielectric layer that includes the non-polar metallic element is herein referred to as a defect containing ferroelectric gate dielectric layer 150L. In one embodiment, the non-polar metallic element may be collaterally inserted in a surface portion of the strained single crystalline semiconductor layer 210.

According to an aspect of the present disclosure, the defect containing ferroelectric gate dielectric layer 150L includes the non-polar metallic element at an atomic percentage in a range from 0.01% to 10%, such as from 0.05% to 3% and/or from 0.1% to 1.0%. The non-polar metallic element is introduced in a sufficient quantity to form nanoclusters in the defect containing ferroelectric gate dielectric layer 150L. The nanoclusters of the non-polar metallic element may have a diameter of 0.5 nm to 5 nm. The nanoclusters generate defects (e.g., lattice and/or grain boundary defects) in the defect containing ferroelectric gate dielectric layer 150L which increase the coercive field.

In one embodiment, the defect containing ferroelectric gate dielectric layer 150L is polycrystalline as deposited or the incorporation of the non-polar metallic element into the defect containing ferroelectric gate dielectric layer 150L induces conversion of the single crystalline material within the continuous ferroelectric gate dielectric layer 240L into a polycrystalline material including pinned grain boundaries. Pinned grain boundaries are structurally stable grain boundaries that do not move upon anneal. A predominant fraction (i.e., more than 50%) of an entire volume of the defect containing ferroelectric gate dielectric layer 150L contacting the strained single crystalline semiconductor layer 210 may be in epitaxial alignment with the strained single crystalline semiconductor layer 210.

In one embodiment, the defect containing ferroelectric gate dielectric layer 150L may be polycrystalline and may include pinned grain boundaries. In one embodiment, the defect containing ferroelectric gate dielectric layer 150L may be annealed after incorporating the non-polar metallic element into the defect containing ferroelectric gate dielectric layer 150L. Atoms of the non-polar metallic element (e.g., the nanoclusters) can be present at the pinned grain boundaries at a higher atomic concentration than within grains of the defect containing ferroelectric gate dielectric layer 150L. In one embodiment, the non-polar metallic element comprises an element selected from Mg, Ga, In, Sc, Y, rare earth elements, Ti, Ca, Ta, Pt, Mo, Ag, and/or Au, etc. In this case, a predominant fraction (i.e., more than 50%), such as a fraction in a range from 90% to 99.9%, of the entire volume of the defect containing ferroelectric gate dielectric layer 150L contacting the strained single crystalline semiconductor layer 210 can be in epitaxial alignment with the strained single crystalline semiconductor layer 210.

In one alternative embodiment, the defect containing ferroelectric gate dielectric layer 150L is formed by ion bombardment of the continuous ferroelectric gate dielectric layer 240L instead of by introducing the non-polar metallic element into the continuous ferroelectric gate dielectric layer 240L. The ion bombardment may include bombarding the continuous ferroelectric gate dielectric layer 240L with inert gas ions, such as helium or argon ions, after depositing the continuous ferroelectric gate dielectric layer 240L to generate bombardment induced defects therein and to convert it into the defect containing ferroelectric gate dielectric layer 150L.

In another alternative embodiment, the ion bombardment may take place during the deposition of the ferroelectric gate dielectric layer to generate defects therein. In this embodiment, the initially deposited ferroelectric gate dielectric layer comprises the defect containing ferroelectric gate dielectric layer 150L. Thus, the formation of then continuous ferroelectric gate dielectric layer 240L may be omitted. The ion bombardment may take place in the deposition chamber after the entire ferroelectric gate dielectric layer is deposited. Alternatively, after a portion of the ferroelectric gate dielectric layer is deposited, the ion bombardment is performed to generate defects in the deposited portion of the ferroelectric gate dielectric layer, followed by depositing an additional portion of the ferroelectric gate dielectric layer. Additional ion bombardment step(s) and/or additional ferroelectric gate dielectric layer portion deposition steps may optionally be performed.

Referring to FIG. 2C, the processing steps of FIG. 1C can be performed to form a gate electrode material layer 154L and a gate cap dielectric layer 158L.

Referring to FIG. 2D, the processing steps of FIG. 1D can be performed to form a gate stack structure (150, 154, 158), a source extension region 132, and a drain extension region 138.

Referring to FIG. 2E, the processing steps of FIG. 1E can be performed to form a dielectric gate spacer 156, a source region 134, and a drain region 136.

Referring to FIG. 2F, the processing steps of FIG. 1F can be performed to form a contact-level dielectric layer 170 and various contact via structures (174, 176, 175).

Referring to FIG. 3A, a third exemplary structure according to a third embodiment of the present disclosure can be the same as the first exemplary structure illustrated in FIG. 1C.

Referring to FIG. 3B, the non-polar metallic element can be implanted into the continuous ferroelectric gate dielectric layer 240L through the gate electrode material layer 154L and the gate cap dielectric layer 158L. For example, the continuous ferroelectric gate dielectric layer 240L can include any of the materials described above, the non-polar metallic element may be any metallic element does not form a ferroelectric oxygen-containing compound. In one embodiment, the non-polar metallic element may include one or more elements selected from Mg, Ga, In, Sc, Y, rare earth elements, Ti, Ca, Ta, Pt, Mo, Ag, and/or Au, etc. The continuous ferroelectric gate dielectric layer that includes the non-polar metallic element is herein referred to as a defect containing ferroelectric gate dielectric layer 150L.

The energy of the ion implantation process can be selected such that ions of the non-polar metallic element are implanted through the gate cap dielectric layer 158L and the gate electrode material layer 154L and into the continuous ferroelectric gate dielectric layer 240L. The continuous ferroelectric gate dielectric layer 240L is converted into the defect containing ferroelectric gate dielectric layer 150L which includes the defect causing nanoclusters described above with respect to the second embodiment.

According to an aspect of the present disclosure, the defect containing ferroelectric gate dielectric layer 150L includes the non-polar metallic element at an atomic percentage in a range from 0.01% to 10%, such as from 0.05% to 3% and/or from 0.1% to 1.0%. In one embodiment, a surface portion of the strained single crystalline semiconductor layer 210 may be collaterally inserted with the non-polar metallic element.

In one embodiment, the defect containing ferroelectric gate dielectric layer 150L is polycrystalline as deposited or incorporation of the non-polar metallic element into the defect containing ferroelectric gate dielectric layer 150L induces conversion of the single crystalline material within the continuous ferroelectric gate dielectric layer 240L into a polycrystalline material including pinned grain boundaries. Pinned grain boundaries are structurally stable grain boundaries that do not move upon anneal. A predominant fraction (i.e., more than 50%) of an entire volume of the defect containing ferroelectric gate dielectric layer 150L contacting the strained single crystalline semiconductor layer 210 may be in epitaxial alignment with the strained single crystalline semiconductor layer 210.

In one embodiment, the defect containing ferroelectric gate dielectric layer 150L may be polycrystalline and may include pinned grain boundaries. In one embodiment, the defect containing ferroelectric gate dielectric layer 150L may be annealed after incorporating the non-polar metallic element into the defect containing ferroelectric gate dielectric layer 150L. Atoms of the non-polar metallic element can be present at the pinned grain boundaries at a higher atomic concentration than within grains of the defect containing ferroelectric gate dielectric layer 150L. In one embodiment, the non-polar metallic element comprises an element selected from Mg, Ga, In, Sc, Y, rare earth elements, Ti, Ca, Ta, Pt, Mo, Ag, and/or Au, etc. In this case, a predominant fraction (i.e., more than 50%), such as a fraction in a range from 90% to 99.9%, of the entire volume of the defect containing ferroelectric gate dielectric layer 150L contacting the strained single crystalline semiconductor layer 210 can be in epitaxial alignment with the strained single crystalline semiconductor layer 210.

Referring to FIG. 3C, the processing steps of FIG. 1D can be performed to form a gate stack structure (150, 154, 158). In an alternative embodiment, the non-polar metallic element clusters may be introduced into the ferroelectric gate dielectric layer after formation of the gate stack structure (150, 154, 158) instead of at the step shown in FIG. 3B.

Referring to FIG. 3D, the additional processing steps of FIG. 1D can be performed to form a source extension region 132 and a drain extension region 138.

Referring to FIG. 3E, the processing steps of FIG. 1E can be performed to form a dielectric gate spacer 156, a source region 134, and a drain region 136.

Figure 3F:
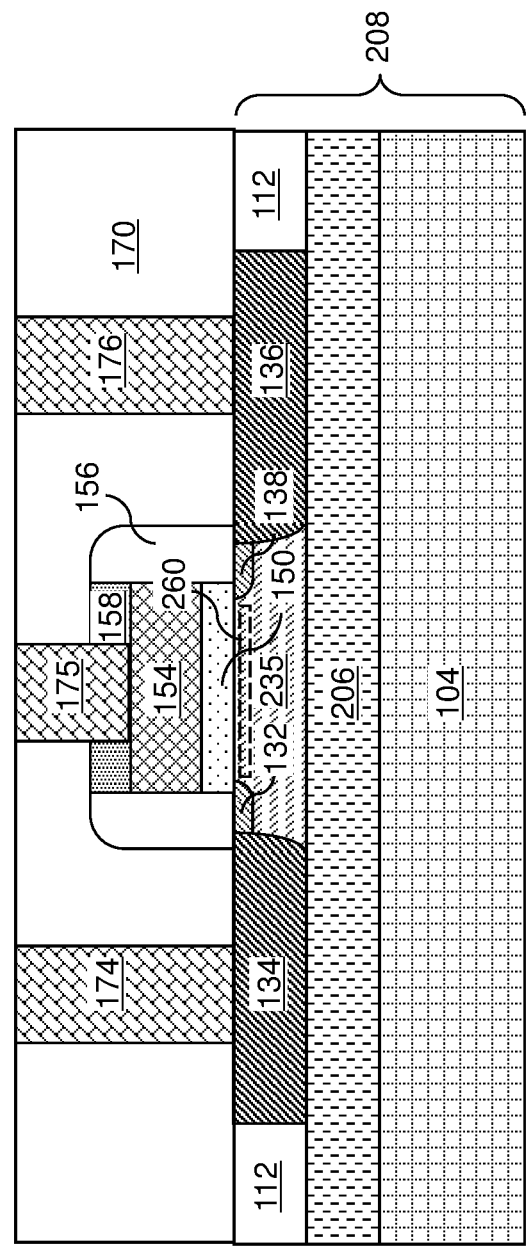

Referring to FIG. 3F, the processing steps of FIG. 1F can be performed to form a contact-level dielectric layer 170 and various contact via structures (174, 176, 175).

In one alternative embodiment, the defect containing ferroelectric gate dielectric layer 150L is formed by ion bombardment of the continuous ferroelectric gate dielectric layer 240L instead of by introducing the non-polar metallic element into the continuous ferroelectric gate dielectric layer 240L. The ion bombardment may include bombarding the continuous ferroelectric gate dielectric layer 240L with inert gas ions, such as helium or argon ions, after depositing the gate cap dielectric layer 158L, the gate electrode material layer 154L, and the continuous ferroelectric gate dielectric layer 240L. The ion bombardment energy is selected to be sufficiently high for the inert gas ions to penetrate through the gate cap dielectric layer 158L, and the gate electrode material layer 154L to reach the continuous ferroelectric gate dielectric layer 240L and to generate defects therein, to convert it into the defect containing ferroelectric gate dielectric layer 150L. The ion bombardment step may take place during the step shown in FIG. 3B or after forming the gate stack structure gate stack structure (150, 154, 158) shown in FIG. 3C.

Figure 4A:
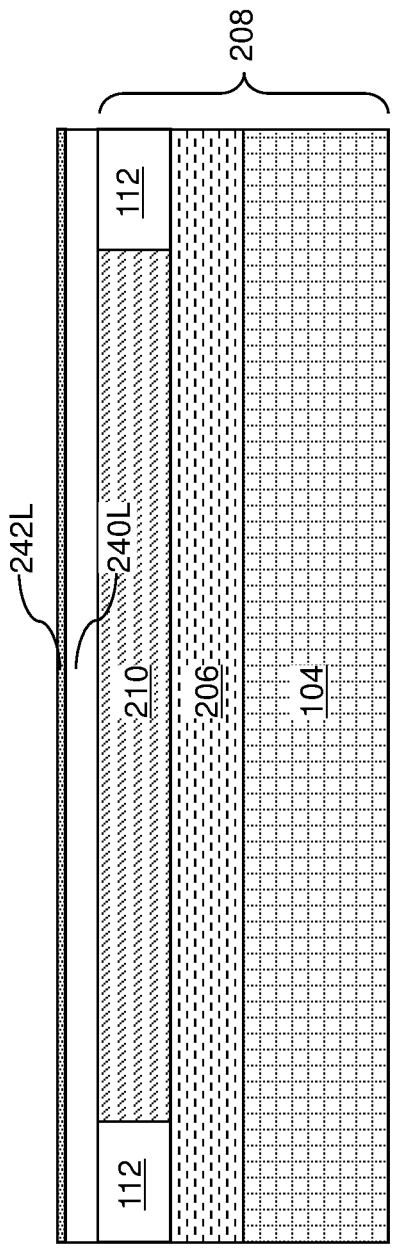

Referring to FIG. 4A, a fourth exemplary structure according to a fourth embodiment of the present disclosure can be the derived from the first exemplary structure illustrated in FIG. 1B by depositing a metallic dusting layer 242L on a top surface of the continuous ferroelectric gate dielectric layer 240L. The metallic dusting layer 242L includes a continuous or non-continuous layer of the non-polar metallic element, which may be any of the non-polar metallic elements discussed above. In one embodiment, the non-polar metallic element may include one or more elements selected from Mg, Ga, In, Sc, Y, rate earth elements, Ti, Zr or Hf. The thickness of the metallic dusting layer 242L may be equal to, less than, or greater than 1 monolayer of the non-polar metallic elements. In one embodiment, the metallic dusting layer 242L may have a thickness greater than 1 monolayer, and may be formed as a continuous metallic material layer. Alternatively, the metallic dusting layer 242L may be formed as nanoclusters of atoms that may, or may not, be adjoined to each other. In one embodiment, the fraction of the area of the continuous ferroelectric gate dielectric layer 240L that is covered by the metallic dusting layer 242L relative to the total area of the continuous ferroelectric gate dielectric layer 240L may be in a range from 0.01 to 0.99, such as from 0.03 to 0.3. Generally, the average thickness of the metallic dusting layer 242L may be in a range from 0.01 times the thickness of a monolayer of the non-polar metallic element to 10 times the thickness of a monolayer of the non-polar metallic element.

Figure 4B:
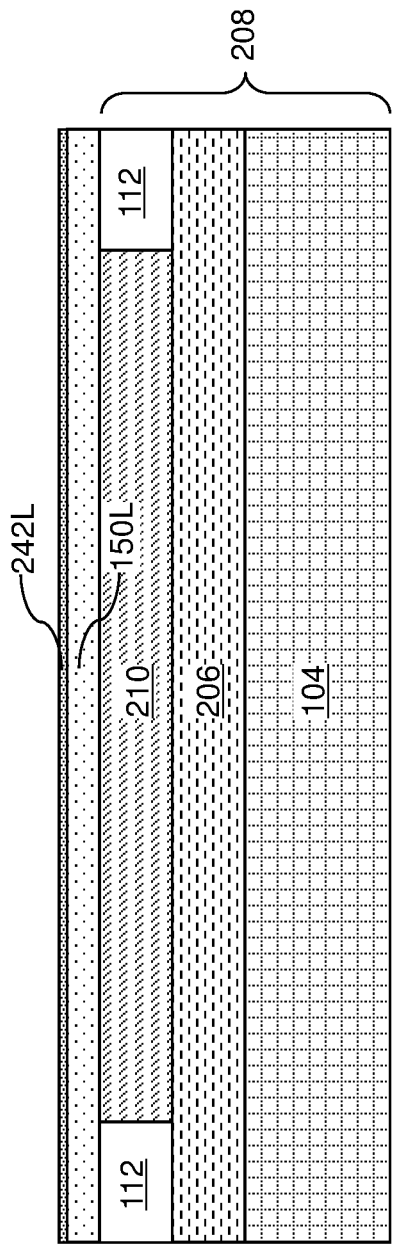

Referring to FIG. 4B, an anneal process can be performed to outdiffuse the non-polar metallic element within the metallic dusting layer 242L into the continuous ferroelectric gate dielectric layer 240L. The anneal process can be performed at an elevated temperature that is sufficient to induce diffusion of the non-polar metallic element into the continuous ferroelectric gate dielectric layer 240L. The continuous ferroelectric gate dielectric layer that includes the non-polar metallic element nanoclusters is herein referred to as a defect containing ferroelectric gate dielectric layer 150L.

According to an aspect of the present disclosure, the defect containing ferroelectric gate dielectric layer 150L includes the non-polar metallic element at an atomic percentage in a range from 0.01% to 10%, such as from 0.05% to 3% and/or from 0.1% to 1.0%. In one embodiment, a surface portion of the strained single crystalline semiconductor layer 210 may be collaterally inserted with the non-polar metallic element.

In one embodiment, the defect containing ferroelectric gate dielectric layer 150L is polycrystalline as deposited or incorporation of the non-polar metallic element into the defect containing ferroelectric gate dielectric layer 150L induces conversion of the single crystalline material within the continuous ferroelectric gate dielectric layer 240L into a polycrystalline material including pinned grain boundaries. Pinned grain boundaries are structurally stable grain boundaries that do not move upon anneal. A predominant fraction (i.e., more than 50%) of an entire volume of the defect containing ferroelectric gate dielectric layer 150L contacting the strained single crystalline semiconductor layer 210 may be in epitaxial alignment with the strained single crystalline semiconductor layer 210.

In one embodiment, the defect containing ferroelectric gate dielectric layer 150L may be polycrystalline and may include pinned grain boundaries. In one embodiment, the defect containing ferroelectric gate dielectric layer 150L may be annealed after incorporating the non-polar metallic element into the defect containing ferroelectric gate dielectric layer 150L. Atoms of the non-polar metallic element can be present at the pinned grain boundaries at a higher atomic concentration than within grains of the defect containing ferroelectric gate dielectric layer 150L. In one embodiment, the non-polar metallic element comprises an element selected from Mg, Ga, In, Sc, Y, rate earth elements, Ti, Zr or Hf. In this case, a predominant fraction (i.e., more than 50%), such as a fraction in a range from 90% to 99.9%, of the entire volume of the defect containing ferroelectric gate dielectric layer 150L contacting the strained single crystalline semiconductor layer 210 can be in epitaxial alignment with the strained single crystalline semiconductor layer 210. Any remaining portion of the metallic dusting layer 242L can be subsequently removed, for example, employing a wet etch process that etches the metallic material of the metallic dusting layer 242L selective to material of the defect containing ferroelectric gate dielectric layer 150L.

Generally, incorporation of the non-polar metallic element into the ferroelectric gate dielectric layer 240L may be performed by an ion implantation process that implants the non-polar metallic element into the continuous ferroelectric gate dielectric layer 240L prior to deposition of a material of the gate electrode 154 thereupon, or by an ion implantation process that implants the non-polar metallic element into the continuous ferroelectric gate dielectric layer 240L after deposition of a material of the gate electrode 154 thereupon, or by a combination of deposition of a metallic dusting layer 242L on the continuous ferroelectric gate dielectric layer 240L, outdiffusion of the non-polar metallic element from the metallic dusting layer 242L into the continuous ferroelectric gate dielectric layer 240L, and subsequent removal of the metallic dusting layer 242L.

Figure 4C:
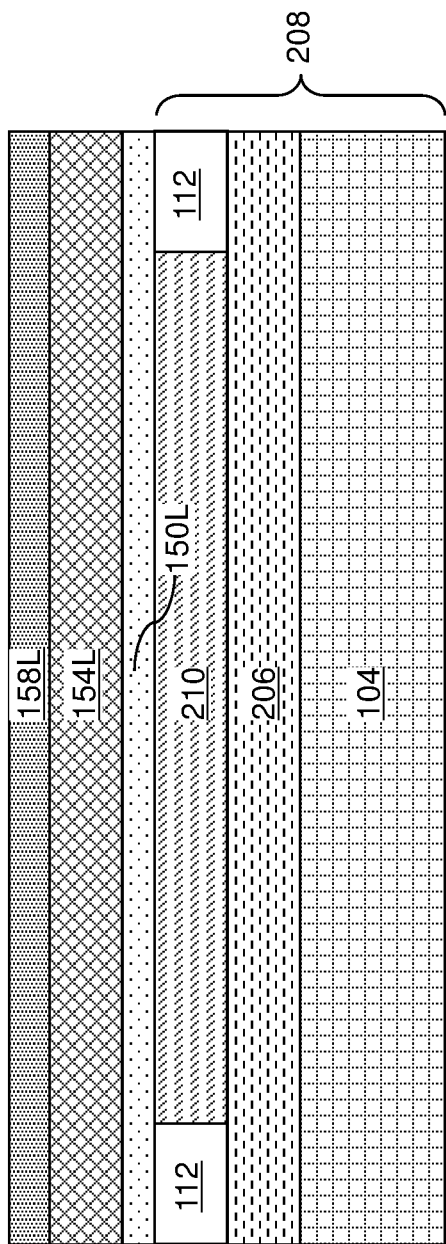

Referring to FIG. 4C, the processing steps of FIG. 1C can be performed to form a gate electrode material layer 154L and a gate cap dielectric layer 158L.

Figure 4D:
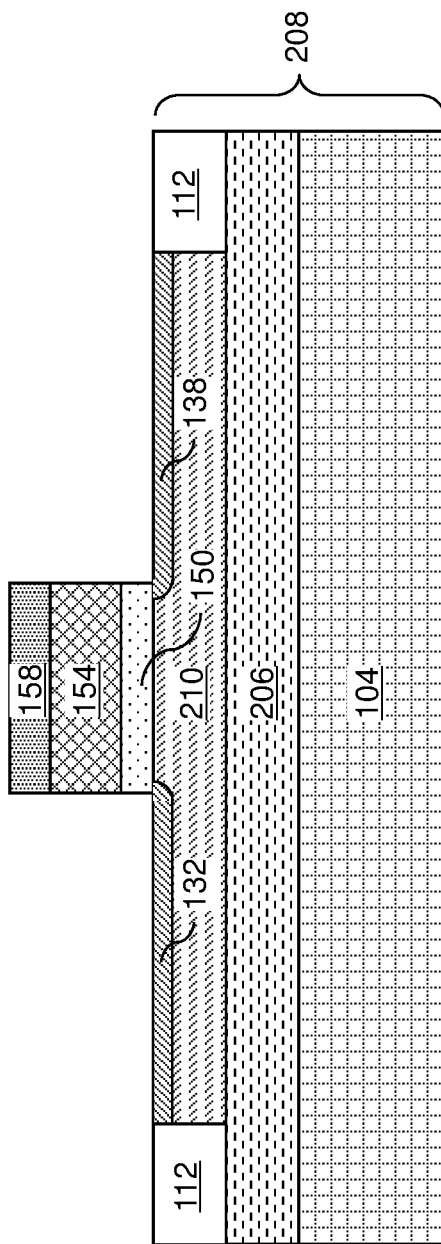

Referring to FIG. 4D, the processing steps of FIG. 1D can be performed to form a gate stack structure (150, 154, 158), a source extension region 132, and a drain extension region 138.

Referring to FIG. 4E, the processing steps of FIG. 1E can be performed to form a dielectric gate spacer 156, a source region 134, and a drain region 136.

Referring to FIG. 4F, the processing steps of FIG. 1F can be performed to form a contact-level dielectric layer 170 and various contact via structures (174, 176, 175).

Figure 5A:
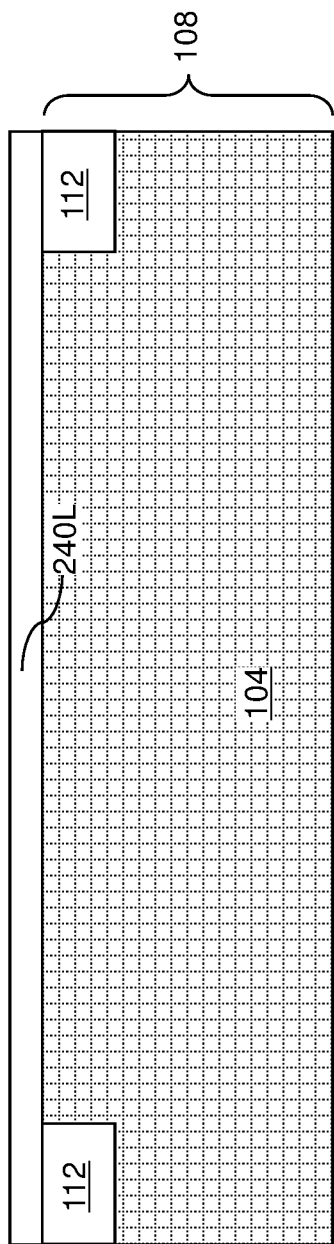

Referring to FIG. 5A, a fifth exemplary structure according to a fifth embodiment of the present disclosure is illustrated. The fifth exemplary structure can be derived from the first exemplary structure by employing a substrate 108 that includes a substrate semiconductor layer 104, which can be the same as the substrate semiconductor layer 104 of FIG. 1A. In the fifth exemplary structure, formation of a single crystalline buffer semiconductor layer 206 and a strained single crystalline semiconductor layer 210 is omitted, and the continuous ferroelectric gate dielectric layer 240L can be formed directly on a top surface of the substrate semiconductor layer 104. In one embodiment, the substrate semiconductor layer 104 may be free of strain or may be substantially free of strain.

The continuous ferroelectric gate dielectric layer 240L can be formed by an atomic layer deposition (ALD) process, a chemical vapor deposition (CVD) process, or a physical vapor deposition (PVD) process. In one embodiment, a portion of the continuous ferroelectric gate dielectric layer 240L that is formed over the top surface of the substrate semiconductor layer 104 is epitaxially aligned to the single crystalline structure of the substrate semiconductor layer 104. Thus, each portion of the continuous ferroelectric gate dielectric layer 240L that overlies the substrate semiconductor layer 104 can be single crystalline, and can be in epitaxial alignment with the substrate semiconductor layer 104. Alternatively, the continuous ferroelectric gate dielectric layer 240L can be polycrystalline. The continuous ferroelectric gate dielectric layer 240L may be free of strain, or may be substantially free of strain.

Figure 5B:
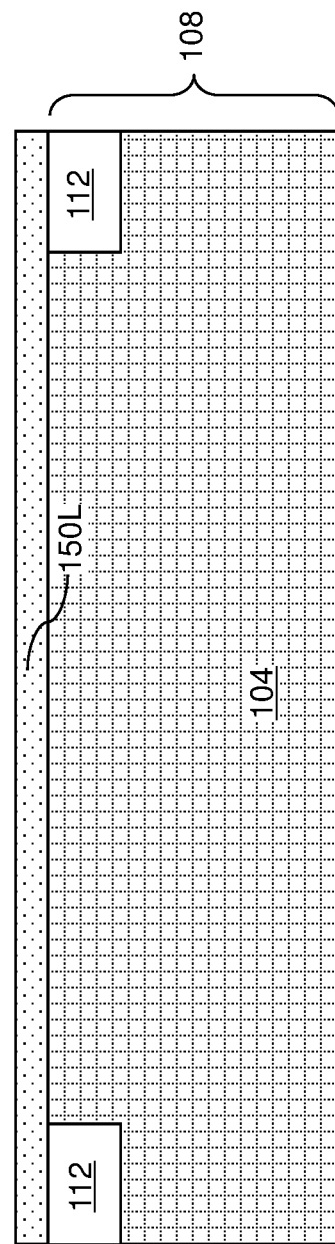

Referring to FIG. 5B, the processing steps of FIG. 2B can be performed to convert the continuous ferroelectric gate dielectric layer 240L into a defect containing ferroelectric gate dielectric layer 150L, as described above with respect to the second embodiment.

Referring to FIG. 5C, the processing steps of FIG. 1D can be performed to form a gate stack structure (150, 154. 158).

Referring to FIG. 5D, the additional processing steps of FIG. 1D can be performed to form a source extension region 132 and a drain extension region 138.

Referring to FIG. 5E, the processing steps of FIG. 1E can be performed to form a dielectric gate spacer 156, a source region 134, and a drain region 136. A semiconductor channel 160 is formed between the source region 134 and the drain region 136. The semiconductor channel 160 may be free of strain, or be substantially free of strain.

Referring to FIG. 5F, the processing steps of FIG. 1F can be performed to form a contact-level dielectric layer 170 and various contact via structures (174, 176, 175).

In one alternative embodiment, the defect containing ferroelectric gate dielectric layer 150L is formed by ion bombardment of the continuous ferroelectric gate dielectric layer 240L instead of by introducing the non-polar metallic element into the continuous ferroelectric gate dielectric layer 240L. The ion bombardment may include bombarding the continuous ferroelectric gate dielectric layer 240L with inert gas ions, such as helium or argon ions, after depositing the continuous ferroelectric gate dielectric layer 240L to generate bombardment induced defects therein and to convert it into the defect containing ferroelectric gate dielectric layer 150L.

In another alternative embodiment, the ion bombardment may take place during the deposition of the ferroelectric gate dielectric layer to generate defects therein. In this embodiment, the initially deposited ferroelectric gate dielectric layer comprises the defect containing ferroelectric gate dielectric layer 150L. Thus, the formation of then continuous ferroelectric gate dielectric layer 240L may be omitted. The ion bombardment may take place in the deposition chamber after the entire ferroelectric gate dielectric layer is deposited. Alternatively, after a portion of the ferroelectric gate dielectric layer is deposited, the ion bombardment is performed to generate defects in the deposited portion of the ferroelectric gate dielectric layer, followed by depositing an additional portion of the ferroelectric gate dielectric layer. Additional ion bombardment step(s) and/or additional ferroelectric gate dielectric layer portion deposition steps may optionally be performed.

Referring to FIG. 6A, a sixth exemplary structure according to a sixth embodiment of the present disclosure can be derived from the first exemplary structure illustrated in FIG. 5A by depositing a gate electrode dielectric layer 154L and a gate cap dielectric layer 158L thereupon.

Referring to FIG. 6B, the processing steps of FIG. 3B can be performed to implant a non-polar metallic element into the continuous ferroelectric gate dielectric layer 240L. The continuous ferroelectric gate dielectric layer 240L is converted into the defect containing ferroelectric gate dielectric layer 150L, as described above with respect to the third embodiment.

Figure 6C:
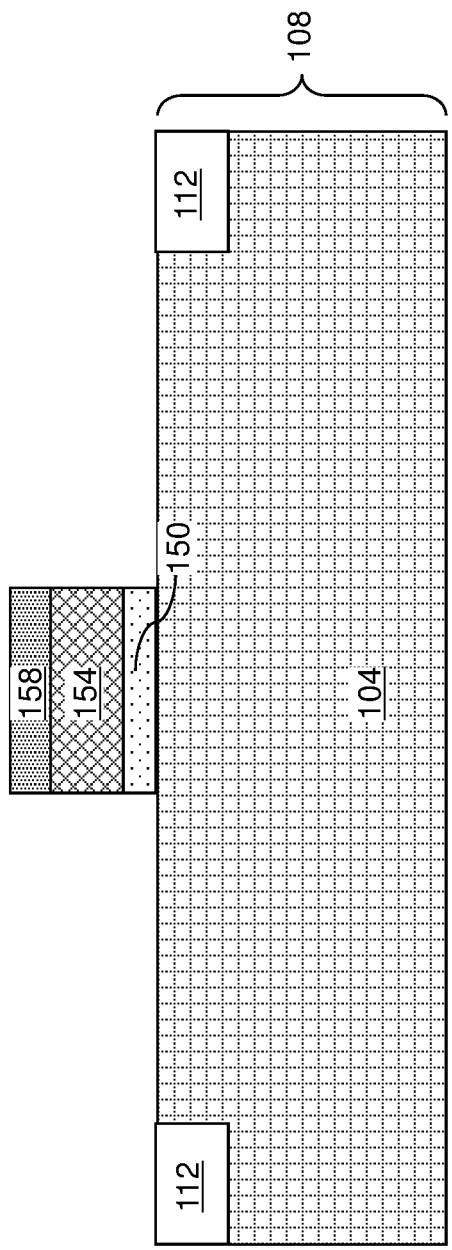

Referring to FIG. 6C, the processing steps of FIG. 1D can be performed to form a gate stack structure (150, 154. 158). In an alternative embodiment, the non-polar metallic element clusters may be introduced into the ferroelectric gate dielectric layer after formation of the gate stack structure (150, 154, 158) instead of at the step shown in FIG. 6B.

Figure 6D:
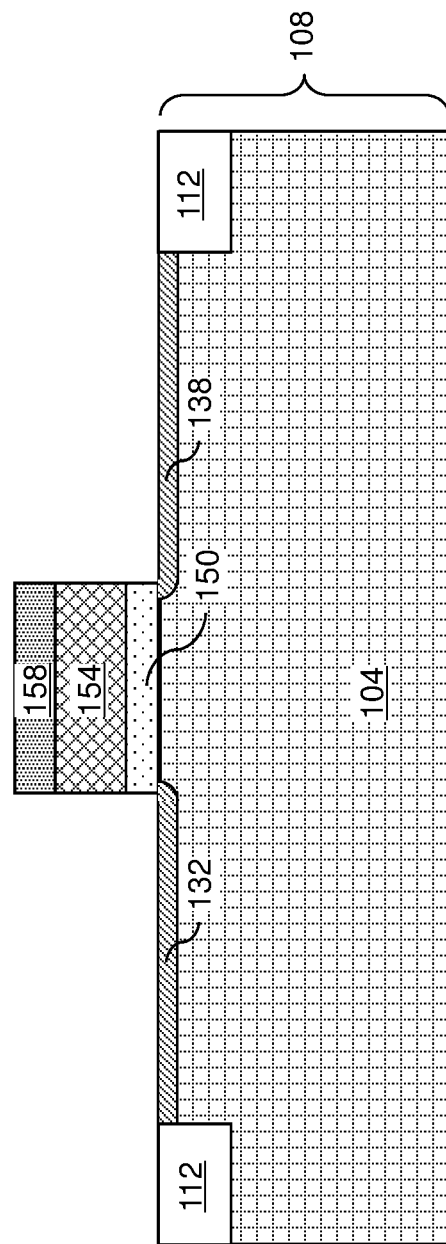

Referring to FIG. 6D, the processing steps of FIG. 1D can be performed to form a source extension region 132 and a drain extension region 138.

Referring to FIG. 6E, the processing steps of FIG. 1E can be performed to form a dielectric gate spacer 156, a source region 134, and a drain region 136.

Referring to FIG. 6F, the processing steps of FIG. 1F can be performed to form a contact-level dielectric layer 170 and various contact via structures (174, 176, 175).

In one alternative embodiment, the defect containing ferroelectric gate dielectric layer 150L is formed by ion bombardment of the continuous ferroelectric gate dielectric layer 240L instead of by introducing the non-polar metallic element into the continuous ferroelectric gate dielectric layer 240L. The ion bombardment may include bombarding the continuous ferroelectric gate dielectric layer 240L with inert gas ions, such as helium or argon ions, after depositing the gate cap dielectric layer 158L, the gate electrode material layer 154L, and the continuous ferroelectric gate dielectric layer 240L. The ion bombardment energy is selected to be sufficiently high for the inert gas ions to penetrate through the gate cap dielectric layer 158L, and the gate electrode material layer 154L to reach the continuous ferroelectric gate dielectric layer 240L and to generate defects therein, to convert it into the defect containing ferroelectric gate dielectric layer 150L. The ion bombardment step may take place during the step shown in FIG. 6B or after forming the gate stack structure gate stack structure (150, 154, 158) shown in FIG. 6C.

Referring to FIG. 7A, a seventh exemplary structure according to a seventh embodiment of the present disclosure can be the derived from the fourth exemplary structure illustrated in FIG. 5A by depositing the metallic dusting layer 242L on a top surface of the continuous ferroelectric gate dielectric layer 240L, as described above with respect to the fourth embodiment.

Referring to FIG. 7B, an anneal process described above can be performed to outdiffuse the non-polar metallic element within the metallic dusting layer 242L into the continuous ferroelectric gate dielectric layer 240L. The anneal process can be performed at an elevated temperature that is sufficient to induce diffusion of the non-polar metallic element into the continuous ferroelectric gate dielectric layer 240L. The continuous ferroelectric gate dielectric layer that includes the non-polar metallic element is herein referred to as a defect containing ferroelectric gate dielectric layer 150L.

Generally, incorporation of the non-polar metallic element into the ferroelectric gate dielectric layer 240L may be performed by an ion implantation process that implants the non-polar metallic element into the continuous ferroelectric gate dielectric layer 240L prior to deposition of a material of the gate electrode 154 thereupon, or by an ion implantation process that implants the non-polar metallic element into the continuous ferroelectric gate dielectric layer 240L after deposition of a material of the gate electrode 154 thereupon, or by a combination of deposition of a metallic dusting layer 242L on the continuous ferroelectric gate dielectric layer 240L, outdiffusion of the non-polar metallic element from the metallic dusting layer 242L into the continuous ferroelectric gate dielectric layer 240L, and subsequent removal of the metallic dusting layer 242L.

Figure 7C:
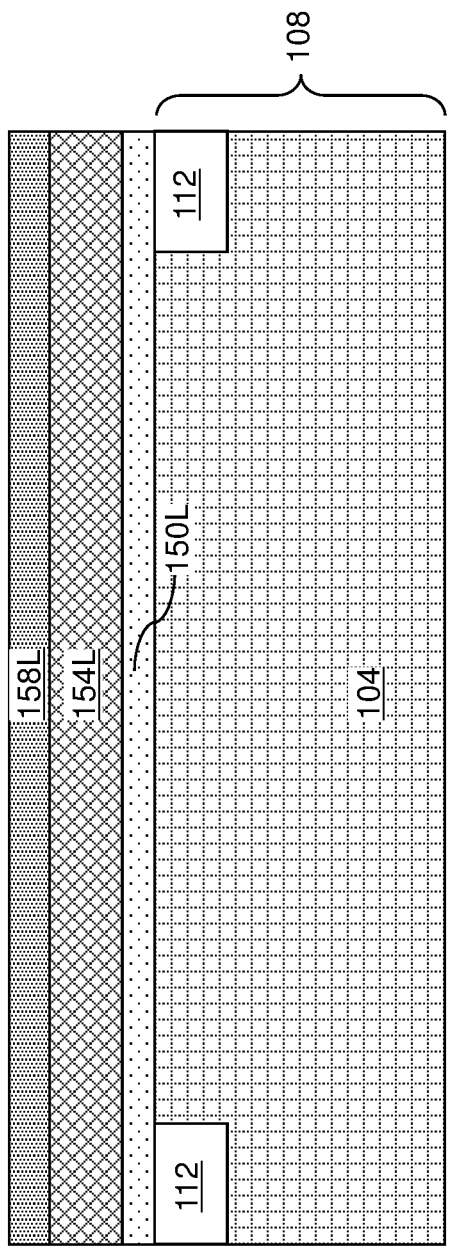

Referring to FIG. 7C, the processing steps of FIG. 1C can be performed to form a gate electrode material layer 154L and a gate cap dielectric layer 158L.

Figure 7D:
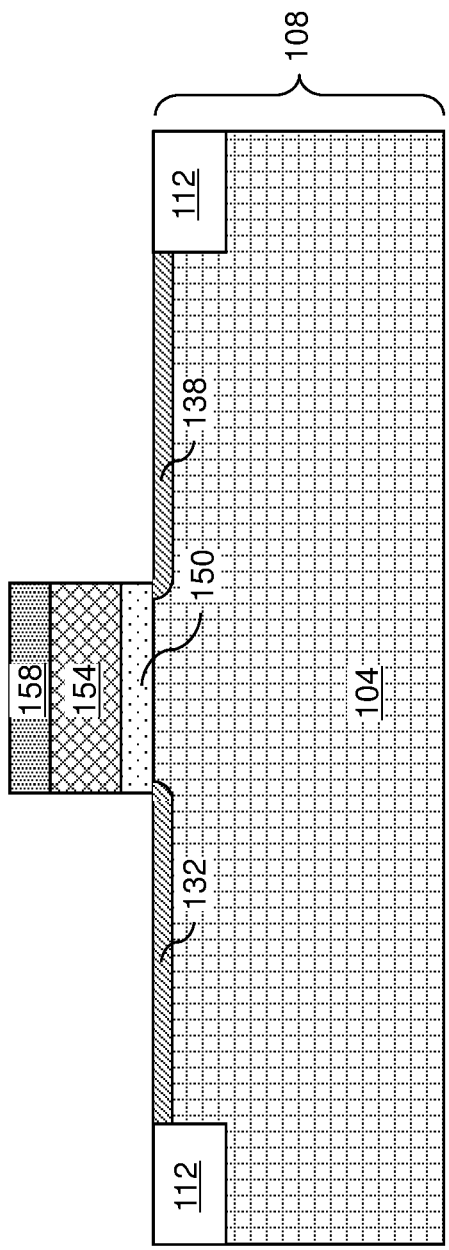

Referring to FIG. 7D, the processing steps of FIG. 1D can be performed to form a gate stack structure (150, 154. 158), a source extension region 132, and a drain extension region 138.

Figure 7E:
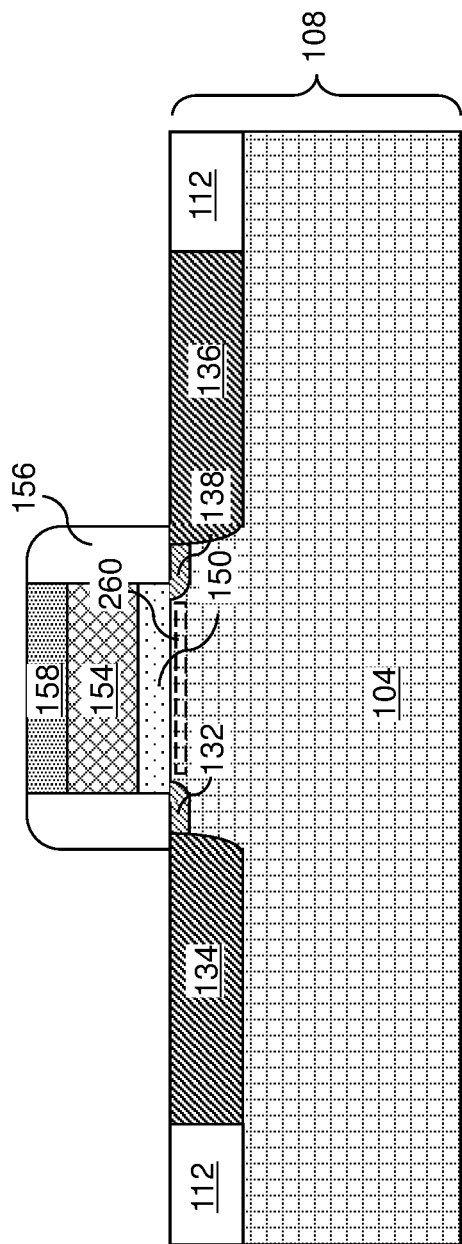

Referring to FIG. 7E, the processing steps of FIG. 1E can be performed to form a dielectric gate spacer 156, a source region 134, and a drain region 136.

Figure 7F:
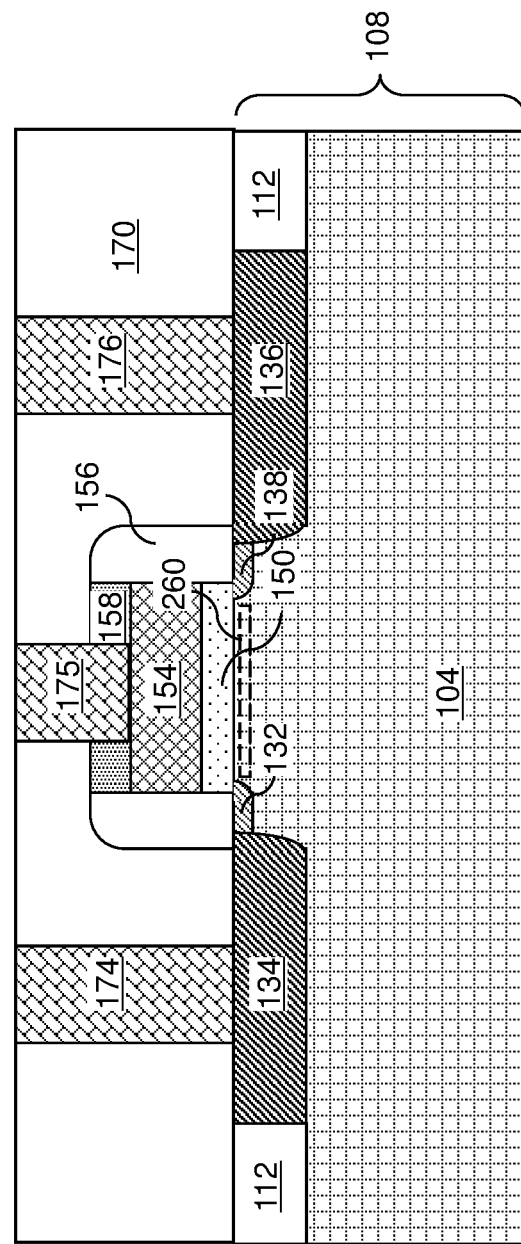

Referring to FIG. 7F, the processing steps of FIG. 1F can be performed to form a contact-level dielectric layer 170 and various contact via structures (174, 176, 175).

Figure 8:
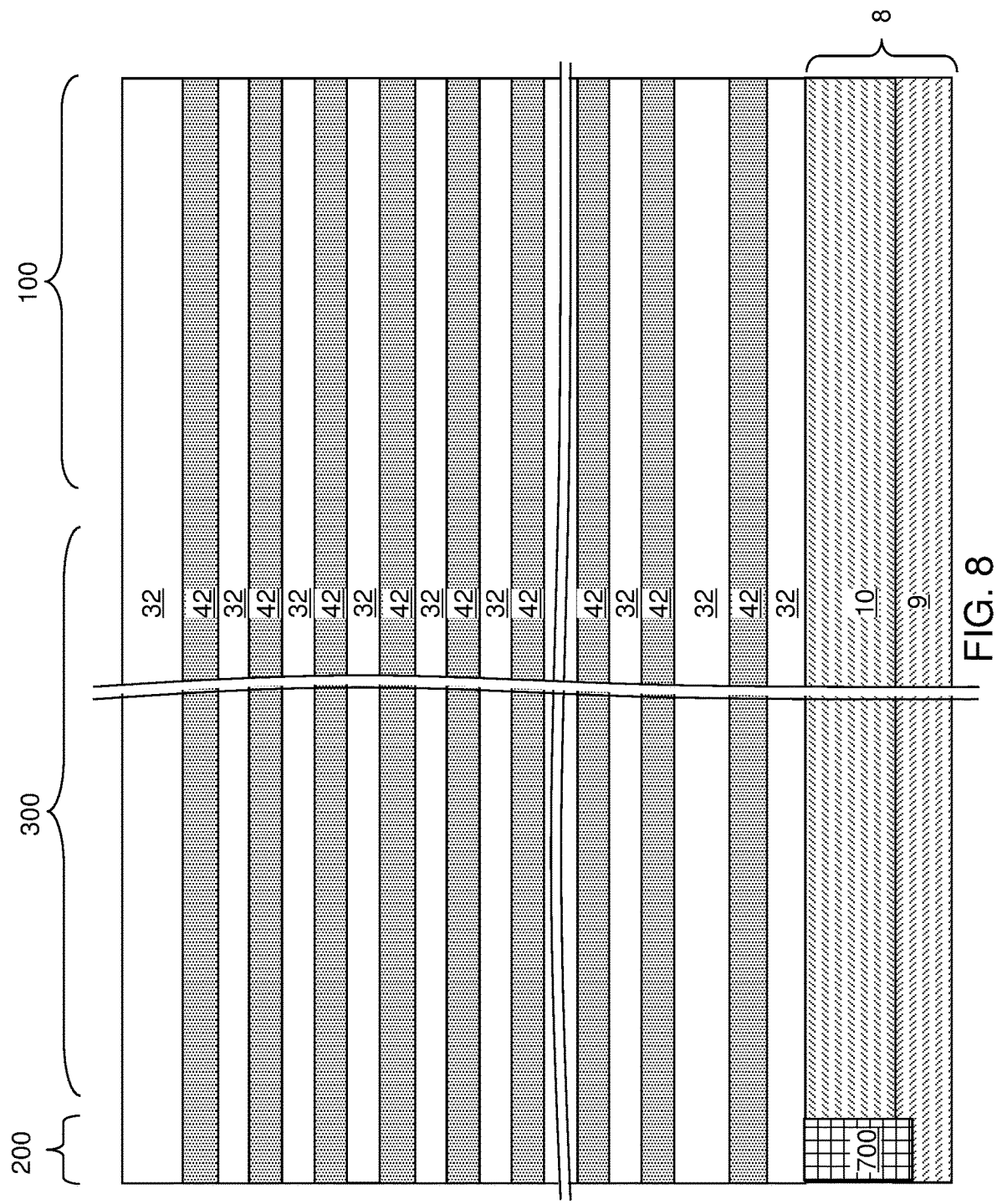
FIG. 8 is a schematic vertical cross-sectional view of an eighth exemplary structure after formation of at least one peripheral device and a vertically alternating sequence of insulating layers and spacer material layers according to an embodiment of the present disclosure.

Referring to FIG. 8, an eighth exemplary structure according to an eighth embodiment of the present disclosure is illustrated, which can be employed, for example, to fabricate a device structure containing vertical ferroelectric NAND memory devices. Vertical ferroelectric field effect transistors may provide benefits over conventional three-dimensional memory devices such as lower power consumption, improved endurance, and faster operations, while maintaining full CMOS compatibility and high-density.

The eighth exemplary structure includes a substrate 8, which can be a semiconductor substrate. The substrate includes at least one substrate semiconductor layer, which can include, for example, a lower substrate semiconductor layer 9 and an upper substrate semiconductor layer 10. The lower substrate semiconductor layer 9 may be a semiconductor wafer or a semiconductor layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface, which can be, for example, a topmost surface of the lower substrate semiconductor layer 9. The major surface can be a semiconductor surface. In one embodiment, the major surface can be a single crystalline semiconductor surface, such as a single crystalline semiconductor surface. The upper substrate semiconductor layer 10 may be, for example, a doped well in a silicon wafer or an epitaxial silicon layer.

At least one semiconductor device 700 for a peripheral circuitry can be formed on a portion of the lower substrate semiconductor layer 9. The at least one semiconductor device can include, for example, field effect transistors. The least one semiconductor device 700 for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer (not illustrated). The upper substrate semiconductor layer 10, if present, can be formed on the top surface of the lower substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the lower substrate semiconductor layer 9. The deposited semiconductor material can be any material that can be employed for the lower substrate semiconductor layer 9 as described above. The single crystalline semiconductor material of the upper substrate semiconductor layer 10 can be in epitaxial alignment with the single crystalline structure of the lower substrate semiconductor layer 9. Portions of the deposited semiconductor material located above the top surface of the planarization dielectric layer can be removed, for example, by chemical mechanical planarization (CMP). In this case, the upper substrate semiconductor layer 10 can have a top surface that is coplanar with the top surface of the planarization dielectric layer 770. In one embodiment, the upper substrate semiconductor layer 10 can have a doping of a first conductivity type.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

A vertically alternating sequence of first material layers (such as insulating layers 32) and second material layers (such as sacrificial material layers 42) is formed over the substrate 8. As used herein, a "vertically alternating sequence" refers to an alternating sequence of multiple instances of a first element and multiple instances of a second element that alternate vertically such that an instance of the second element overlies and/or underlies each instance of the first element, and an instance of the first element overlies and/or underlies each instance of the second element. The vertically alternating sequence can include a stack of an alternating plurality of first material layers (which can be insulating layers 32) and second material layers (which can be sacrificial material layer 42). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. Thus, a vertically alternating sequence of first elements and second elements is an alternating plurality of the first elements and the second elements in which the alternating of the first elements and second elements occurs along the vertical direction. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

In one embodiment, the vertically alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by plasma enhanced chemical vapor deposition (PECVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD) or plasma enhanced atomic layer deposition (PEALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the vertically alternating sequence (32, 42) can have a uniform thickness that is substantially invariant within each respective sacrificial material layer 42. The topmost layer among the insulating layers 32 is herein referred to as a topmost insulating layer 32. The topmost insulating layer 32 can have a greater thickness than each of the insulating layers 32.

Figure 9:
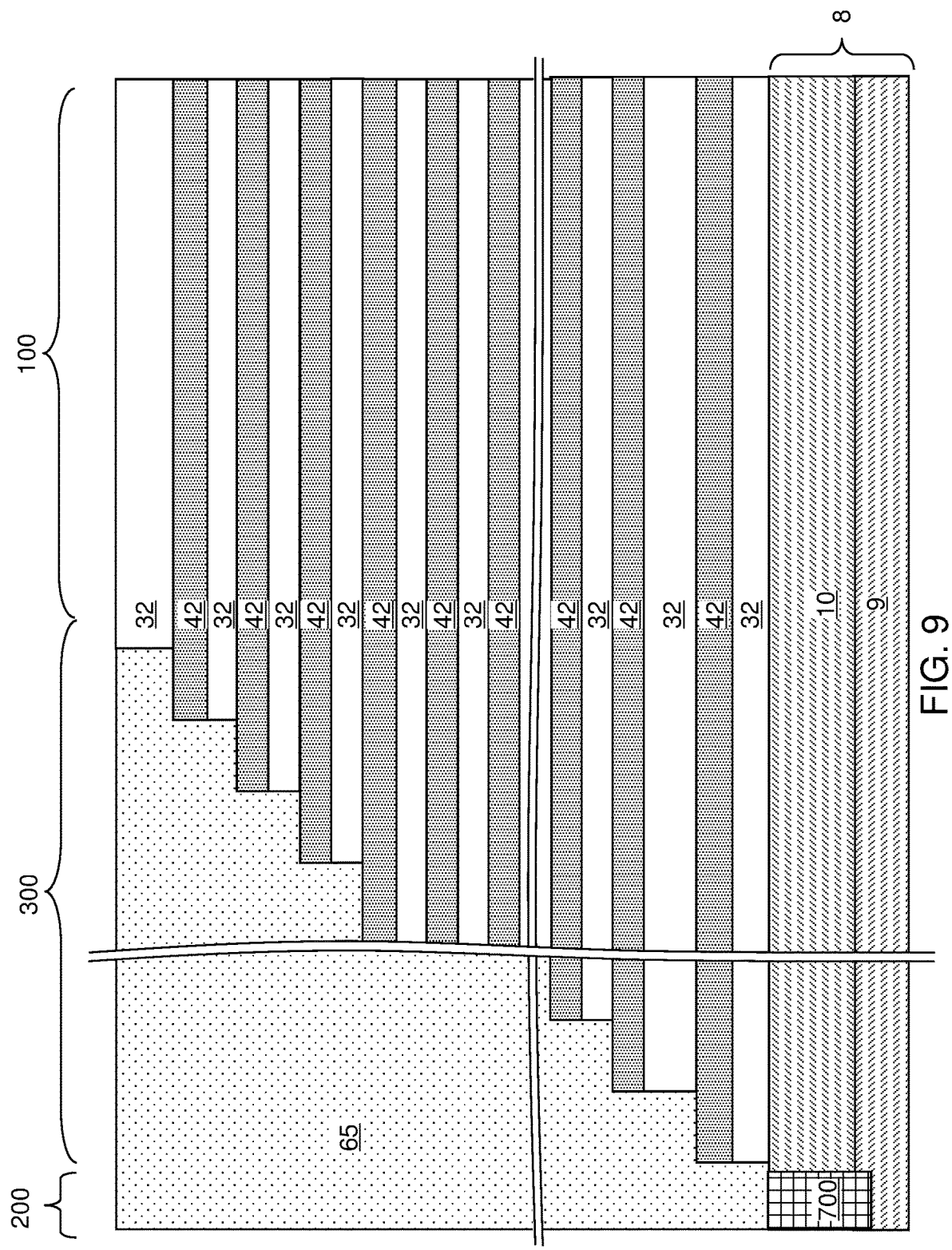
FIG. 9 is a schematic vertical cross-sectional view of the eighth exemplary structure after formation of stepped terraces and a retro-stepped dielectric material portion according to an embodiment of the present disclosure.
Figure 10A:
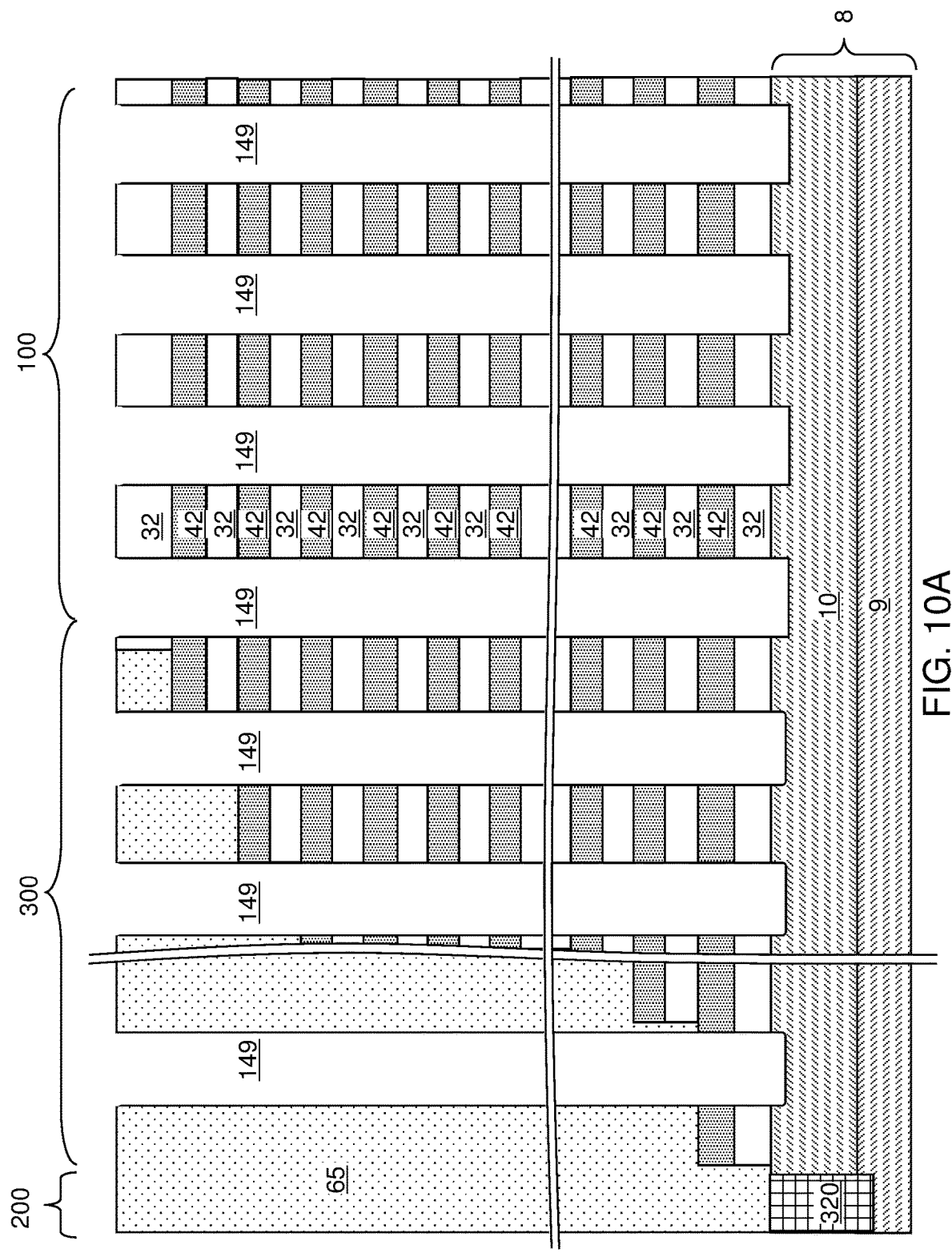
FIG. 10A is a schematic vertical cross-sectional view of the eighth exemplary structure after formation of line trenches according to an embodiment of the present disclosure.
Figure 10B:
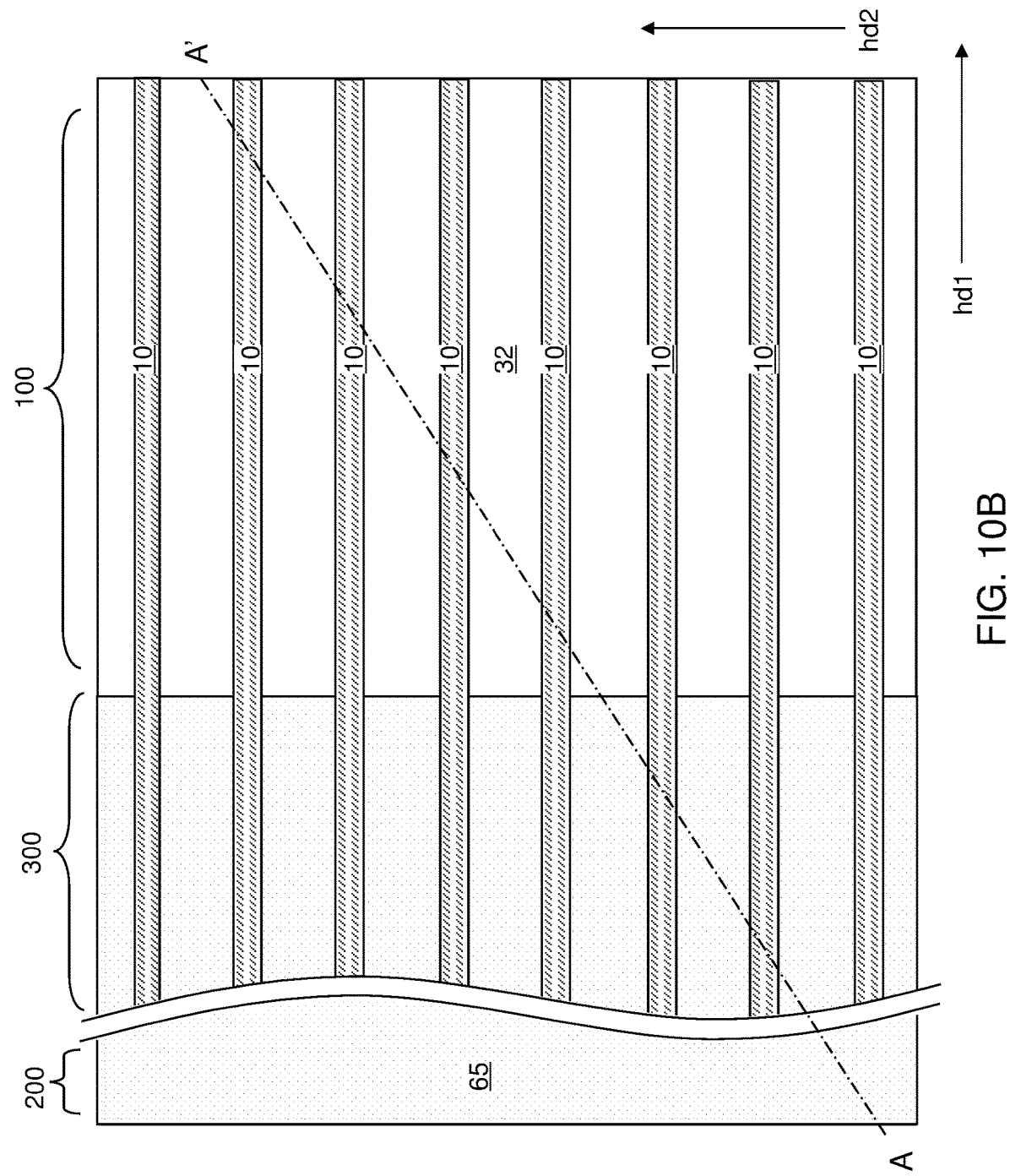
FIG. 10B is a top-down view of the eighth exemplary structure of FIG. 10A. The vertical plane A-A' is the plane of the cross-section for FIG. 10A.
Figure 17A:
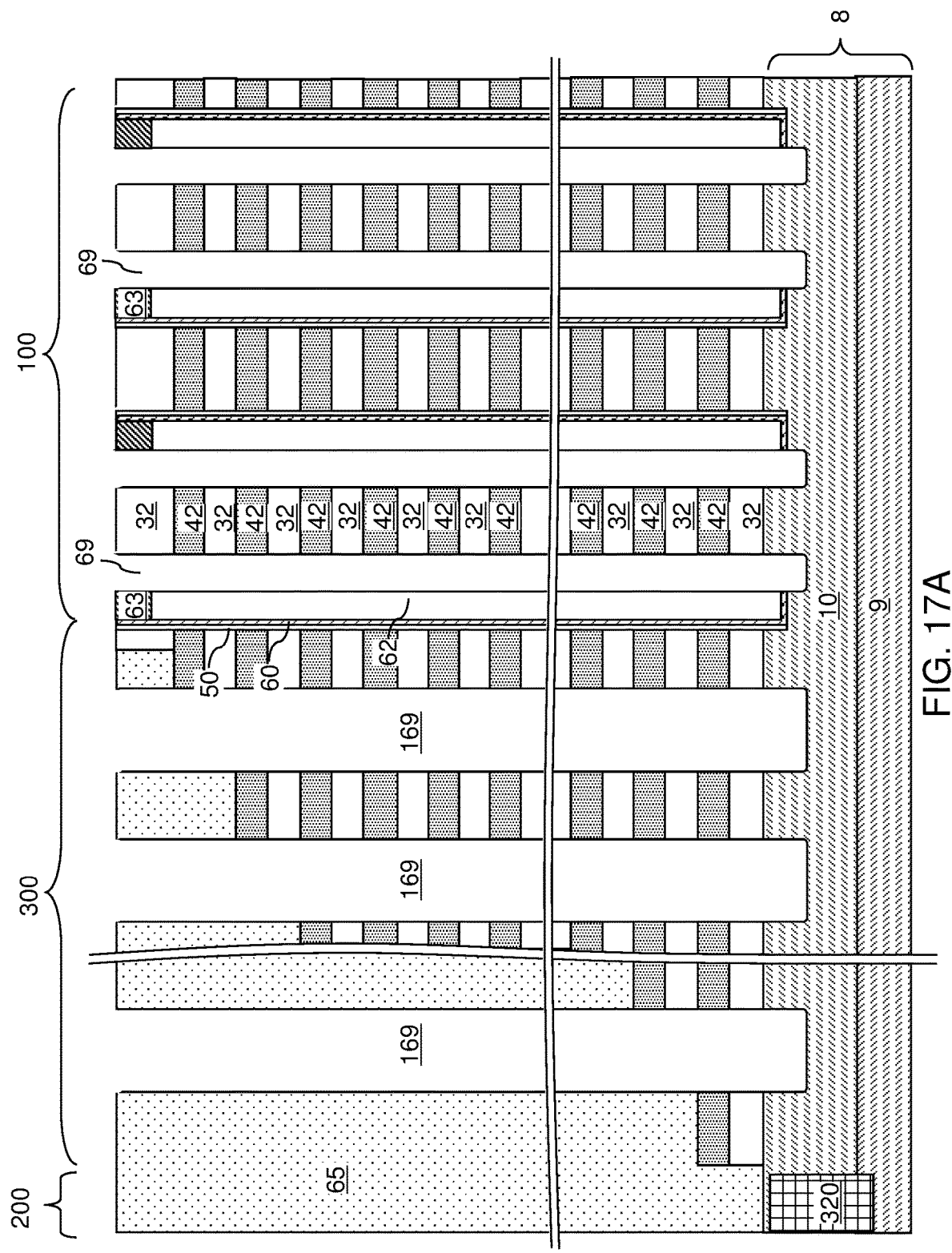
FIG. 17A is a vertical cross-sectional view of the eighth exemplary structure after formation of pillar cavities according to an embodiment of the present disclosure.
Figure 17B:
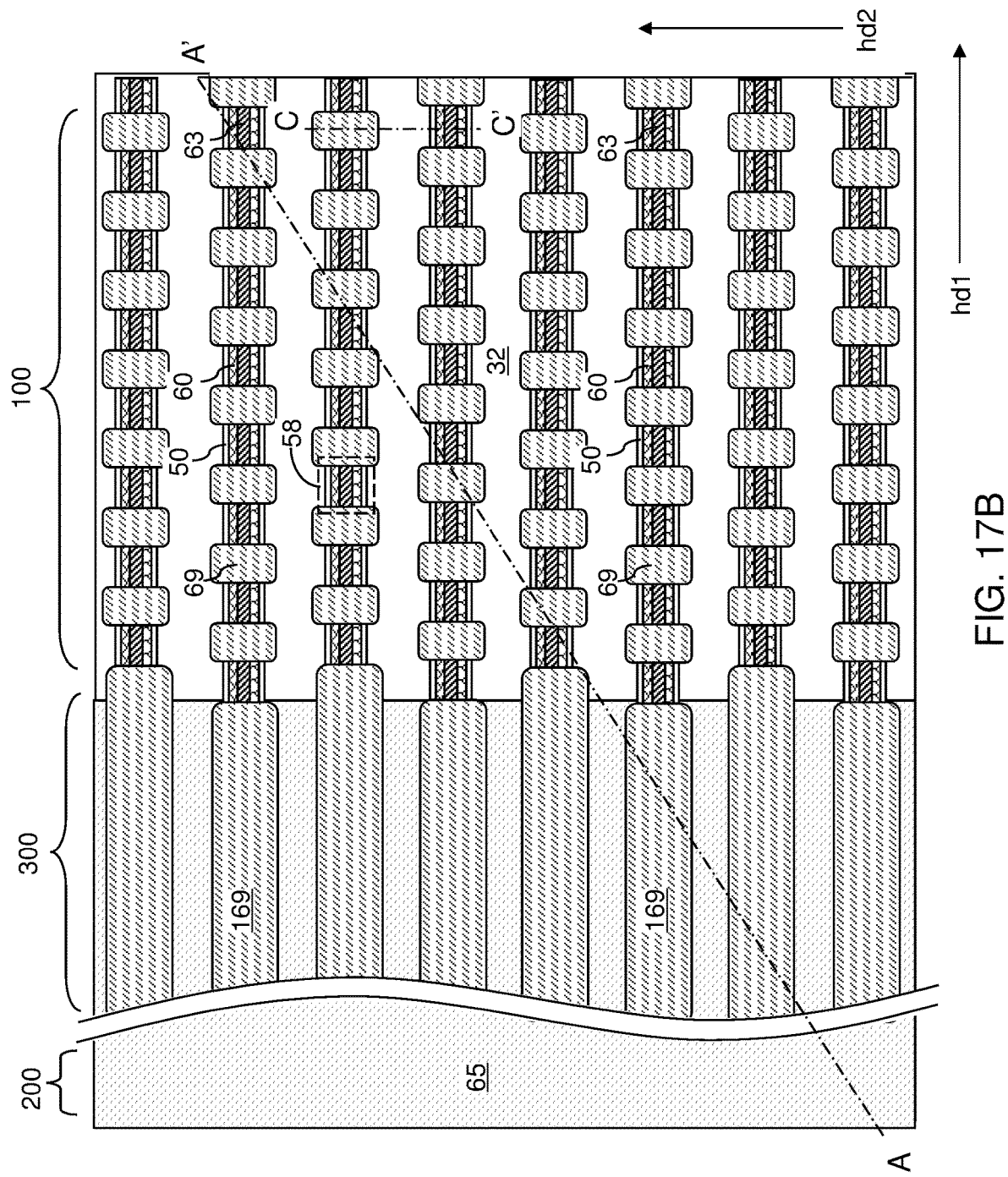
FIG. 17B is a top-down view of the eighth exemplary structure of FIG. 17A. The vertical plane A-A' is the plane of the cross-section for FIG. 17A.
Figure 17C:
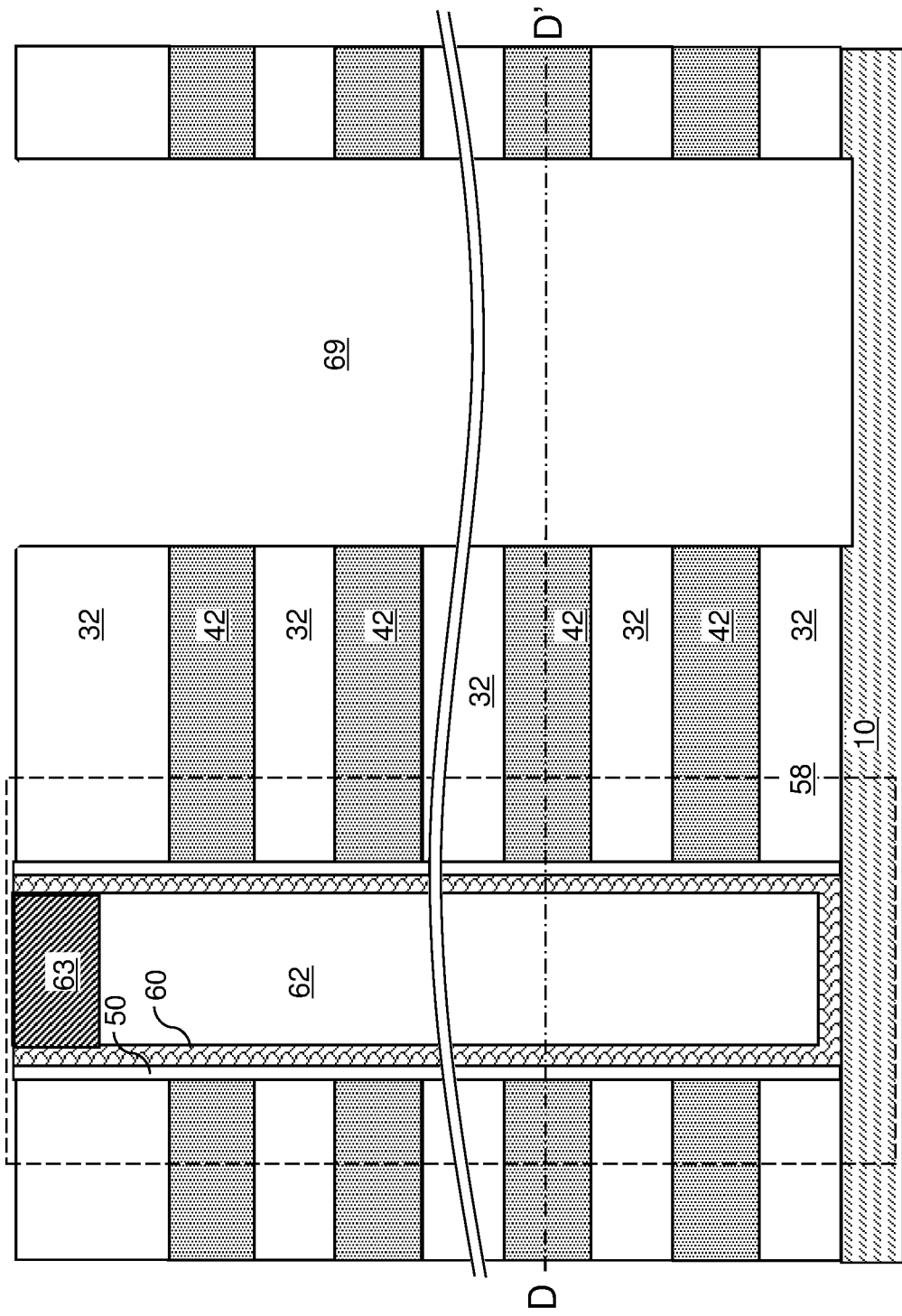
FIG. 17C is a vertical cross-sectional view of a portion of the eighth exemplary structure along the vertical plane C-C' of FIG. 17B.
Figure 17D:
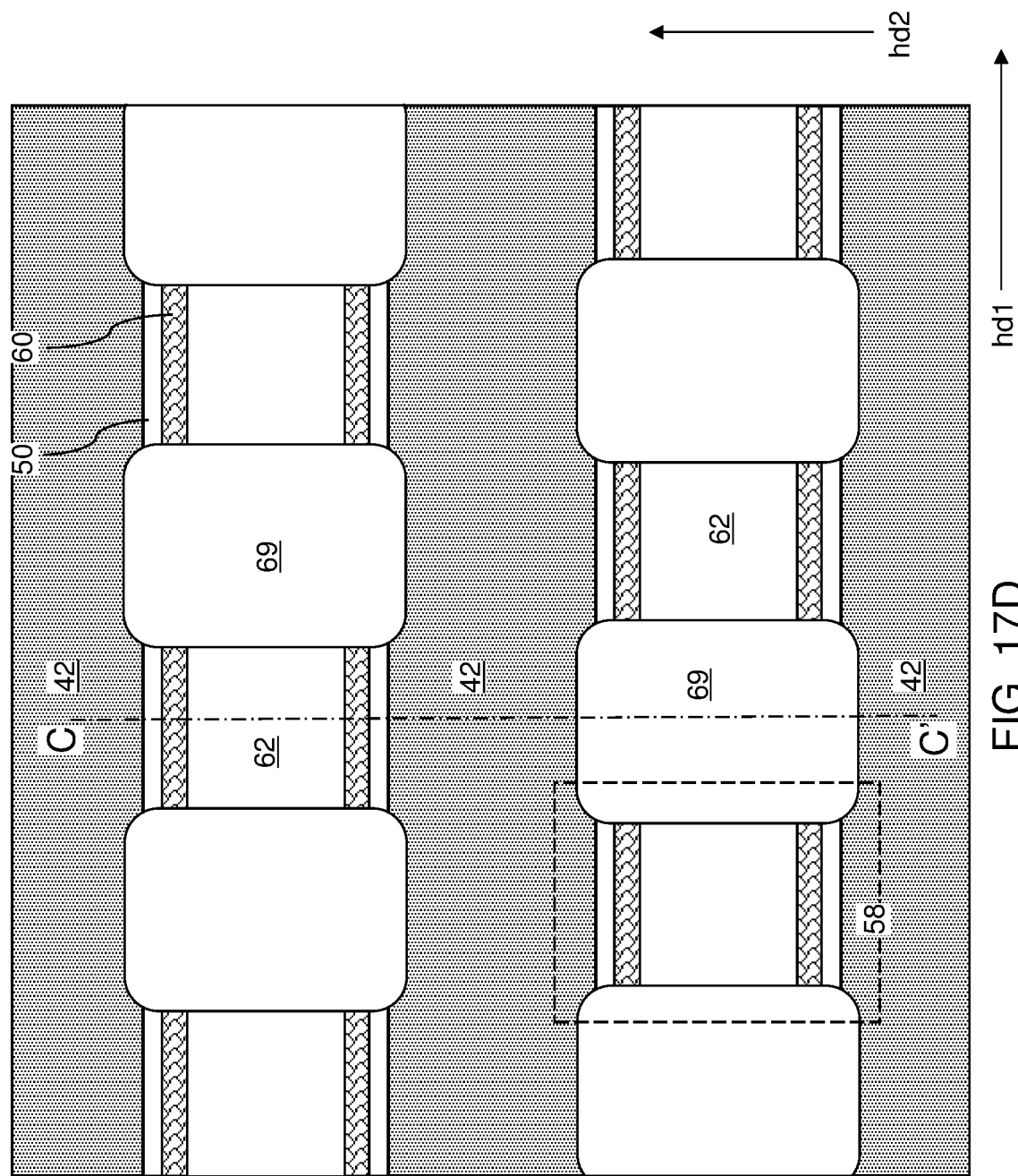
FIG. 17D is a horizontal cross-sectional view of along the plane D-D' of 13C. The vertical plane C-C' is the plane of the cross-section for FIG. 17C.

Referring to FIG. 9, the vertically alternating sequence of the insulating layers 32 and the sacrificial material layers 42 can be patterned to form stepped surfaces that continuously extend from a bottommost layer of the vertically alternating sequence (32, 42) to a topmost layer of the alternating sequence (32, 42) in the staircase region 300. A stepped cavity can be formed within the staircase region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32, 42). Each sacrificial material layer 42 other than a topmost sacrificial material layer 42 within the vertically alternating sequence (32, 42) laterally extends farther than any overlying sacrificial material layer 42 within the vertically alternating sequence (32, 42). The terrace region includes stepped surfaces of the vertically alternating sequence (32, 42) that continuously extend from a bottommost layer within the vertically alternating sequence (32, 42) to a topmost layer within the vertically alternating sequence (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 10A, 10B, 11A, and 11B, a lithographic material stack (not shown) including at least a photoresist layer can be formed over the topmost insulating layer 32 and the retro-stepped dielectric material portion 65, and can be lithographically patterned to form line-shaped openings therein. The line-shaped openings laterally extend along a first horizontal direction hd1, and have a uniform width along a second horizontal direction hd2 that is perpendicular to the first horizontal direction hd1. The pattern in the lithographic material stack can be transferred through the topmost insulating layer 32 or the retro-stepped dielectric material portion 65, and through the vertically alternating sequence (32, 42) by at least one anisotropic etch that employs the patterned lithographic material stack as an etch mask. Portions of the vertically alternating sequence (32, 42) underlying the line-shaped openings in the patterned lithographic material stack are etched to form cavities, which are herein referred to as line trenches 149. As used herein, a "line trench" refers to a trench that has laterally extends straight along a horizontal direction.

The line trenches 149 laterally extend along the first horizontal direction hd1 through the vertically alternating sequence (32, 42). In one embodiment, the line trenches 149 have a respective uniform width that is invariant under translation along the first horizontal direction hd1. In one embodiment, the line trenches 149 can have the same width throughout, and the spacing between neighboring pairs of the line trenches 149 can be the same. In this case, the line trenches 149 can constitute a one-dimensional periodic array of line trenches 149 having a pitch along a second horizontal direction hd2 that is perpendicular to the first horizontal direction hd1. The width of the line trenches 149 along the second horizontal direction hd2 can be in a range from 30 nm to 500 nm, such as from 60 nm to 250 nm, although lesser and greater widths can also be employed.

The line trenches 149 extend through each layer of the vertically alternating sequence (32, 42) and the retro-stepped dielectric material portion 65. The chemistry of the anisotropic etch process employed to etch through the materials of the vertically alternating sequence (32, 42) can alternate to optimize etching of the first and second materials in the vertically alternating sequence (32, 42). The anisotropic etch can be, for example, a series of reactive ion etches. The sidewalls of the line trenches 149 can be substantially vertical, or can be tapered. The patterned lithographic material stack can be subsequently removed, for example, by ashing.

The line trenches 149 laterally extend through the entire memory array region 100, and laterally extend into the staircase region 300. The line trenches 149 may laterally extend through the entire staircase region 300 along the first horizontal direction hd1, or may laterally extend only through part of a width, but not the entire width along the first horizontal direction hd1, of the staircase region 300. In one embodiment, an over-etch into the upper substrate semiconductor layer 10 may be optionally performed after the top surface of the upper substrate semiconductor layer 10 is physically exposed at a bottom of each line trench 149. The overetch may be performed prior to, or after, removal of the lithographic material stack. In other words, the recessed surfaces of the upper substrate semiconductor layer 10 may be vertically offset from the un-recessed top surfaces of the upper substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the line trenches 149 can be coplanar with the topmost surface of the upper substrate semiconductor layer 10. Optionally, an etch stop layer may be employed (not shown) between the alternating stack (32, 42) and the substrate 8.

Each of the line trenches 149 may include a sidewall (or a plurality of sidewalls) that extends substantially perpendicular to the topmost surface of the substrate. The lower substrate semiconductor layer 9 and the upper substrate semiconductor layer 10 collectively constitute a substrate 8, which can be a semiconductor substrate. Alternatively, the upper substrate semiconductor layer 10 may be omitted, and the line trenches 149 can be extend to a top surface of the lower substrate semiconductor layer 9.

The line trenches 149 divide the vertically alternating sequence (32, 42) of insulating layers 32 and sacrificial material layers 42 into multiple alternating stacks of insulating layers 32 and sacrificial material layers 42. The topmost insulating layer 32 can be divided into topmost insulating layers 32. Each insulating layer 32 is a patterned portion of a respective insulating layer 32, and each sacrificial material layer 42 is a patterned portion of a respective sacrificial material layer 42. Each insulating layer 32 and each sacrificial material layer 42 laterally extend along the first horizontal direction hd1, and can have a uniform thickness along the second horizontal direction hd2. Alternating stacks (32, 42) of insulating layers 32 and sacrificial material layers 42 can be formed over the substrate 8. The alternating stacks (32, 42) can be laterally spaced apart from each other by line trenches 149 that laterally extend along the first horizontal direction hd1 and are spaced apart from each other along the second horizontal direction hd2.

In one embodiment, the line trenches 149 can laterally extend from an interface between the illustrated retro-stepped dielectric material portion 65 and the substrate 8 to an interface between another retro-stepped dielectric material portion (not illustrated) and the substrate 8 located on an opposite side of the illustrated retro-stepped dielectric material portion 65. In this case, each alternating stack (32, 42) of insulating layers 32 and sacrificial material layers 42 is not connected to any neighboring alternating stack (32, 42). Alternatively, the line trenches 149 may laterally extend partly through the stepped surfaces of the vertically alternating sequence (32, 42) of insulating layers 32 and sacrificial material layers 42. In this case, insulating layers 32 and/or sacrificial material layers 42 located at upper levels can be disconnected from each other.

Referring to FIGS. 12A and 12B, a continuous ferroelectric gate dielectric layer 40L can be formed by conformal deposition of a ferroelectric gate dielectric material. In one embodiment, the continuous ferroelectric gate dielectric layer 40L can be formed by an atomic layer deposition (ALD) process or a chemical vapor deposition (CVD) process. The continuous ferroelectric gate dielectric layer 40L can be polycrystalline.

Generally, the continuous ferroelectric gate dielectric layer 40L includes a ferroelectric material having two stable directions for electrical polarization. For example, the ferroelectric material of the continuous ferroelectric gate dielectric layer 40L may include at least one material selected from hafnium oxide, zirconium oxide, hafnium-zirconium oxide, barium titanate (such as $BaTiO_3$; BT), colemanite (such as $Ca_2B_6O_{11} \cdot 5H_2O$), bismuth titanate (such as $Bi_{12}TiO_{20}$, $Bi_4Ti_3O_{12}$ or $Bi_2Ti_2O_7$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti)O_3$; PZT), lithium niobate (such as $LiNbO_3$; LN), ($LaAlO_3$)), polyvinylidene fluoride $(CH_2CF_2)_n$, potassium niobate (such as $KNbO_3$), potassium sodium tartrate (such as $KNaC_4H_4O_6 \cdot 4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$ (LT)), lead lanthanum titanate (such as $(Pb,La)TiO_3$ (PLT)), lead lanthanum zirconate titanate (such as $(Pb,La)(Zr,Ti)O_3$ (PLZT)), ammonium dihydrogen phosphate (such as $NH_4H_2PO_4$ (ADP)), or potassium dihydrogen phosphate (such as $KH_2PO_4$ (KDP)). In one embodiment, the ferroelectric dielectric material can include a polar phase hafnium oxide, such as orthorhombic phase hafnium oxide, and preferably including at least one dopant selected from Al, Zr, Y, Gd, La, Sr, or Si. The thickness of the continuous ferroelectric gate dielectric layer 40L can be in a range from 2 nm to 50 nm, such as from 4 nm to 30 nm, although lesser and greater thicknesses can also be employed.

Referring to FIGS. 13A and 13B, the non-polar metallic element described above can be implanted or otherwise introduced into the continuous ferroelectric gate dielectric layer 40L. If ion implantation is used, then angled ion implantation may be performed, in which the tilt angle of the ion beam from the vertical direction is non-zero. For example, a tilt angle in a range from 0.2 degree to 5 degrees, such as from 0.5 degrees to 3 degrees, may be employed. For example, the continuous ferroelectric gate dielectric layer 40L can include any of the ferroelectric dielectric materials that may be employed for a continuous ferroelectric gate dielectric layer 240L described above, the non-polar metallic element may be any metallic element does not form a ferroelectric oxygen-containing compound. In one embodiment, the non-polar metallic element may include one or more elements selected from Mg, Ga, In, Sc, Y, rate earth elements, Ti, Zr or Hf. The continuous ferroelectric gate dielectric layer that includes the non-polar metallic element is herein referred to as a defect containing ferroelectric gate dielectric layer 50L. According to an aspect of the present disclosure, the defect containing ferroelectric gate dielectric layer 50L includes the non-polar metallic element at an atomic percentage in a range from 0.01% to 10%, such as from 0.05% to 3% and/or from 0.1% to 1.0%. The non-polar metallic element is introduced in a sufficient quantity to form nanoclusters in the defect containing ferroelectric gate dielectric layer 50L. The nanoclusters of the non-polar metallic element may have a diameter of 1 nm to 5 nm. The nanoclusters generate defects (e.g., lattice and/or grain boundary defects) in the defect containing ferroelectric gate dielectric layer 150L which increase the coercive field.

In one embodiment, incorporation of the non-polar metallic element into the defect containing ferroelectric gate dielectric layer 50L induces formation of pinned grain boundaries within the defect containing ferroelectric gate dielectric layer 50L, and reduces the average grain size within the defect containing ferroelectric gate dielectric layer 50L. Pinned grain boundaries are structurally stable grain boundaries that do not move upon anneal.

In one embodiment, the defect containing ferroelectric gate dielectric layer 50L may be polycrystalline and may include pinned grain boundaries. In one embodiment, the defect containing ferroelectric gate dielectric layer 50L may be annealed after incorporating the non-polar metallic element into the defect containing ferroelectric gate dielectric layer 50L. Atoms of the non-polar metallic element can be present at the pinned grain boundaries at a higher atomic concentration than within grains of the defect containing ferroelectric gate dielectric layer 50L. In one embodiment, the non-polar metallic element comprises an element selected from Mg, Ga, In, Sc, Y, rate earth elements, Ti, Zr or Hf.

In one alternative embodiment, the defect containing ferroelectric gate dielectric layer 50L is formed by ion bombardment of the continuous ferroelectric gate dielectric layer 240L instead of by introducing the non-polar metallic element into the continuous ferroelectric gate dielectric layer 40L. The ion bombardment may include bombarding the continuous ferroelectric gate dielectric layer 40L with inert gas ions, such as helium or argon ions, after depositing the continuous ferroelectric gate dielectric layer 40L to generate bombardment induced defects therein and to convert it into the defect containing ferroelectric gate dielectric layer 50L. The ion bombardment may comprise tilted ion bombardment.

In another alternative embodiment, the ion bombardment may take place during the deposition of the ferroelectric gate dielectric layer to generate defects therein. In this embodiment, the initially deposited ferroelectric gate dielectric layer comprises the defect containing ferroelectric gate dielectric layer 50L. Thus, the formation of then continuous ferroelectric gate dielectric layer 40L may be omitted. The ion bombardment may take place in the deposition chamber after the entire ferroelectric gate dielectric layer is deposited. Alternatively, after a portion of the ferroelectric gate dielectric layer is deposited, the ion bombardment is performed to generate defects in the deposited portion of the ferroelectric gate dielectric layer, followed by depositing an additional portion of the ferroelectric gate dielectric layer. Additional ion bombardment step(s) and/or additional ferroelectric gate dielectric layer portion deposition steps may optionally be performed.

Referring to FIGS. 14A and 14B, an anisotropic etch process can be performed to remove horizontal portions of the defect containing ferroelectric gate dielectric layer 50L. Optionally, a sacrificial cover material layer (not illustrated) such as a thin silicon oxide layer may be deposited prior to the anisotropic etch process to protect vertically-extending portions of the defect containing ferroelectric gate dielectric layer 50L, and may be removed after the anisotropic etch process. The defect containing ferroelectric gate dielectric layer 50L can be divided int a plurality of continuous ferroelectric gate dielectric layers 50L. Each defect containing ferroelectric gate dielectric layer 50L can be located within a respective one of the line trenches 149.

Referring to FIGS. 15A and 15B, a semiconductor channel material layer 60L can be deposited over the ferroelectric gate dielectric layer 50L by a conformal deposition process. The semiconductor channel material layer 60L can extend through the openings in the ferroelectric gate dielectric layer 50L, and can directly contact physically exposed top surfaces of the upper substrate semiconductor layer 10. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art, such as a wide band gap oxide semiconductor material. In one embodiment, the semiconductor channel material layer 60L includes amorphous silicon or polysilicon. In another embodiment, the semiconductor channel material layer 60L includes wide band gap oxide semiconductor material, such as zinc oxide, strontium titanate, titanium oxide, etc. The semiconductor channel material layer 60L can be formed by a conformal deposition method such as low pressure chemical vapor deposition (LPCVD). In one embodiment, the semiconductor channel material layer 60L can be formed by conformally depositing a conformal polycrystalline semiconductor layer over the ferroelectric gate dielectric layer 50L. The thickness of the semiconductor channel material layer 60L can be in a range from 2 nm to 20 nm, such as from 3 nm to 10 nm, although lesser and greater thicknesses can also be employed. In one embodiment, the semiconductor channel material layer 60L can have a doping of the first conductivity type, which is the same conductivity type as the conductivity type of the doping of the upper substrate semiconductor layer 10. In one embodiment, the semiconductor channel material layer 60L can comprise a semiconducting material including electrical dopants at an atomic concentration in a range from $1 \times 10^{14}/cm^3$ to $1 \times 10^{18}/cm^3$.

A continuous dielectric fill material layer 62L including a dielectric fill material such as silicate glass can be deposited in remaining volumes of the line trenches 149 by a conformal deposition process (such as low pressure chemical vapor deposition) or a self-planarizing deposition process (such as spin coating). The continuous dielectric fill material layer 62L fills the remaining volumes of the line trenches 149, and is deposited over horizontal portions of the semiconductor channel material layer 60L that overlie the topmost insulating layers 32.

Referring to FIGS. 16A and 16B, the continuous dielectric fill material layer 62L can be vertically recessed to form dielectric core rails 62R. Each dielectric core rail 62R is a patterned remaining portion of the continuous dielectric fill material layer 62L, and can have a top surface below the horizontal plane including the top surface of the topmost insulating layers 32. As used herein, a "rail" or a "rail structure" refers to an elongated structure that laterally extends along a horizontal direction (which is a "lengthwise" direction). Generally, each dielectric core rail 62R can be formed by deposition and vertical recessing of a dielectric fill material in the line trenches 149.

A drain material layer can be formed by depositing a doped semiconductor material having a doping of a second conductivity type. The second conductivity type is the opposite of the first conductivity type. For example, if the first conductivity type is p-type, the second conductivity type is n-type, and vice versa. The drain material layer includes dopants of the second conductivity type at an atomic concentration in a range from $5 \times 10^{19}/cm^3$ to $2 \times 10^{21}/cm^3$, although lesser and greater dopant concentrations can also be employed.

Portions of the drain material layer, the semiconductor channel material layer 60L, and the ferroelectric gate dielectric layer 50L that are located above the horizontal plane including the top surface of the topmost insulating layers 32 can be removed by a planarization process such as a chemical mechanical planarization (CMP) process. Each contiguous set of material portions that fills a line trench 149 comprises a line trench fill structure (50L, 60L, 62R, 63R). Each line trench fill structure (50L, 60L, 62R, 63R) includes a ferroelectric gate dielectric layer 50L, a semiconductor channel material layer 60L, a dielectric core rail 62R, and a drain material rail 63R which is a patterned remaining portion of the drain material layer 63L after the planarization process. A laterally alternating sequence of alternating stacks (32, 42) and line trench fill structures (50L, 60L, 62R, 63R) is formed. The alternating stacks (32, 42) (each of which is a vertically-alternating stack) and the line trench fill structures (50L, 60L, 62R, 63R) can laterally alternate along the second horizontal direction hd2.

Referring to FIGS. 17A-17D, a two-dimensional array of pillar cavities 69 and elongated isolation cavities 169 can be formed through the line trench fill structures (50L, 60L, 62R, 63R). The pillar cavities 69 are formed in the memory array region 100, and the elongated isolation cavities 169 can be formed in the staircase region 300. For example, a photoresist layer (not shown) can be applied over the eighth exemplary structure, and can be lithographically patterned to form rows of openings that overlie the line trench fill structures (50L, 60L, 62R, 63R). Further, elongated openings can be formed in the portion of the photoresist layer located in the staircase region 300. The elongated openings overlie portions of the line trench fill structures (50L, 60L, 62R, 63R) in the staircase region 300, and/or are formed within areas corresponding to extensions of the line trench fill structures (50L, 60L, 62R, 63R) into the staircase region 300 along the first horizontal direction hd1 (in case the line trench fill structures (50L, 60L, 62R, 63R) do not fully extend through the staircase region 300).

An anisotropic etch is performed employing the patterned photoresist layer as an etch mask. Unmasked portions of the line trench fill structures (50L, 60L, 62R, 63R), the alternating stacks (32, 42), and the retro-stepped dielectric material portion 65 are etched through by the anisotropic etch process. The anisotropic etch process can be a reactive ion etch process that indiscriminately etches the materials of the line trench fill structures (50L, 60L, 62R, 63R), the alternating stacks (32, 42), and the retro-stepped dielectric material portion 65. End point detection can be effected by sensing of physical exposure of the surfaces of the upper substrate semiconductor layer 10. The pillar cavities 69 are formed in the memory array region 100 underneath a respective opening in the photoresist layer, and the elongated isolation cavities 169 can be formed in the staircase region 300 underneath a respective opening in the photoresist layer.

The two-dimensional array of pillar cavities 69 can include rows of pillar cavities 69. Each row of pillar cavities 69 can overlap with the area of respective one of the line trench fill structures (50L, 60L, 62R, 63R). The pillar cavities 69 can have substantially vertical sidewalls, and laterally divide each line trench fill structure (50L, 60L, 62R, 63R) into memory stack assemblies 58. In one embodiment, the pillar cavities 69 can be formed as a two-dimensional array of pillar cavities 69 extending through the line trench fill structures (50L, 60L, 62R, 63R). Each of the pillar cavities 69 extends to the substrate 8, and sidewalls of remaining portions of the insulating layers 32 and the sacrificial material layers 42 are physically exposed around the pillar cavities 69. Elongated isolation cavities 169 laterally extending along the first horizontal direction hd1 can be formed in the staircase region 300 in areas that correspond to extensions of the line trench fill structures (50L, 60L, 62R, 63R). The widths of the pillar cavities 69 and the elongated isolation cavities 169 can be greater than the maximum width of the line trenches 149 to ensure that each component within a line trench fill structure (50L, 60L, 62R, 63R) is laterally divided by the pillar cavities 69 and the elongated isolation cavities 169.

A two-dimensional array of memory stack assemblies 58 is formed. Each memory stack assembly 58 is a patterned portion of a line trench fill structure (50L, 60L, 62R, 63R). Each memory stack assembly 58 includes a vertical semiconductor channel 60, at least one ferroelectric gate dielectric layer 50 (e.g., two ferroelectric gate dielectric layers 50), and a dielectric core 62 that is a patterned portion of the dielectric core rail 62R. The vertical semiconductor channel 60 comprises a patterned portion of a semiconductor channel material layer 60L within a respective line trench 149. The two ferroelectric gate dielectric layers 50 comprise patterned portions of a ferroelectric gate dielectric layer 50L within the respective line trench 149. The two-dimensional array of memory stack assemblies 58 is formed in the line trenches 149, and is interlaced with a two-dimensional array of pillar cavities 69.

Figure 18A:
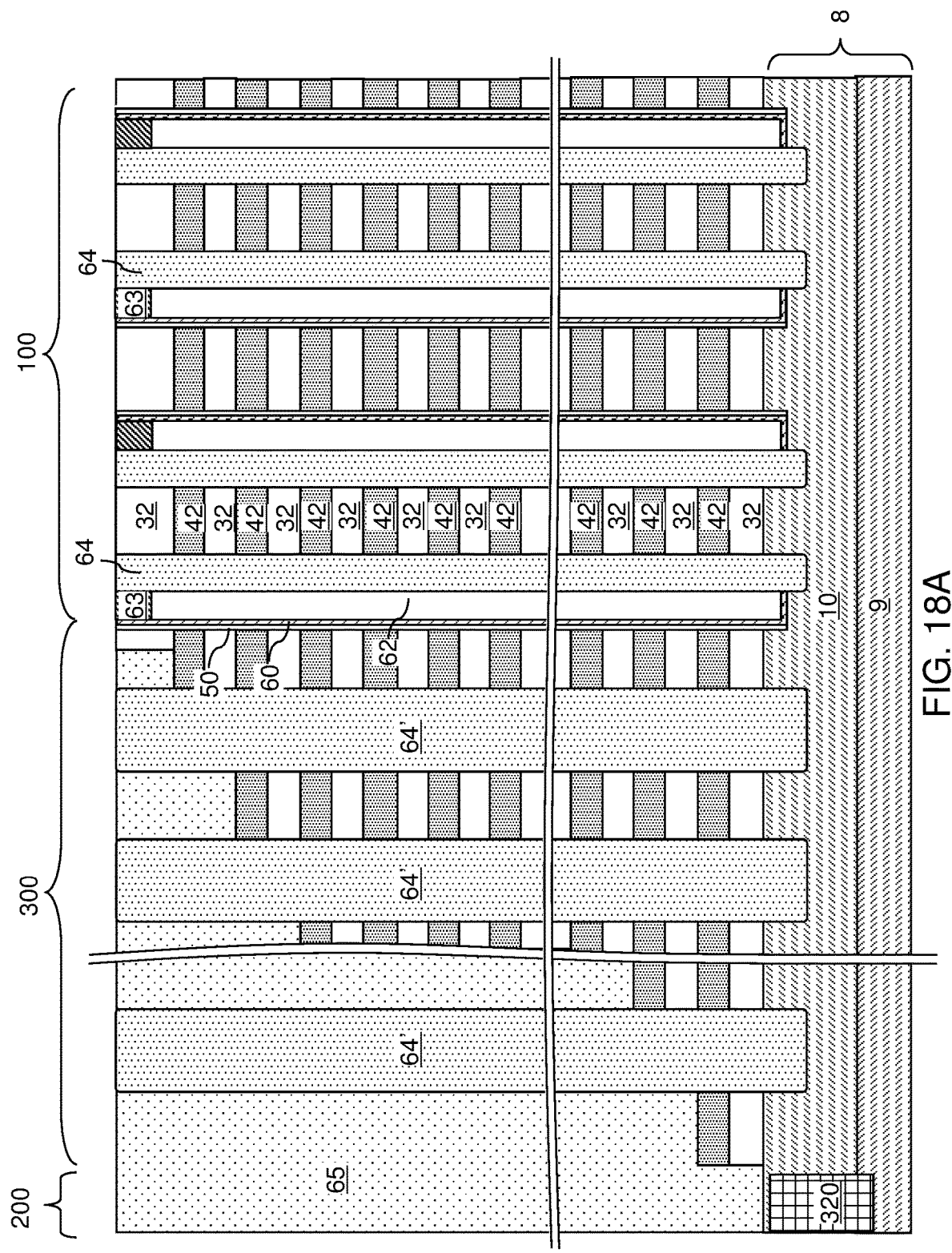
FIG. 18A is a vertical cross-sectional view of the eighth exemplary structure after formation of dielectric pillar structures according to an embodiment of the present disclosure.
Figure 18B:
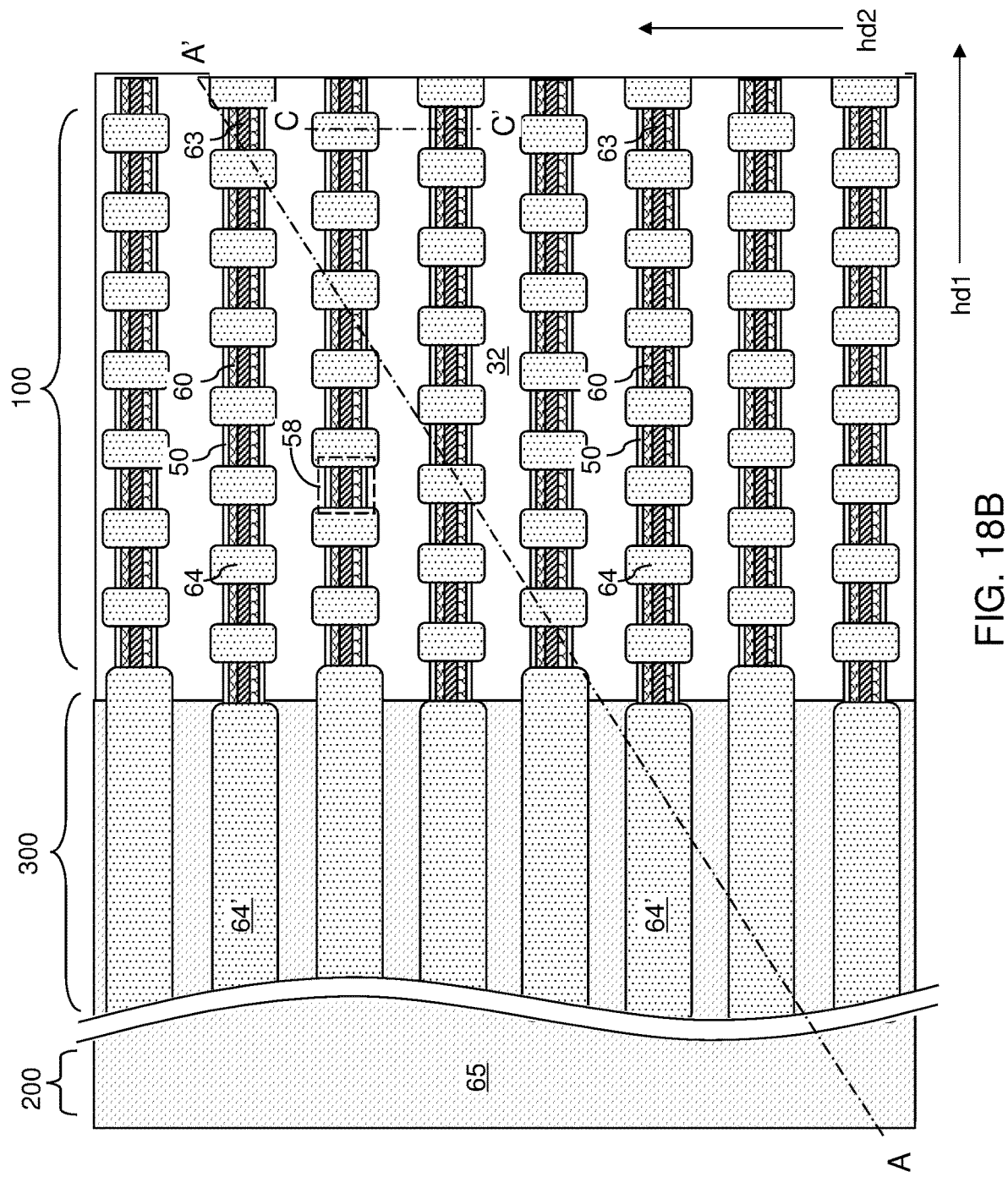
FIG. 18B is a top-down view of the eighth exemplary structure of FIG. 18A. The vertical plane A-A' is the plane of the cross-section for FIG. 18A.
Figure 18C:
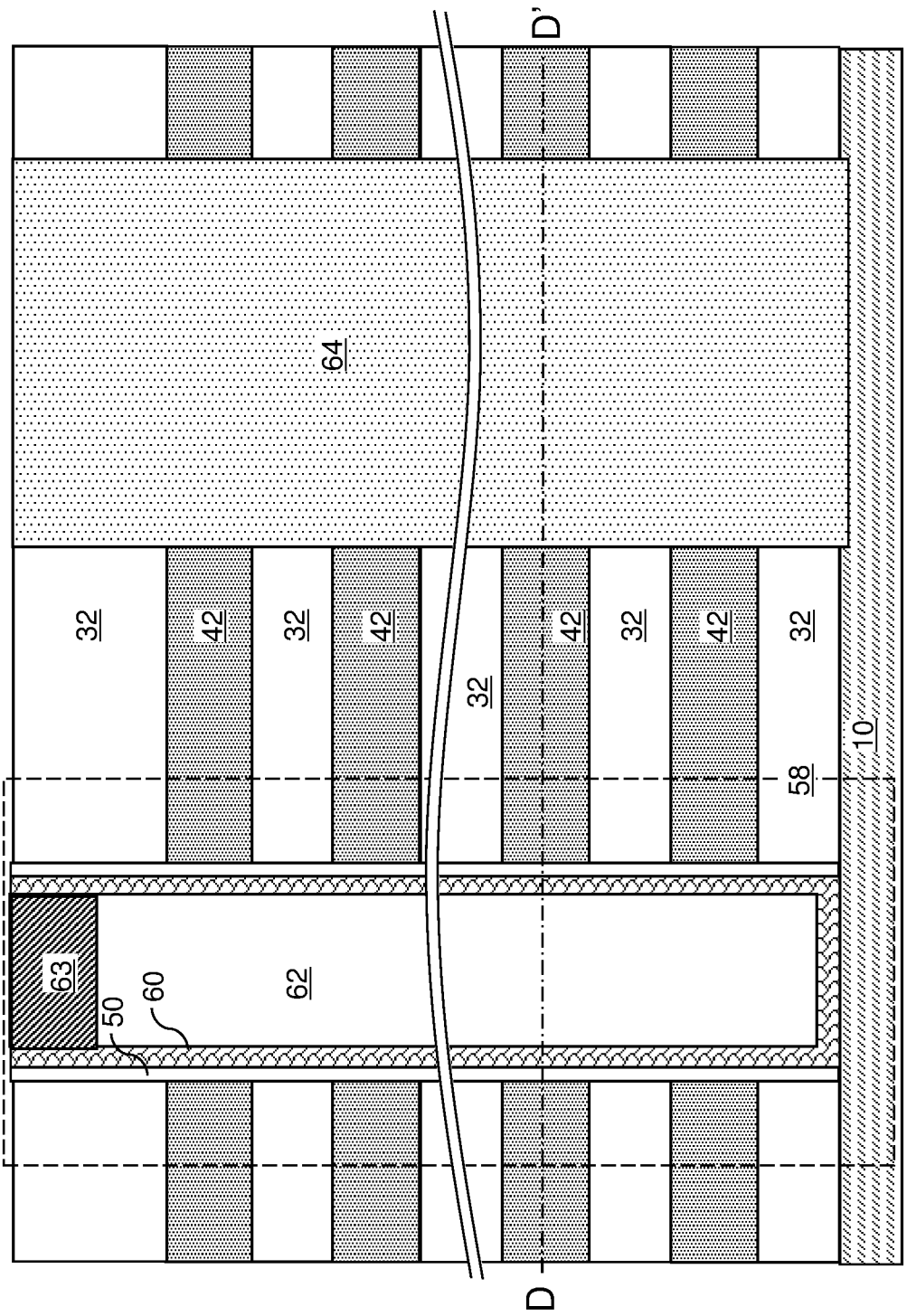
FIG. 18C is a vertical cross-sectional view of a portion of the eighth exemplary structure along the vertical plane C-C' of FIG. 18B.
Figure 18D:
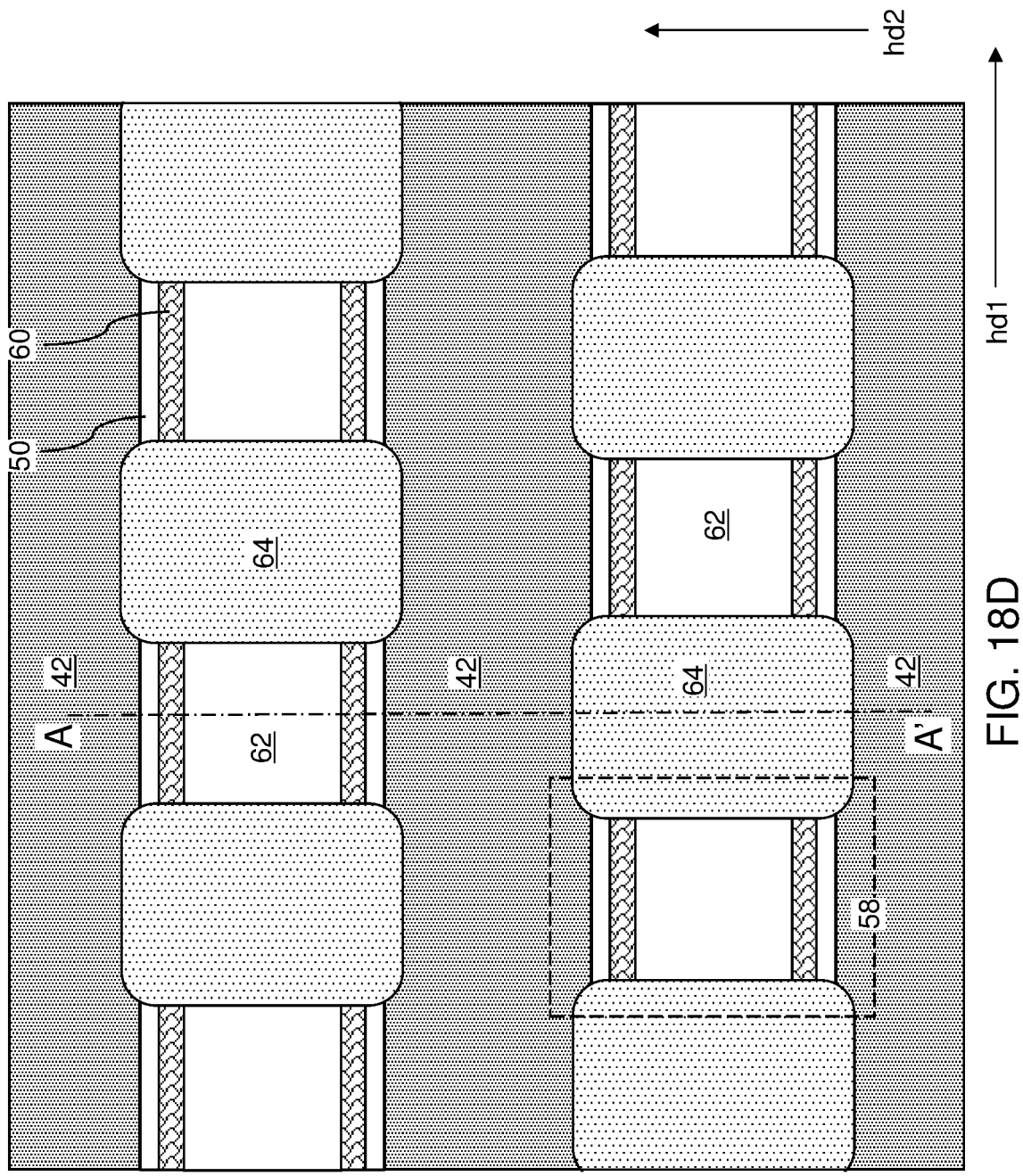
FIG. 18D is a horizontal cross-sectional view along the plane D-D' of FIG. 18C. The vertical plane C-C' is the plane of the cross-section for FIG. 18C.

Referring to FIGS. 18A and 18B, a dielectric material such as doped silicate glass or undoped silicate glass can be deposited in the voids in the line trenches 149, which can include the pillar cavities 69 and the elongated isolation cavities 169. Dielectric pillar structures 64 are formed within the volumes of the pillar cavities 69. A dielectric wall structure 64' is formed in each elongated isolation cavity 169. The dielectric wall structures 64' laterally extend along the first horizontal direction hd1. Each of the line trenches 149 can be filled with a respective laterally alternating sequence of memory stack assemblies 58 and dielectric pillar structures 64. Each of the memory stack assemblies 58 comprises a respective one of the vertical semiconductor channels 60. The two-dimensional array of dielectric pillar structures 64 can be located in the line trenches 149, and can be laterally offset from, and can be interlaced with, the two-dimensional array of memory stack assemblies 58. Each line trench 149 can be filled with a respective row of memory stack assemblies 58 and a respective row of dielectric pillar structures 64 that is interlaced with the respective row of memory stack assemblies 58.

Figure 19A:
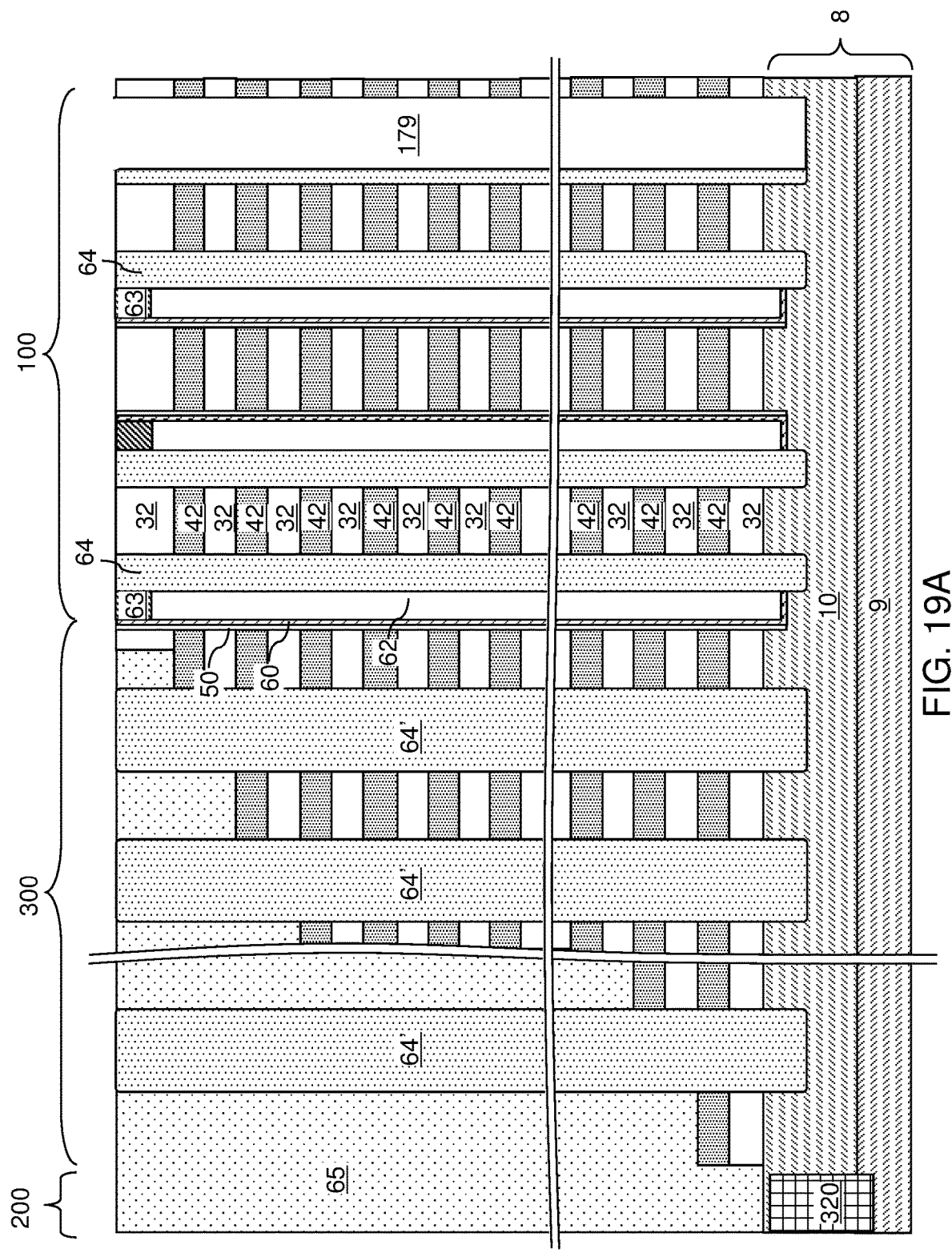
FIG. 19A is a vertical cross-sectional view of the eighth exemplary structure after formation of backside via cavities according to an embodiment of the present disclosure.
Figure 19B:
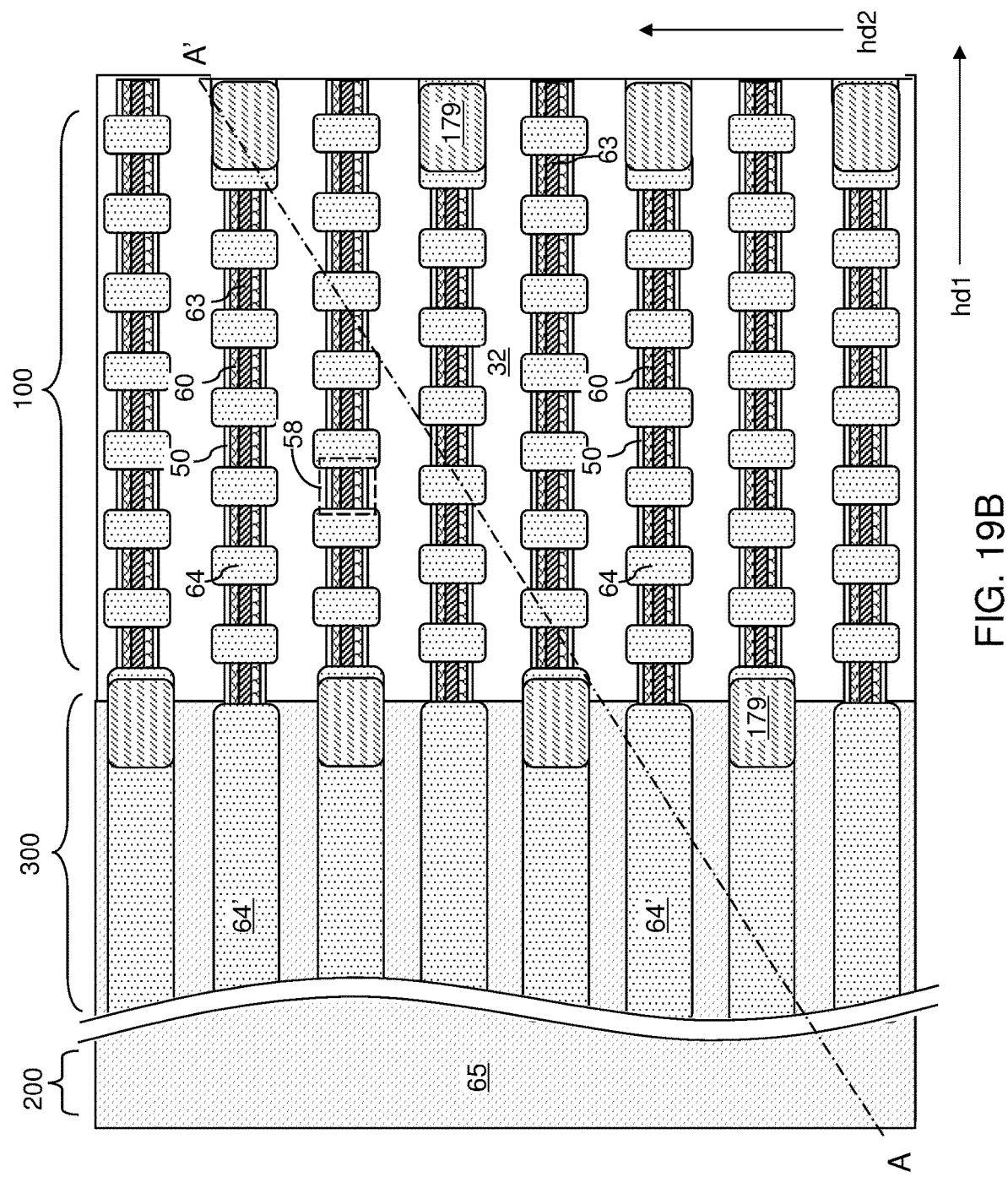
FIG. 19B is a top-down view of the eighth exemplary structure of FIG. 19A. The vertical plane A-A' is the plane of the cross-section for FIG. 19A.

Referring to FIGS. 19A and 19B, backside via cavities 179 can be formed through a subset of the dielectric pillar structures 64 and portions of the dielectric wall structures 64'. The locations of the backside via cavities 179 can be selected such that each sacrificial material layer 42 contacts at least one of the backside via cavities 179. Further, the locations of the backside via cavities 179 can be selected such that each point within the sacrificial material layer 42 is laterally spaced from a most proximal one of the sacrificial material layers 42 by a lateral distance that does not exceed a lateral etch distance during a subsequent etch process that etches the material of the sacrificial material layers 42 selective to the materials of the insulating layers 32 and the ferroelectric gate dielectric layers 50. In one embodiment, a subset of the backside via cavities 179 can have the same area as a respective one of the dielectric pillar structures 64. In this case, a backside via cavity 179 can be formed by removing a respective dielectric pillar structure 64. In another embodiment, the backside via cavities 179 can only partially overlap in area with a respective one of the dielectric pillar structures 64. In yet another embodiment, the backside via cavities 179 may overlap in area, at least partially, with two or more of the dielectric pillar structures 64 and with any intervening memory stack assemblies 58. In this case, a subset of the memory stack assemblies 58 may be removed during formation of the backside via cavities 179. A subset of the backside via cavities 179 formed through the dielectric wall structures 64' may divide one or more of the dielectric wall structures 64' into multiple discrete portions.

Figure 20:
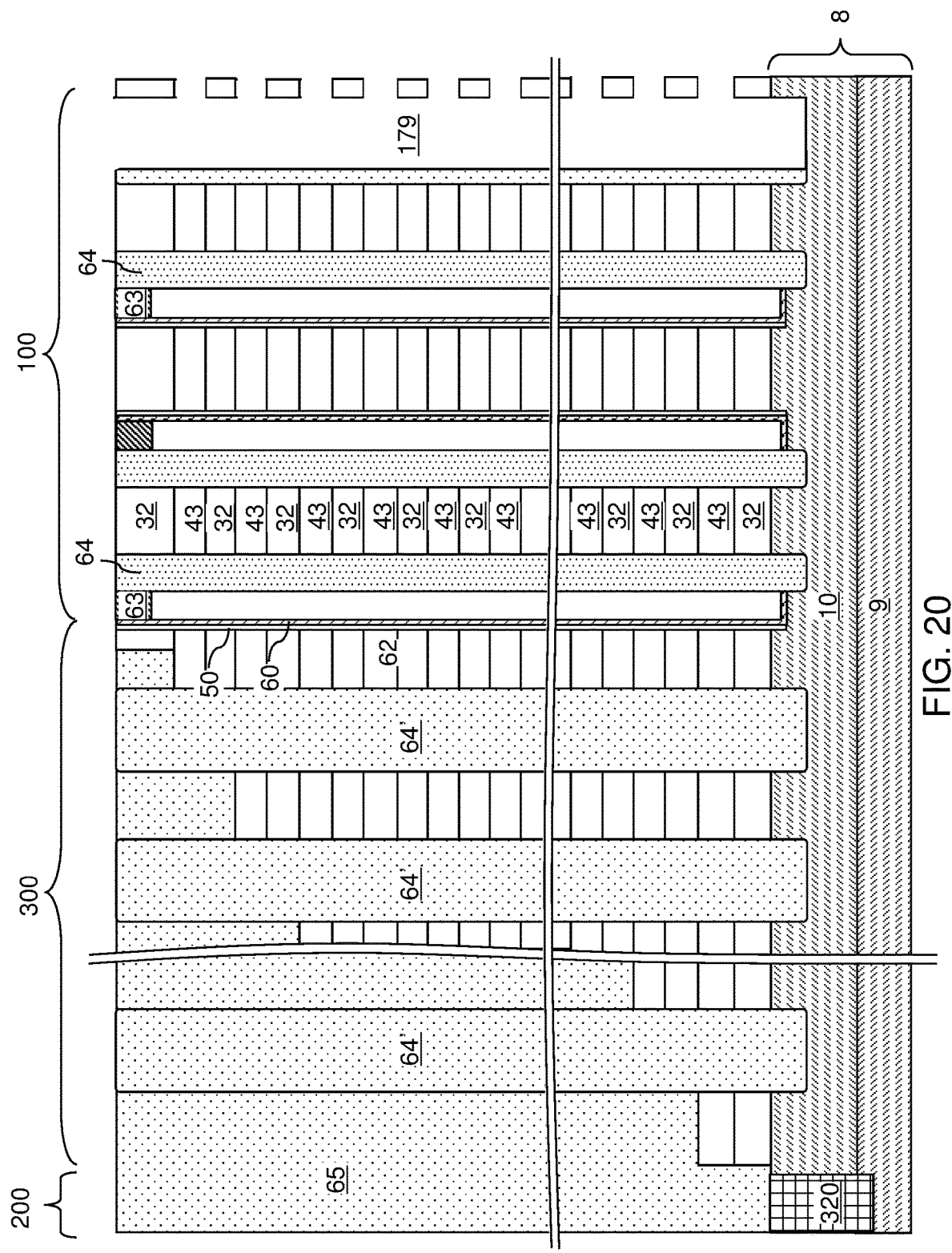
FIG. 20 is a schematic vertical cross-sectional view of the eighth exemplary structure after formation of backside recesses according to an embodiment of the present disclosure.

Referring to FIG. 20, an etchant that selectively etches the second material of the sacrificial material layers 42 with respect to the first material of the insulating layers 32 and the ferroelectric gate dielectric layers 50 can be introduced into the backside via cavities 179, for example, employing an isotropic etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the material of the dielectric pillar structures 64 and the dielectric wall structures 64', and the material of the ferroelectric gate dielectric layers 50. In one embodiment, the sacrificial material layers 42 can include silicon nitride, and the materials of the insulating layers 32 and the retro-stepped dielectric material portion 65 can be silicon oxide materials such as undoped silicate glass and/or a doped silicate glass.

The isotropic etch process that removes the second material selective to the first material and the ferroelectric gate dielectric layers 50 can be a wet etch process employing a wet etch solution, or can be a gas phase (dry) etch process in which the etchant is introduced in a vapor phase into the backside via cavities 179. For example, if the sacrificial material layers 42 include silicon nitride, the etch process can be a wet etch process in which the eighth exemplary structure is immersed within a wet etch tank including hot phosphoric acid, which etches silicon nitride selective to silicon oxide. The duration of the isotropic etch process can be selected such that the sacrificial material layers 42 are completely removed from each alternating stack (32, 42) of insulating layers 32 and sacrificial material layers 42. Each backside recess 43 can be a laterally extending cavity having a lateral dimension that is greater than the vertical extent of the cavity. In other words, the lateral dimension of each backside recess 43 can be greater than the height of the backside recess 43.

In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout. The memory stack assemblies 58, the dielectric pillar structures 64, and the dielectric wall structures 64' provide structural support to the eighth exemplary structure during formation of the backside recesses 43.

Figure 21A:
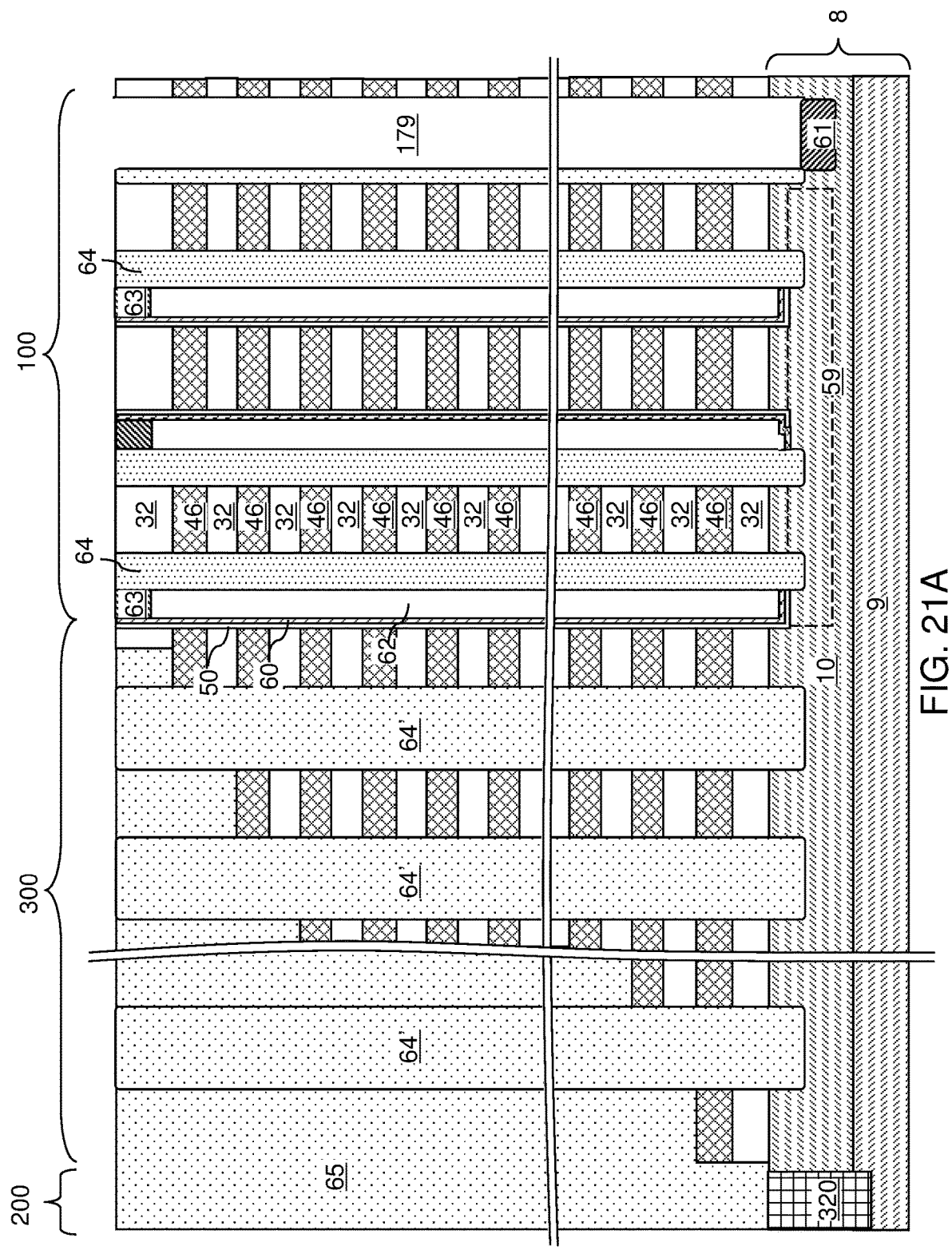
FIG. 21A is a schematic vertical cross-sectional view of the eighth exemplary structure after formation of source regions and formation of ferroelectric dielectric layers and electrically conductive strips in the backside recesses according to an embodiment of the present disclosure.
Figure 21B:
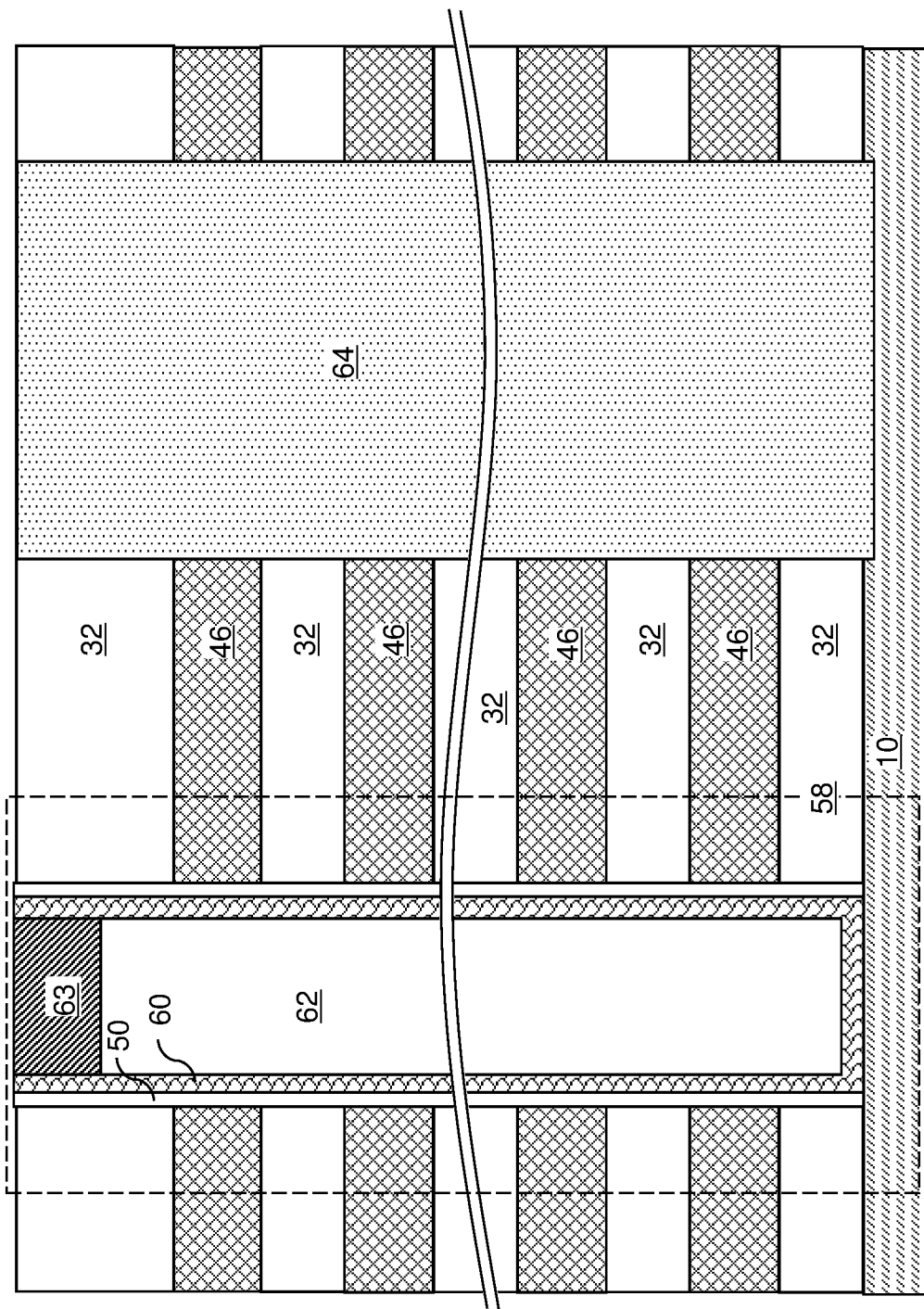
FIG. 21B is a schematic vertical cross-sectional view of a region of the eighth exemplary structure of FIG. 21A.

Referring to FIGS. 21A and 21B, a source region 61 can be formed at a surface portion of the upper substrate semiconductor layer 10 under each backside via cavity 179 by implantation of electrical dopants into physically exposed surface portions of the upper substrate semiconductor layer 10. Each source region 61 is formed in a surface portion of the substrate 8 that underlies a respective opening through the insulating spacer 174. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 174.

Each surface portion of the upper substrate semiconductor layer 10 located between a source region 61 and neighboring bottom ends of the vertical semiconductor channels 60 constitutes a horizontal semiconductor channel 59. Each horizontal semiconductor channel 59 contacts the source region 61 and a plurality of vertical semiconductor channels 60. Each source region 61 is formed in an upper portion of the substrate 8. Semiconductor channels (59, 60) extend between each source region 61 and a respective set of drain regions 63. The semiconductor channels (59, 60) include the vertical semiconductor channels 60 of the memory stack assemblies 58.

At least one conductive material can be deposited in remaining volumes of the backside recesses 43. For example, a metallic barrier layer can be deposited in the backside recesses 43 directly on the physically exposed surfaces of the ferroelectric gate dielectric layers 50. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the at least one the backside via cavity 179, and over the top surface of the topmost insulating layers 32 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, molybdenum titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of boron, fluorine or silicon atoms as impurities.

A plurality of electrically conductive layers 46 can be formed in the plurality of backside recesses 43, and a continuous metallic material layer (not shown) can be formed on the sidewalls of each backside via cavity 179 and over the topmost insulating layers 32. Each electrically conductive layer 46 includes a portion of the metallic barrier layer and a metallic fill material portion that are located between a vertically neighboring pair of dielectric material layers such as a pair of insulating layers 32.

The deposited metallic material of the continuous metallic material layer is etched back from the sidewalls of each backside via cavity 179 and from above the topmost insulating layers 32, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack assemblies 58. In other words, each electrically conductive layer 46 can be a word line that functions as a common control gate electrode for the plurality of vertical memory devices.

Figure 22A:
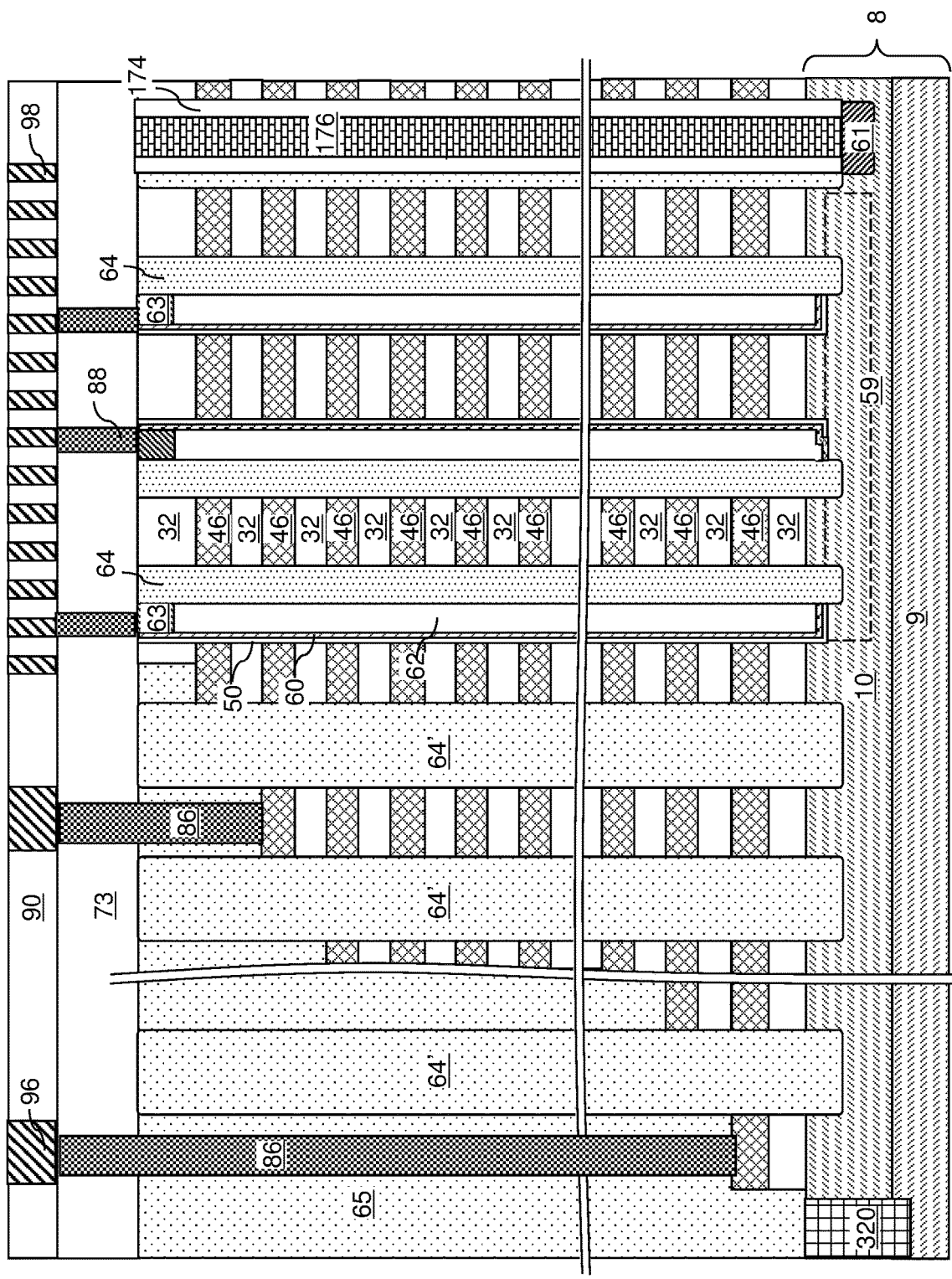
FIG. 22A is a schematic vertical cross-sectional view of the eighth exemplary structure after formation of insulating spacers, backside contact via structures, and word line contact via structures according to an embodiment of the present disclosure.
Figure 22B:
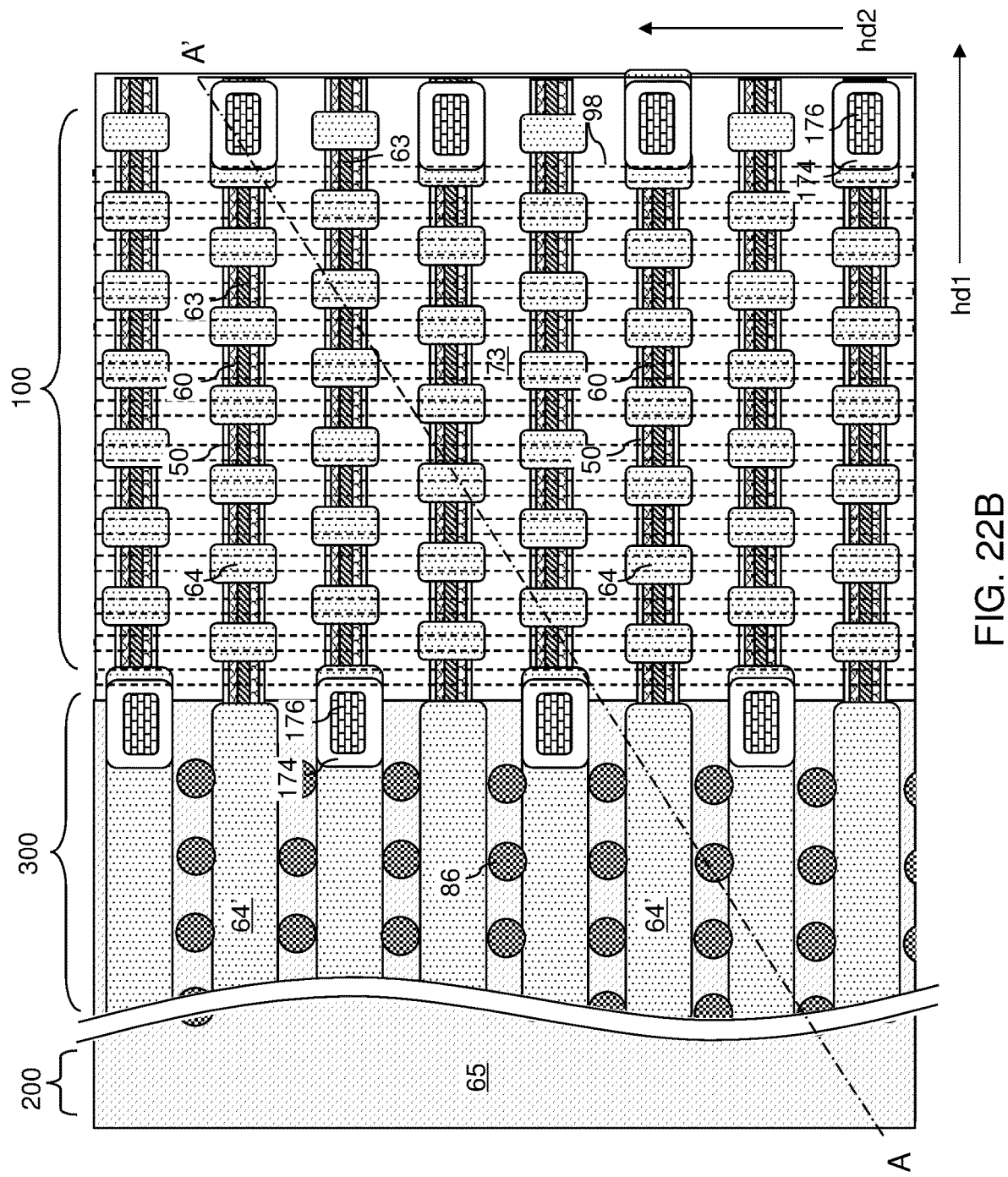
FIG. 22B is a top-down view of the eighth exemplary structure of FIG. 22A. The vertical plane A-A' is the plane of the cross-section for FIG. 22A.

Referring to FIGS. 22A and 22B, an insulating material layer can be formed in the at least one backside via cavity 179 and over the topmost insulating layers 32 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the topmost insulating layers 32 and at the bottom of each backside via cavity 179. Each remaining portion of the insulating material layer constitutes an insulating spacer 174. A backside void is present within a volume surrounded by each insulating spacer 174. A top surface of the upper substrate semiconductor layer 10 can be physically exposed at the bottom of each backside void.

A backside contact via structure 176 can be formed within each backside voids. Each contact via structure 176 can fill a respective backside void. The contact via structures 176 can be formed by depositing at least one conductive material in the remaining unfilled volumes of the backside via cavities 179. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the topmost insulating layers 32 overlying the alternating stacks (32, 46) as a stopping layer. If chemical mechanical planarization (CMP) process is employed, the topmost insulating layers 32 can be employed as a CMP stopping layer. Each remaining continuous portion of the at least one conductive material in the backside via cavities 179 constitutes a backside contact via structure 176. Each backside contact via structure 176 extends through the alternating stacks (32, 46), and contacts a top surface of a respective source region 61.

Contact via structures 86 (which are herein referred to as word line contact via structures) can be formed on the electrically conductive layers 46 through the retro-stepped dielectric material portion 65. A two-dimensional array of contact via structures 86 can be formed on a top surface of a respective one of the electrically conductive layers 46 in the staircase region 300.

Additional contact via structures and additional dielectric material layers can be formed over the topmost insulating layers 32. For example, drain contact via structures 88 can be formed on a top surface of each drain region 63 within the memory stack assemblies 58.

A line-level dielectric layer 90 can be deposited over the contact-level dielectric layer 73, and metal line structures (98, 96) can be formed therein. The metal line structures (98, 96) may include bit lines 98 and interconnection metal lines 96. Bit lines 98 can be formed to electrically contact every other drain region 63 along the second horizontal direction hd2, i.e., a respective set of drain regions 63 located within every other line trench 149 along the second horizontal direction.

Referring to FIGS. 23A and 23B, a first alternative configuration of the eighth exemplary structure is illustrated, which can be derived from the eighth exemplary structure illustrated in FIGS. 12A and 12B by omitting the processing steps of FIGS. 13A and 13B and by performing the processing steps of FIGS. 14A and 14B. The continuous ferroelectric gate dielectric layer 40L is divided into multiple continuous ferroelectric gate dielectric layers 40L located within a respective line trench 149. Each continuous ferroelectric gate dielectric layer 40L includes only vertically extending portions that contact sidewalls of the alternating stacks (32, 42).

Referring to FIGS. 24A and 24B, the processing steps of FIGS. 15A and 15B can be performed to deposit a semiconductor channel material layer 60L. Subsequently, the processing steps of FIGS. 13A and 13B can be performed with an increase in the ion implantation or ion bombardment energy to implant a non-polar metallic element into the continuous ferroelectric gate dielectric layer 40L or to bombard the continuous ferroelectric gate dielectric layer 40L with inert gas ions. The continuous ferroelectric gate dielectric layer 40L is converted into continuous ferroelectric gate dielectric layers 50L including the non-polar metallic element as dopants.

For example, the continuous ferroelectric gate dielectric layer 40L can include any of the ferroelectric dielectric materials described above, the non-polar metallic element may be any metallic element does not form a ferroelectric oxygen-containing compound. In one embodiment, the non-polar metallic element may include one or more elements selected from Mg, Ga, In, Sc, Y, rate earth elements, Ti, Zr or Hf. The continuous ferroelectric gate dielectric layer that includes the non-polar metallic element is herein referred to as a defect containing ferroelectric gate dielectric layer 50L. According to an aspect of the present disclosure, the defect containing ferroelectric gate dielectric layer 50L includes the non-polar metallic element at an atomic percentage in a range from 0.01% to 10%, such as from 0.05% to 3% and/or from 0.1% to 1.0%. As described above, layer 50L may include the nanoclusters of the non-polar metallic element.

In one embodiment, incorporation of the non-polar metallic element into the defect containing ferroelectric gate dielectric layer 50L induces formation of pinned grain boundaries within the defect containing ferroelectric gate dielectric layer 50L, and reduces the average grain size within the defect containing ferroelectric gate dielectric layer 50L. Pinned grain boundaries are structurally stable grain boundaries that do not move upon anneal.

In one embodiment, the defect containing ferroelectric gate dielectric layer 50L may be polycrystalline and may include pinned grain boundaries. In one embodiment, the defect containing ferroelectric gate dielectric layer 50L may be annealed after incorporating the non-polar metallic element into the defect containing ferroelectric gate dielectric layer 50L. Atoms of the non-polar metallic element can be present at the pinned grain boundaries at a higher atomic concentration than within grains of the defect containing ferroelectric gate dielectric layer 50L. In one embodiment, the non-polar metallic element comprises an element selected from Mg, Ga, In, Sc, Y, rate earth elements, Ti, Zr or Hf.

Referring to FIGS. 25A and 25B, the processing steps of FIGS. 15A and 15B and FIGS. 16A and 16B can be performed to form line trench fill structures (50L, 60L, 62R, 63R). Subsequently, the processing steps of FIGS. 17A-22B can be performed to provide a same structure as the eighth exemplary structure illustrated in FIGS. 23A and 23B.

Referring to FIGS. 26A and 26B, a second alternative configuration of the eighth exemplary structure can be derived from the eighth exemplary structure illustrated in FIGS. 12A and 12B by depositing a metallic dusting layer 242L on a top surface of the continuous ferroelectric gate dielectric layer 40L. The metallic dusting layer 242L includes a continuous or non-continuous layer of a non-polar metallic element, which may be any of the non-polar metallic elements discussed above. In one embodiment, the non-polar metallic element may include one or more elements selected from Mg, Ga, In, Sc, Y, rate earth elements, Ti, Zr or Hf. The thickness of the metallic dusting layer 242L may be equal to, less than, or greater than 1 monolayer of the non-polar metallic elements. In one embodiment, the metallic dusting layer 242L may have a thickness greater than 1 monolayer, and may be formed as a continuous metallic material layer. Alternatively, the metallic dusting layer 242L may be formed as nanoclusters of atoms that may, or may not, be adjoined to each other. In one embodiment, the fraction of the area of the continuous ferroelectric gate dielectric layer 240L that is covered by the metallic dusting layer 242L relative to the total area of the continuous ferroelectric gate dielectric layer 240L may be in a range from 0.01 to 0.99, such as from 0.03 to 0.3. Generally, the average thickness of the metallic dusting layer 242L may be in a range from 0.01 times the thickness of a monolayer of the non-polar metallic element to 10 times the thickness of a monolayer of the non-polar metallic element.

An anneal process can be performed to outdiffuse the non-polar metallic element within the metallic dusting layer 242L into the continuous ferroelectric gate dielectric layer 40L. The anneal process can be performed at an elevated temperature that is sufficient to induce diffusion of the non-polar metallic element into the continuous ferroelectric gate dielectric layer 40L. The continuous ferroelectric gate dielectric layer that includes the non-polar metallic element is herein referred to as a defect containing ferroelectric gate dielectric layer 50L. According to an aspect of the present disclosure, the defect containing ferroelectric gate dielectric layer 50L includes the non-polar metallic element at an atomic percentage in a range from 0.01% to 10%, such as from 0.05% to 3% and/or from 0.1% to 1.0%. Layer 50L may contain the nanoclusters of the non-polar metallic element described above.

In one embodiment, incorporation of the non-polar metallic element into the defect containing ferroelectric gate dielectric layer 50L induces an increase in the pinned grain boundaries. Pinned grain boundaries are structurally stable grain boundaries that do not move upon anneal. In one embodiment, the defect containing ferroelectric gate dielectric layer 50L may be polycrystalline and may include pinned grain boundaries. In one embodiment, the defect containing ferroelectric gate dielectric layer 50L may be annealed after incorporating the non-polar metallic element into the defect containing ferroelectric gate dielectric layer 50L. Atoms of the non-polar metallic element can be present at the pinned grain boundaries at a higher atomic concentration than within grains of the defect containing ferroelectric gate dielectric layer 50L. In one embodiment, the non-polar metallic element comprises an element selected from Mg, Ga, In, Sc, Y, rate earth elements, Ti, Zr or Hf. The metallic dusting layer 242L can be subsequently removed, for example, employing a wet etch process that etches the metallic material of the metallic dusting layer 242L selective to the metallic oxide material of the defect containing ferroelectric gate dielectric layer 50L.

Subsequently, the processing steps of FIGS. 14A-22B can be performed to provide a same structure as the eighth exemplary structure illustrated in FIGS. 23A and 23B.

Generally, incorporation of the non-polar metallic element into the ferroelectric gate dielectric layer 40L may be performed by an ion implantation process that implants the non-polar metallic element into the continuous ferroelectric gate dielectric layer 40L prior to deposition of a material of the vertical semiconductor channel 60 thereupon, or by an ion implantation process that implants the non-polar metallic element into the continuous ferroelectric gate dielectric layer 40L after deposition of a material of the vertical semiconductor channel 60 thereupon, or by a combination of deposition of a metallic dusting layer 242L on the continuous ferroelectric gate dielectric layer 40L, outdiffusion of the non-polar metallic element from the metallic dusting layer 242L into the continuous ferroelectric gate dielectric layer 40L, and subsequent removal of the metallic dusting layer 242L.

Figure 27:
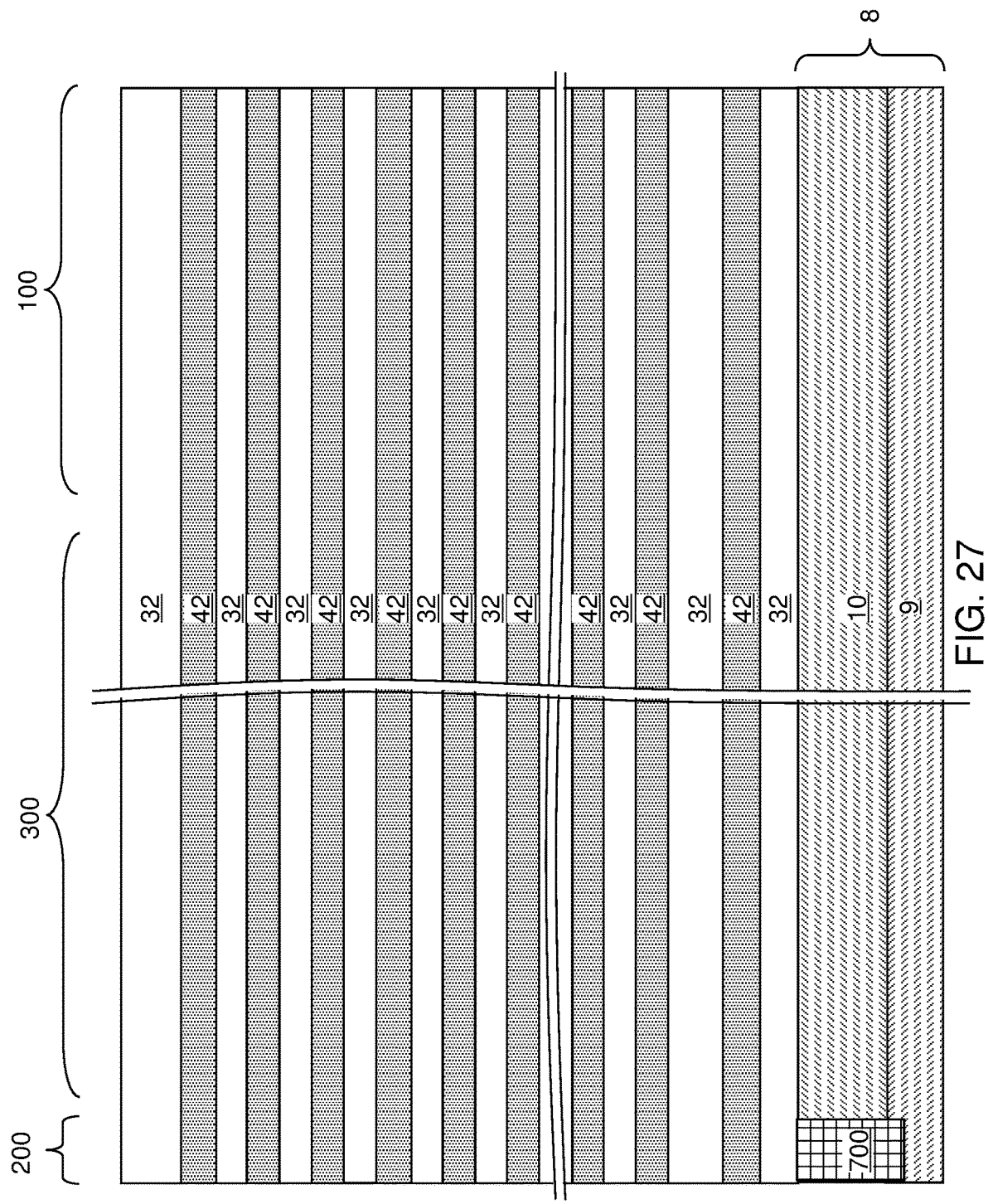
FIG. 27 is a schematic vertical cross-sectional view of a ninth exemplary structure after formation of an alternating stack of insulating layers and sacrificial material layers according to an embodiment of the present disclosure.

Referring to FIG. 27, a ninth exemplary structure according to an embodiment of the present disclosure is illustrated, which may be the same as the eighth exemplary structure illustrated in FIG. 8.

Figure 28:
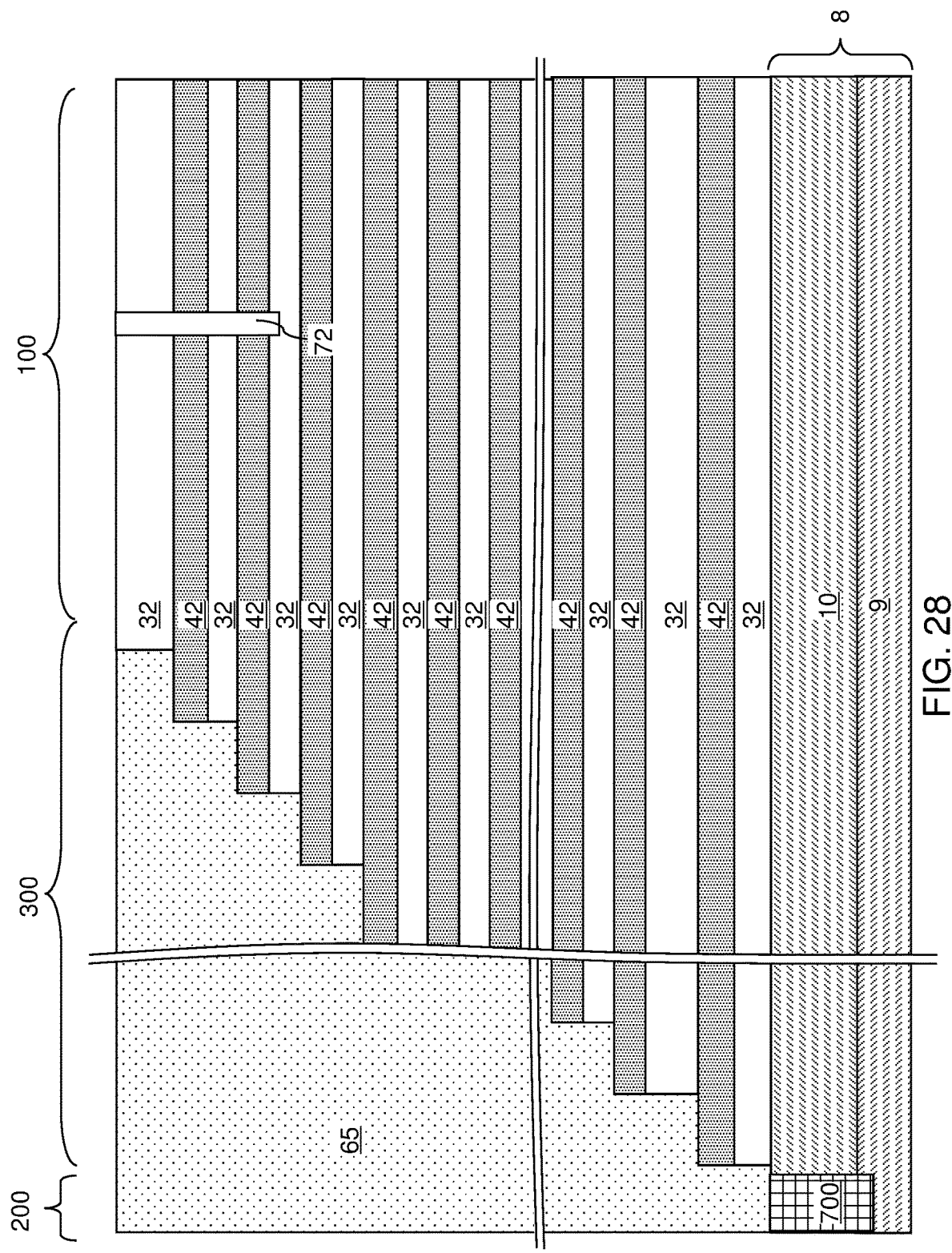
FIG. 28 is a schematic vertical cross-sectional view of the ninth exemplary structure after formation of stepped terraces and a retro-stepped dielectric material portion according to an embodiment of the present disclosure.

Referring to FIG. 28, the processing steps of FIG. 3 can be performed on the ninth exemplary structure to form stepped surfaces and a retro-stepped dielectric material portion 65 in each staircase region 300. Optionally, drain select level isolation structures 72 can be formed through the topmost insulating layer 32 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the topmost insulating layer 32.

Figure 29A:
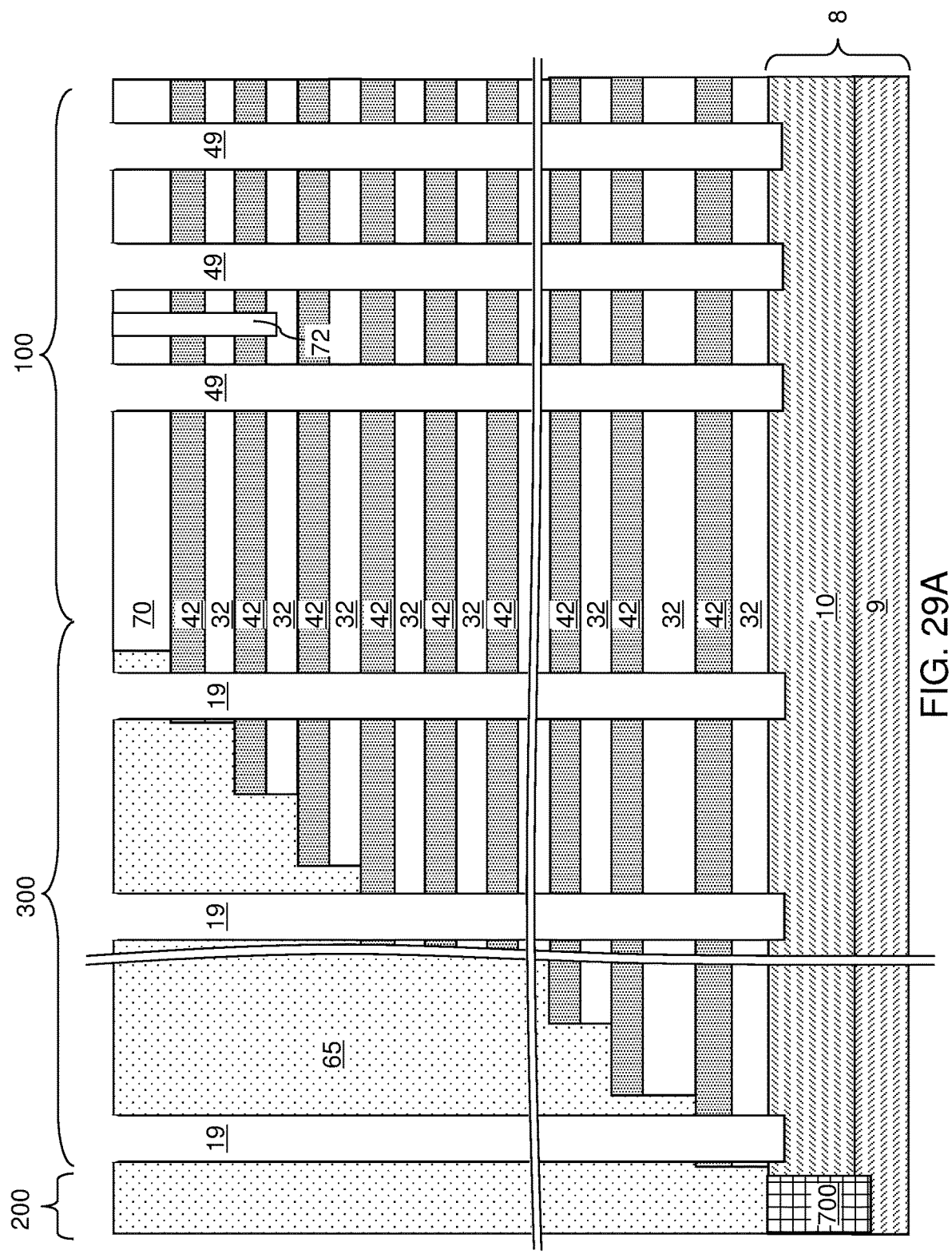
FIG. 29A is a schematic vertical cross-sectional view of the ninth exemplary structure after formation of memory openings and support openings according to an embodiment of the present disclosure.
Figure 29B:
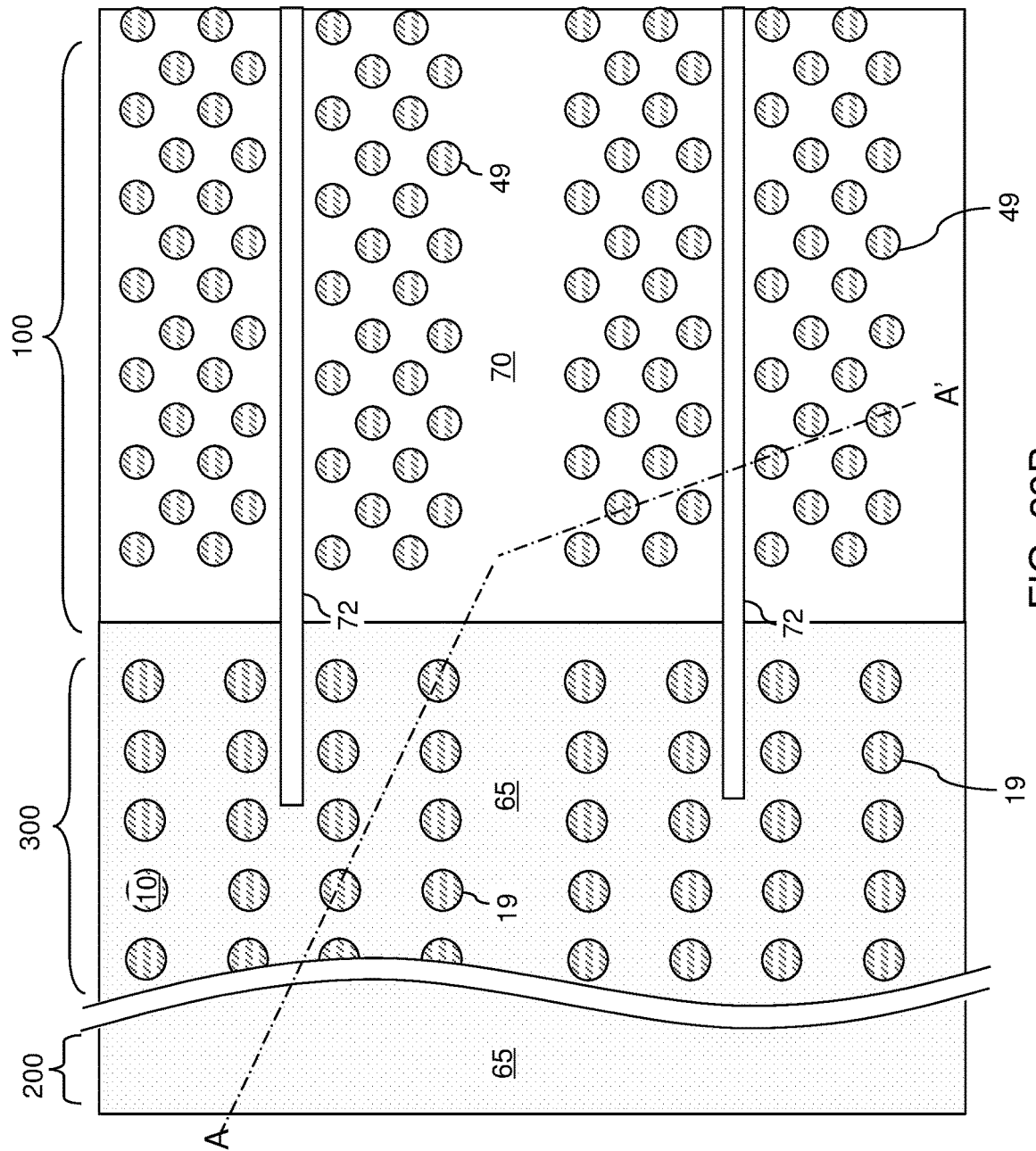
FIG. 29B is a top-down view of the ninth exemplary structure of FIG. 29A. The vertical plane A-A' is the plane of the cross-section for FIG. 29A.

Referring to FIGS. 29A, 29B, and 30A, a lithographic material stack (not shown) including at least a photoresist layer can be formed over the topmost insulating layer 32 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the topmost insulating layer 32 or the retro-stepped dielectric material portion 65, and through the alternating stack (32, 42) by at least one anisotropic etch that employs the patterned lithographic material stack as an etch mask. Cavities are formed through the alternating stack (32, 42) and the retro-stepped dielectric material portion 65. Specifically, portions of the alternating stack (32, 42) underlying the openings in the patterned lithographic material stack are etched to form memory openings 49 and support openings 19. As used herein, a "memory opening" refers to a structure in which memory elements are subsequently formed. As used herein, a "support opening" refers to a structure in which a support structure (such as a support pillar structure) that mechanically supports other elements is subsequently formed. The memory openings 49 are formed through the topmost insulating layer 32 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the upper substrate semiconductor layer 10. In one embodiment, an overetch into the upper substrate semiconductor layer 10 may be optionally performed after the top surface of the upper substrate semiconductor layer 10 is physically exposed at a bottom of each memory opening 49 and each support opening 19. The overetch may be performed prior to, or after, removal of the lithographic material stack. In other words, the recessed surfaces of the upper substrate semiconductor layer 10 may be vertically offset from the un-recessed top surfaces of the upper substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the upper substrate semiconductor layer 10.

Each of the cavities 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The lower substrate semiconductor layer 9 and the upper substrate semiconductor layer 10 collectively constitutes a substrate 8, which can be a semiconductor substrate. Alternatively, the upper substrate semiconductor layer 10 may be omitted, and the memory openings 49 and the support openings 19 can be extend to a top surface of the lower substrate semiconductor layer 9.

Each memory opening 49 extends through the topmost insulating layer 32, the alternating stack (32, 42), and optionally into an upper portion of the upper substrate semiconductor layer 10. Each support opening 19 can extend through the retro-stepped dielectric material portion 65, a subset of layers in the alternating stack (32, 42), and optionally through the upper portion of the upper substrate semiconductor layer 10. The recess depth of the bottom surface of each memory opening with respect to the top surface of the upper substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 30B, the defect containing ferroelectric gate dielectric layer 50L can be formed within each memory opening 49 and within each support opening. The defect containing ferroelectric gate dielectric layer 50L can have the same material composition and the same thickness as in the eighth exemplary structure. In one embodiment, the ferroelectric gate dielectric layers 50L may be formed by an ion implantation or another suitable process that implants the non-polar metallic element into a continuous ferroelectric gate dielectric layer 40L or by ion bombardment of layer 40L with inert gas ions prior to deposition of a material of a vertical semiconductor channel 60 thereupon. For example, the processing steps of FIGS. 12A and 12B, FIGS. 13A and 13B, and FIGS. 14A and 14B can be sequentially performed to form the ferroelectric gate dielectric layers 50L.

Referring to FIG. 30C, the processing steps of FIGS. 15A and 15B can be performed to form a semiconductor channel material layer 60L and a continuous dielectric fill material layer 62L.

Figure 31:
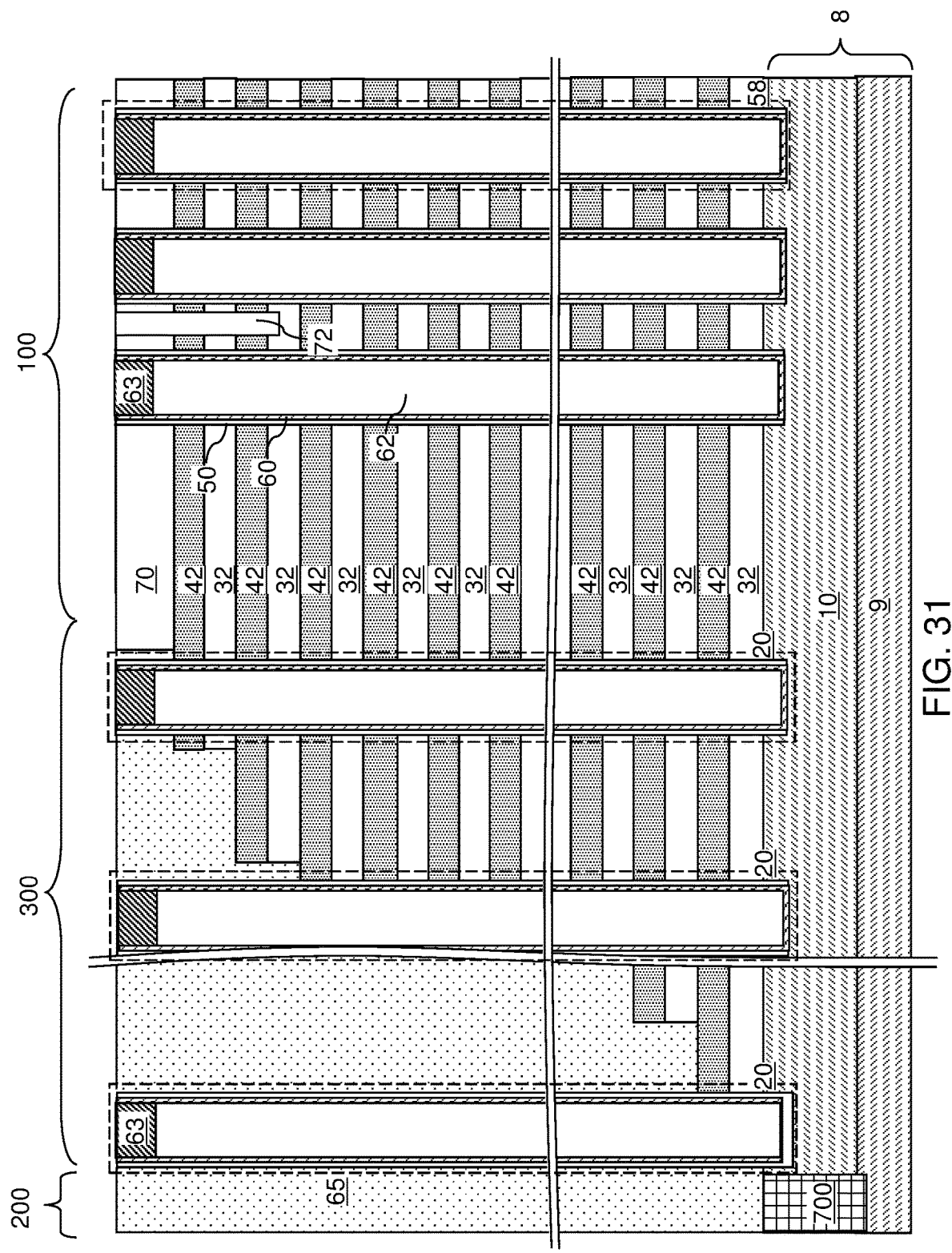
FIG. 31 is a schematic vertical cross-sectional view of the ninth exemplary structure after formation of memory stack assemblies and support pillar structures according to an embodiment of the present disclosure.

Referring to FIGS. 30D and 31, the processing steps of FIGS. 16A and 16B can be performed to form a memory stack assembly 58 within each memory opening 49. Each memory stack assembly 58 can include, for example, a ferroelectric gate dielectric layer 50, a vertical semiconductor channel 60, a dielectric core 62, and a drain region 63. A support pillar structure 20 can be formed within each support opening 19.

Generally, each ferroelectric gate dielectric layer 50 in the ninth exemplary structure may be formed by alternative methods. For example, an ion implantation process may be used that implants the non-polar metallic element into the continuous ferroelectric gate dielectric layer 40L or an inert gas ion bombardment process may be used, after deposition of a material of the vertical semiconductor channel 60 thereupon. Alternatively, the ferroelectric gate dielectric layer 50 may be formed by a combination of deposition of a metallic dusting layer 242L on the continuous ferroelectric gate dielectric layer 40L, outdiffusion of the non-polar metallic element from the metallic dusting layer 242L into the continuous ferroelectric gate dielectric layer 40L, and subsequent removal of the metallic dusting layer 242L in the same manner as illustrated in FIGS. 26A and 26B.

Figure 32A:
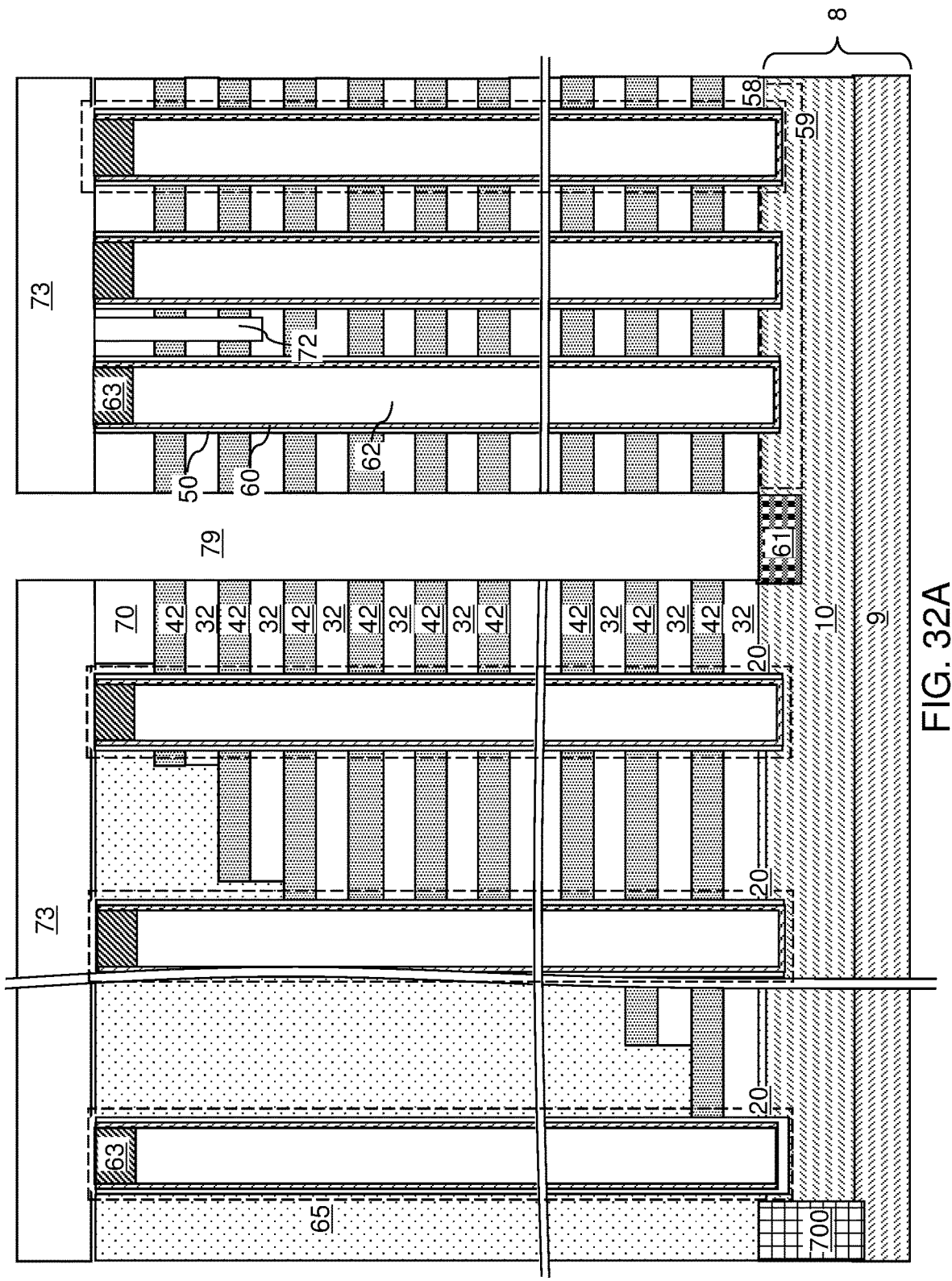
FIG. 32A is a schematic vertical cross-sectional view of the ninth exemplary structure after formation of a contact-level dielectric layer and backside trenches according to an embodiment of the present disclosure.
Figure 32B:
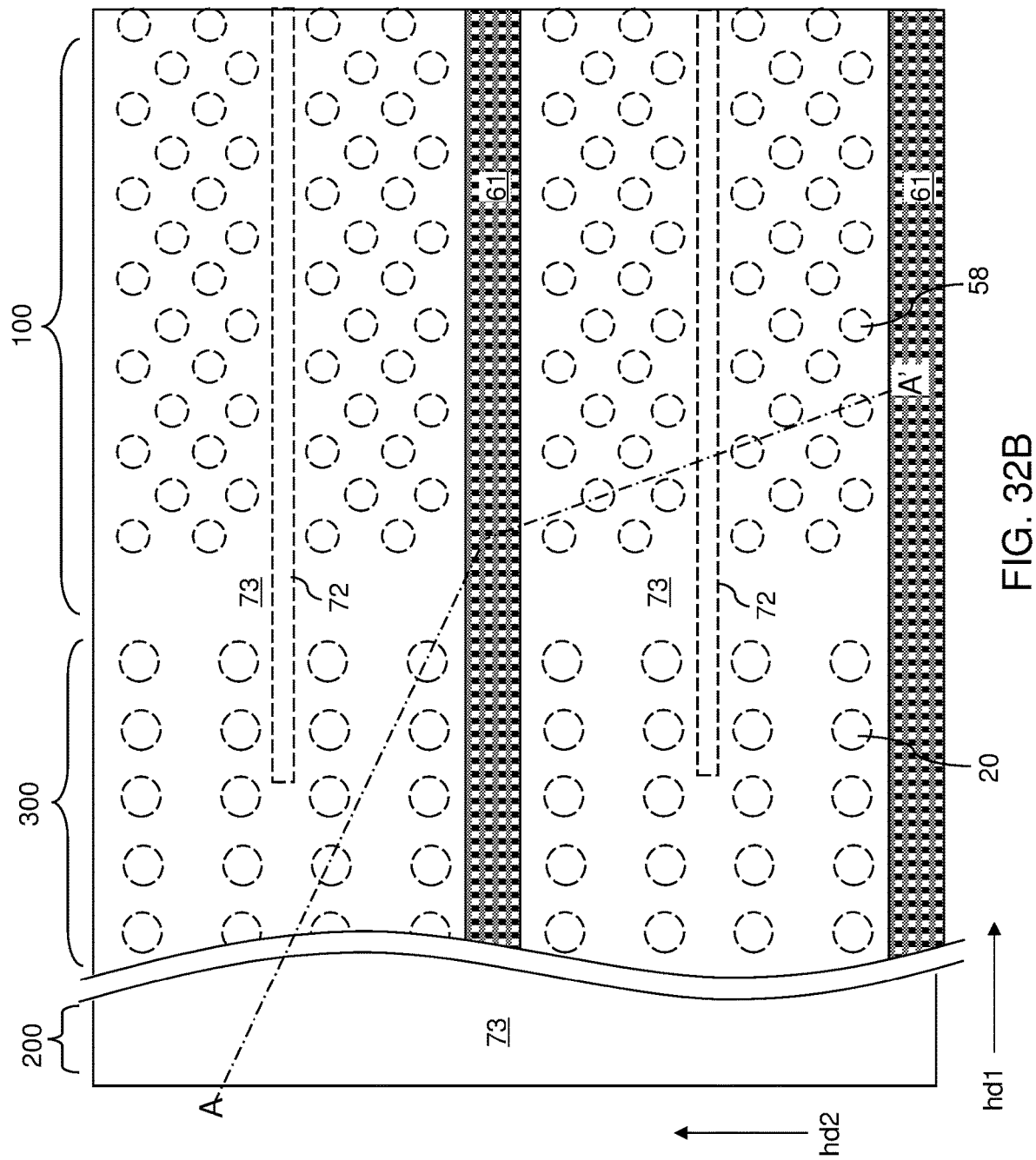
FIG. 32B is a partial see-through top-down view of the ninth exemplary structure of FIG. 32A. The vertical plane A-A' is the plane of the schematic vertical cross-sectional view of FIG. 32A.

Referring to FIGS. 32A and 32B, a contact-level dielectric layer 73 can be formed over the alternating stack (32, 42) of insulating layer 32 and sacrificial material layers 42, and over the memory stack assemblies 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack assemblies 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate 8, and laterally extend through the memory array region 100 and the staircase region 300.

In one embodiment, the backside trenches 79 can laterally extend along a first horizontal direction hd1 and can be laterally spaced apart from each other along a second horizontal direction hd2 that is perpendicular to the first horizontal direction hd1. The memory stack assemblies 58 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack assemblies 58 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the upper substrate semiconductor layer 10 that underlie the backside trenches 79 to form source regions 61. The atomic concentration of the dopants of the second conductivity type in the source regions 61 can be in a range from $5 \times 10^{18}/cm^3$ to $2 \times 10^{21}/cm^3$, although lesser and greater atomic concentrations can also be employed. Surface portions of the upper substrate semiconductor layer 10 that extend between each source region 61 and adjacent memory stack assemblies 58 comprise horizontal semiconductor channels 59.

Figure 33:
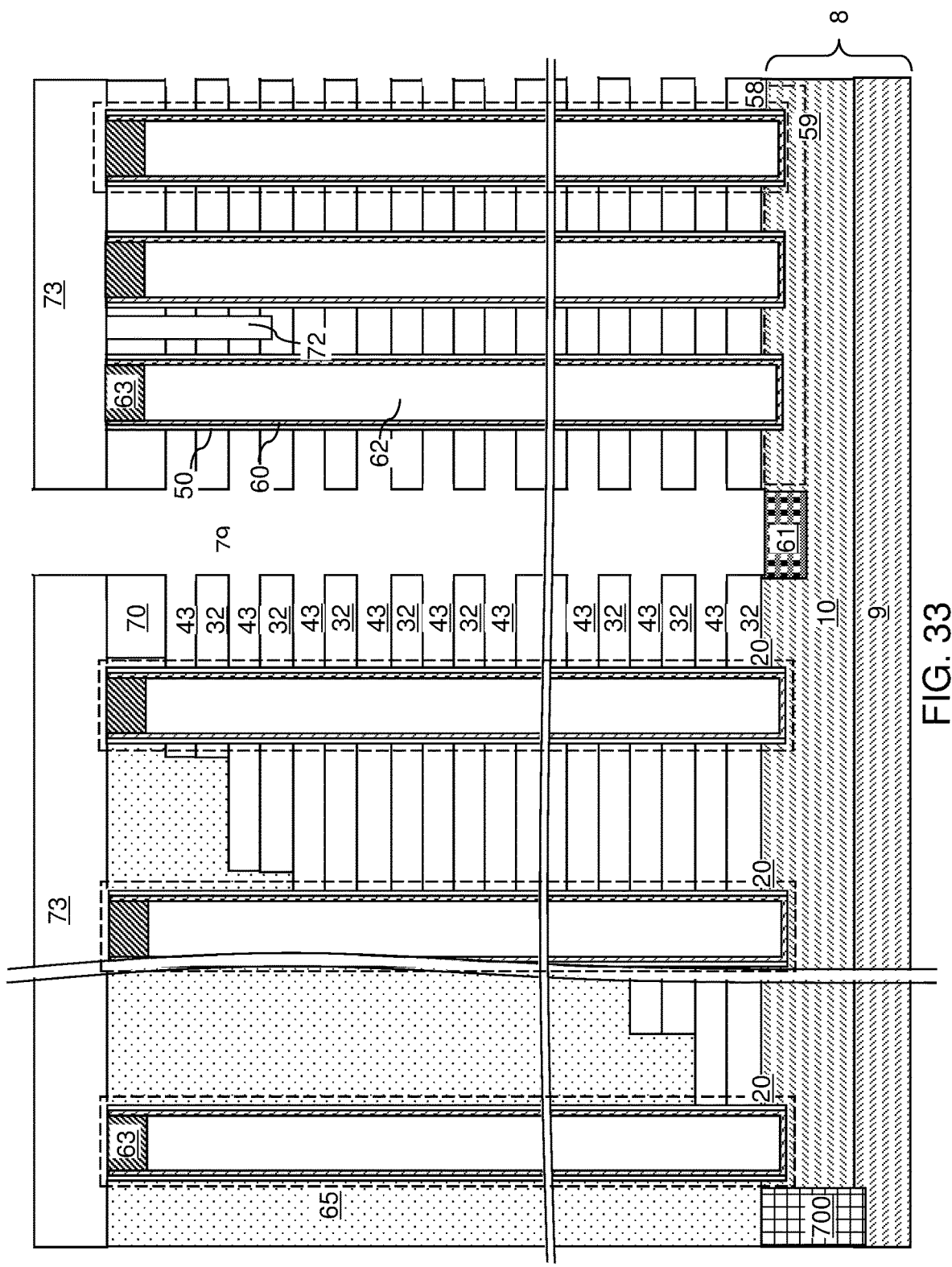
FIG. 33 is a schematic vertical cross-sectional view of the ninth exemplary structure after formation of backside recesses according to an embodiment of the present disclosure.

Referring to FIG. 33, an etchant that selectively etches the second material of the sacrificial material layers 42 with respect to the first material of the insulating layers 32 can be introduced into the backside trenches 79, for example, by performing the isotropic etch process of FIG. 16. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the upper substrate semiconductor layer 10, and the material of the ferroelectric gate dielectric layers 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the ferroelectric gate dielectric layers 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the ninth exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack assemblies 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack assemblies 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings.

Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Figure 34:
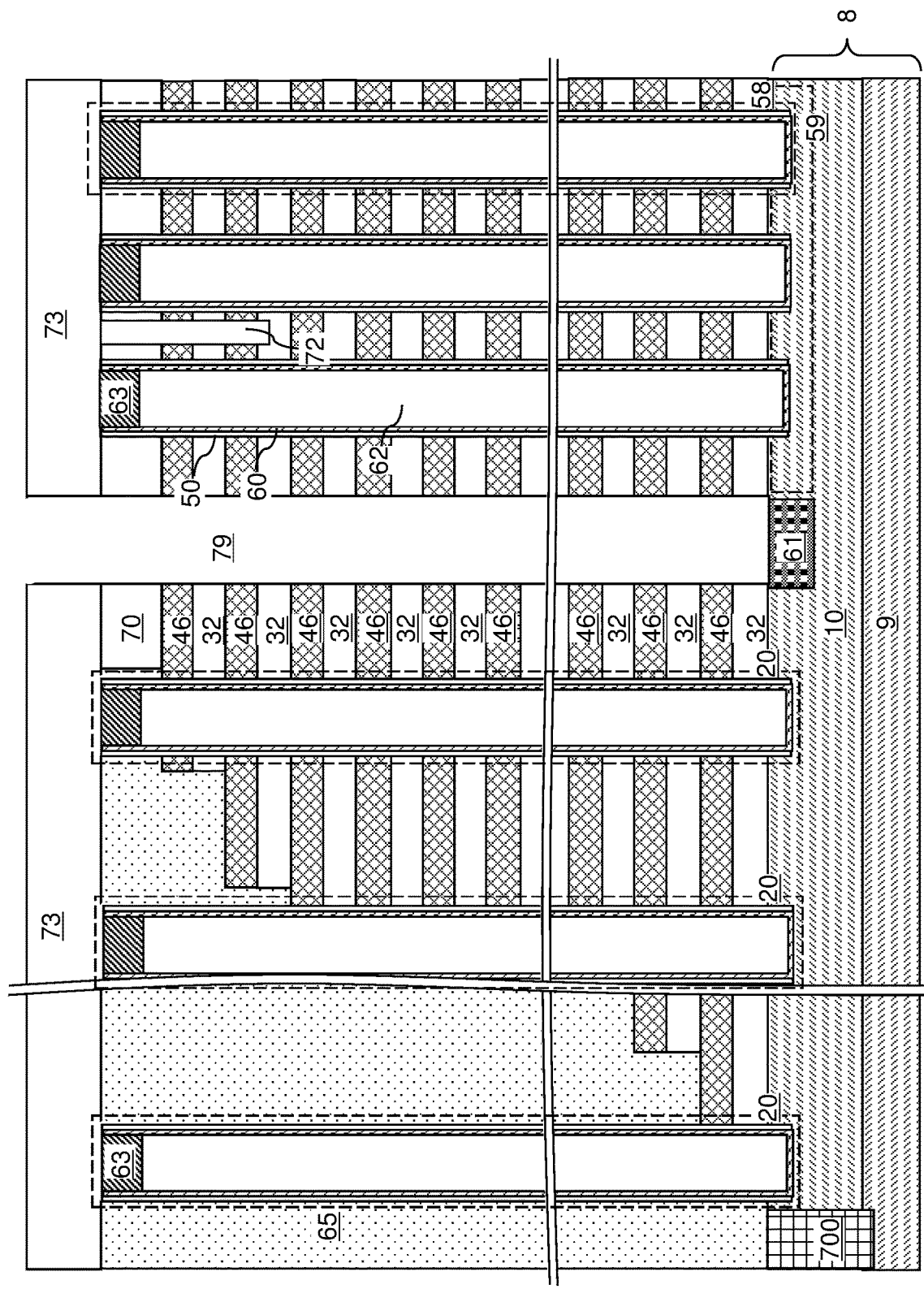
FIG. 34 is a schematic vertical cross-sectional view of the ninth exemplary structure after replacement of the sacrificial material layers with combinations of a ferroelectric dielectric layer and an electrically conductive layer according to an embodiment of the present disclosure.

Referring to FIG. 34, at least one conductive material can be deposited in the backside recesses 43. For example, a metallic barrier layer can be deposited in the backside recesses 43 directly on the physically exposed surfaces of the ferroelectric gate dielectric layers 50 and the insulating layers 32. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in remaining volumes of backside recesses 43, on the sidewalls of the at least one the backside trench 79, and over the top surface of the contact-level dielectric layer 73 to form a metallic fill material portion. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion can consist essentially of at least one elemental metal. The at least one elemental metal of the metallic fill material portion can be selected, for example, from tungsten, cobalt, ruthenium, molybdenum titanium, and tantalum. In one embodiment, the metallic fill material portion can consist essentially of a single elemental metal. In one embodiment, the metallic fill material portion can be deposited employing a fluorine-containing precursor gas such as $WF_6$. In one embodiment, the metallic fill material portion can be a tungsten layer including a residual level of boron, fluorine or silicon atoms as impurities.

A plurality of electrically conductive layers 46 can be formed in the plurality of backside recesses 43, and a continuous metallic material layer (not shown) can be formed on the sidewalls of each backside trench 79 and over the contact-level dielectric layer 73. Each electrically conductive layer 46 includes a portion of the metallic barrier layer and a metallic fill material portion that are located between a vertically neighboring pair of dielectric material layers such as a pair of insulating layers 32.

The deposited metallic material of the continuous metallic material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack assemblies 58. In other words, each electrically conductive layer 46 can be a word line that functions as a common control gate electrode for the plurality of vertical memory devices.

Figure 35A:
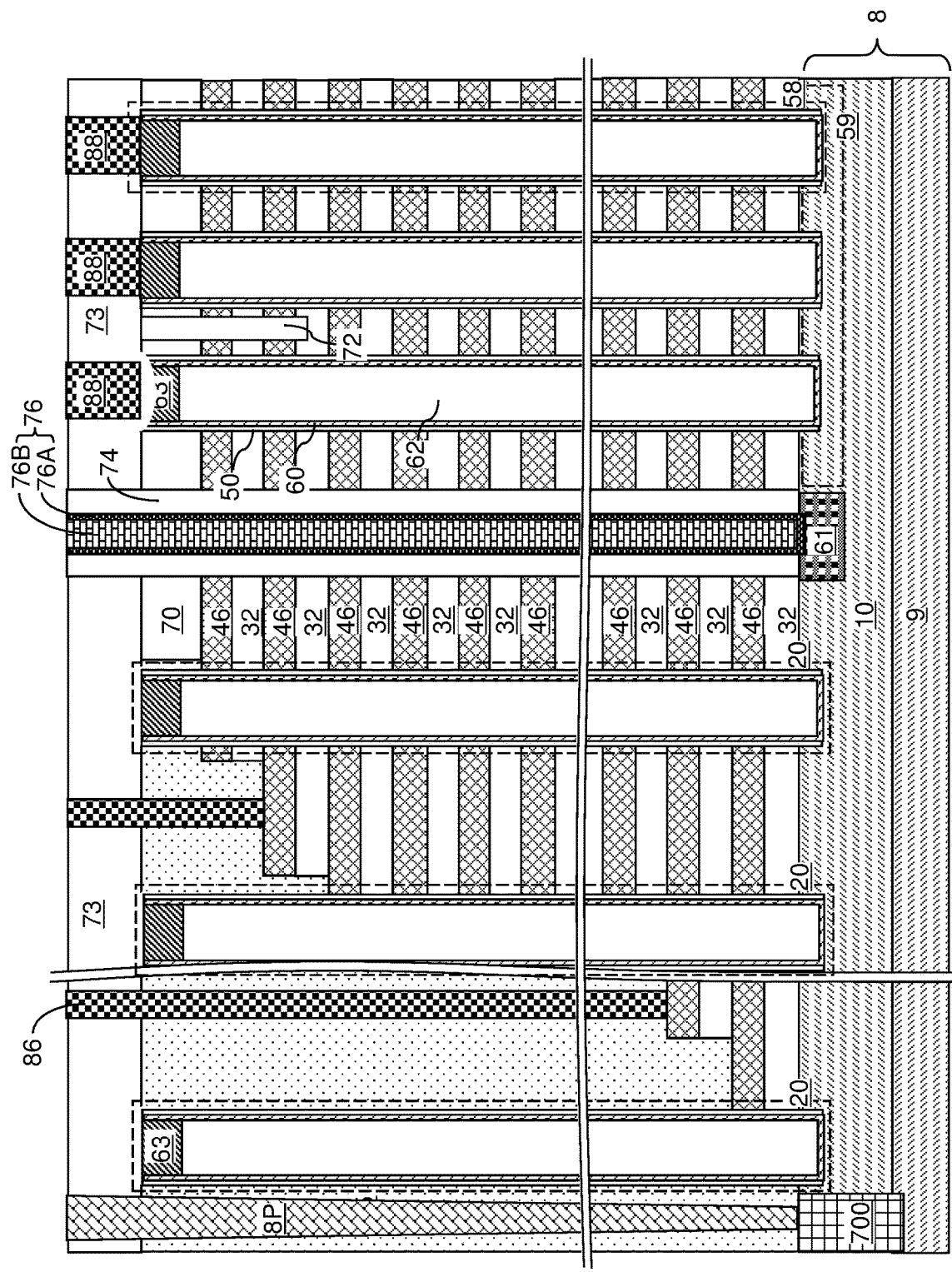
FIG. 35A is a schematic vertical cross-sectional view of the ninth exemplary structure after formation of insulating spacers, backside contact structures, and additional contact via structures according to an embodiment of the present disclosure.
Figure 35B:
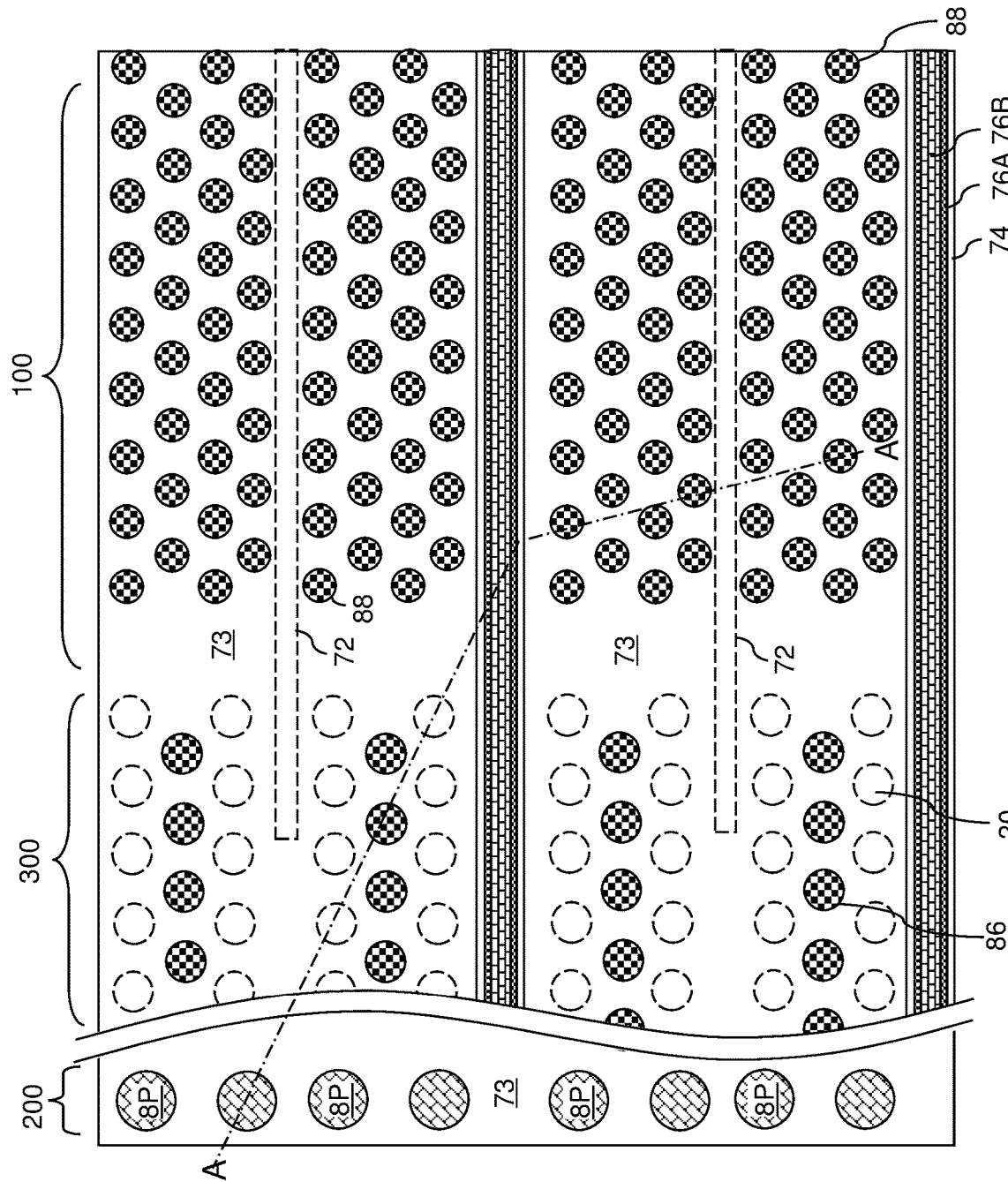
FIG. 35B is a top-down view of the ninth exemplary structure of FIG. 35A. The vertical plane A-A' is the plane of the schematic vertical cross-sectional view of FIG. 35A.

Referring to FIGS. 35A and 35B, an insulating material layer can be formed in the backside trenches 79 and over the contact-level dielectric layer 73 by a conformal deposition process. Ninth exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the upper substrate semiconductor layer 10 can be physically exposed at the bottom of each backside trench 79.

An upper portion of the upper substrate semiconductor layer 10 that extends between the source region 61 and a plurality of vertical semiconductor channels 60 constitutes a horizontal semiconductor channel 59 for a plurality of field effect transistors. The horizontal semiconductor channel 59 contacts the source region 61 and the plurality of vertical semiconductor channels 60. Each source region 61 is formed in an upper portion of the substrate 8. Semiconductor channels (59, 60) extend between each source region 61 and a respective set of drain regions 63. The semiconductor channels (59, 60) include the vertical semiconductor channels 60 of the memory stack assemblies 58.

A backside contact via structure 76 can be formed within each backside cavity. Each contact via structure 76 can fill a respective backside cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

In the eighth and ninth exemplary structures, the electrically conductive layers 46 may function as gate electrodes for a three-dimensional array of ferroelectric memory elements, which comprise portions of the ferroelectric gate dielectric layers 50 located at the levels of the electrically conductive layers 46.

Referring to all drawings and according to various embodiments of the present disclosure, a ferroelectric transistor is provided, which comprises: a semiconductor channel (60, 160) comprising a semiconductor material; a defect containing ferroelectric gate dielectric layer (50, 150) located on a surface of the semiconductor channel {(59, 60), 160} and comprising at least one of a noble gas element or nanoclusters of a non-polar metallic element that does not form a ferroelectric oxide material upon combination with oxygen at an atomic percentage in a range from 0.01% to 10%; a gate electrode (46, 154) located on the defect containing ferroelectric gate dielectric layer (50, 150); a source region (61, 134) located on a first end portion of the semiconductor channel {(59, 60), 160}; and a drain region 63 located on a second end portion of the semiconductor channel {(59, 60), 160}.

In one embodiment, the defect containing ferroelectric gate dielectric layer (50, 150) comprises a polycrystalline ferroelectric dielectric material including at least one of lattice or grain boundary defects. In one embodiment, the at least one of lattice or grain boundary defects comprise pinned grain boundaries. The nanoclusters of the non-polar metallic element are present at the pinned grain boundaries at a higher atomic concentration than within grains of the defect containing ferroelectric gate dielectric layer (50, 150). In one embodiment, the non-polar metallic element comprises an element selected from Mg, Ga, In, Sc, Y, rate earth elements, Ti, Zr or Hf. In another embodiment, the defect containing ferroelectric gate dielectric layer comprises atoms of a noble gas element.

In one embodiment, the ferroelectric transistor comprises: a semiconductor layer (9, 10); an alternating stack of insulating layers 32 and electrically conductive layers 46 located over the semiconductor layer (9, 10); a memory stack assembly 58 vertically extending through the alternating stack (32, 46) and comprising a vertically-extending portion of the semiconductor channel (59, 60) and the defect containing ferroelectric gate dielectric layer 50.

In one embodiment, the vertically-extending portion of the semiconductor channel (59, 60) vertically extends through a plurality of electrically conductive layers 46 and through a plurality of insulating layers 32 within the alternating stack (32, 46); and one of the electrically conductive layers 46 of the alternating stack (32, 46) comprises the gate electrode 46 and additional electrically conductive layers 46 of the alternating stack (32, 46) comprise additional gate electrodes 46 within a NAND string.

In one embodiment, the defect containing ferroelectric gate dielectric layer 50 vertically extends through a plurality of electrically conductive layers 46 and through a plurality of insulating layers 32 within the alternating stack (32, 46).

In one embodiment, the semiconductor channel 160 is a portion of a single crystalline semiconductor layer (210 or 104). In one embodiment, a predominant fraction of an entire volume of the defect containing ferroelectric gate dielectric layer 150 contacting the single crystalline semiconductor layer (210 or 104) is in epitaxial alignment with a single crystalline semiconductor material of the single crystalline semiconductor layer (210 or 104).

In one embodiment, the single crystalline semiconductor layer 210 comprises a strained single crystalline semiconductor layer 210; and the defect containing ferroelectric gate dielectric layer 150 is laterally strained within a horizontal plane with an average horizontal lattice constant that differs from an average horizontal lattice constant in an unstrained state at least by 0.01%. In one embodiment, the defect containing ferroelectric gate dielectric layer comprises orthorhombic phase hafnium oxide inserted with at least one of Mg, Ga, In, Sc, Y, rare earth elements, Ti, Ca, Ta, Pt, Mo, Ag, and/or Au, etc.

According to another aspect of the present disclosure, a ferroelectric transistor is provided, which comprises: a strained single crystalline semiconductor layer 210; a strained ferroelectric gate dielectric layer (240, 150) located on a top surface of the strained single crystalline semiconductor layer 210; a gate electrode 154 located on the strained ferroelectric gate dielectric layer (240, 150); and a source region 134 and a drain region 136 embedded within, or in contact with, the strained single crystalline semiconductor layer 210 and laterally spaced apart from each other by a semiconductor channel 260 located within the strained single crystalline semiconductor layer 210 and underlying the strained ferroelectric gate dielectric layer (240, 150).

In one embodiment, the ferroelectric transistor further comprises a substrate semiconductor layer 104 comprising a first single crystalline semiconductor material and having a first in-plane average lattice constant. The strained single crystalline semiconductor layer 210 comprises a second single crystalline semiconductor material, in epitaxial alignment with the substrate semiconductor layer, and having a second in-plane average lattice constant that is different from the first in-plane average lattice constant. At least a predominant fraction of an entire volume of the strained ferroelectric gate dielectric layer contacting the strained single crystalline semiconductor layer is in epitaxial alignment with the strained single crystalline semiconductor layer.

In one embodiment, the ferroelectric transistor comprises a single crystalline buffer semiconductor layer 206 located between, and epitaxially aligned to each of, the substrate semiconductor layer 104 and the strained single crystalline semiconductor layer 210, and having a variable in-plane lattice constant that changes as a function of a vertical distance from the substrate semiconductor layer 104.

In one embodiment, a portion of the strained ferroelectric gate dielectric layer (240, 150) overlying the strained single crystalline semiconductor layer 210 is single crystalline, and is epitaxially aligned to the strained single crystalline semiconductor layer 210. In one embodiment, the strained ferroelectric gate dielectric layer (240, 150) is laterally strained within a horizontal plane with an average horizontal lattice constant that differs from an average horizontal lattice constant in an unstrained state at least by 0.01%. In one embodiment, the strained ferroelectric gate dielectric layer (240, 150) has a coercive field that is greater than a coercive field of an unstrained ferroelectric material having a same thickness, a same material composition, and a same crystallographic orientation by at least 1%.

In one embodiment, each of the substrate semiconductor layer 104 and the strained single crystalline semiconductor layer 210 comprises silicon atoms at an atomic percentage greater than 50%; and at least one of the substrate semiconductor layer 104 and the strained single crystalline semiconductor layer 210 comprises germanium or carbon at an atomic percentage greater than 0.1%.

In one embodiment, the strained ferroelectric gate dielectric layer 150 comprises nanoclusters of a non-polar metallic element that does not form a ferroelectric oxide material upon combination with oxygen at an atomic percentage in a range from 0.01% to 10%. In one embodiment, the strained ferroelectric gate dielectric layer 150 is polycrystalline and includes pinned grain boundaries. In one embodiment, atoms of the non-polar metallic element are present at the pinned grain boundaries at a higher atomic concentration than within grains of the strained ferroelectric gate dielectric layer 150. In one embodiment, the non-polar metallic element comprises an element selected from Mg, Ga, In, Sc, Y, rate earth elements, Ti, Zr or Hf. In one embodiment, the strained ferroelectric gate dielectric layer comprises atoms of a noble gas. In one embodiment, the strained ferroelectric gate dielectric layer comprises orthorhombic phase hafnium oxide inserted with at least one of Mg, Ga, In, Sc, Y, rare earth elements, Ti, Ca, Ta, Pt, Mo, Ag, and/or Au, etc.

The various embodiments of the present disclosure provide ferroelectric memory transistors which include defect containing and/or strained ferroelectric gate dielectric layers (50, 150, 240) that provide a higher coercive field which lead to enhanced memory windows. Increase in the memory windows increases the operational voltage range for ferroelectric memory transistors and increases the signal-to-noise ratio during the operation of the memory devices containing such ferroelectric transistors.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A ferroelectric transistor, comprising:
   a strained single crystalline semiconductor layer;
   a strained ferroelectric gate dielectric layer located on a top surface of the strained single crystalline semiconductor layer;
   a gate electrode located on the strained ferroelectric gate dielectric layer;
   a source region and a drain region embedded within or in contact with the strained single crystalline semiconductor layer and laterally spaced apart from each other by a semiconductor channel located within the strained single crystalline semiconductor layer and underlying the strained ferroelectric gate dielectric layer; and
   a substrate semiconductor layer comprising a first single crystalline semiconductor material and having a first in-plane average lattice constant;
   wherein:
   the strained single crystalline semiconductor layer comprises a second single crystalline semiconductor material, in epitaxial alignment with the substrate semiconductor layer, and having a second in-plane average lattice constant that is different from the first in-plane average lattice constant; and
   at least a predominant fraction of an entire volume of the strained ferroelectric gate dielectric layer contacting the strained single crystalline semiconductor layer is in epitaxial alignment with the strained single crystalline semiconductor layer.

2. The ferroelectric transistor of claim 1, further comprising a single crystalline buffer semiconductor layer located between, and epitaxially aligned to each of, the substrate semiconductor layer and the strained single crystalline semiconductor layer, and having a variable in-plane lattice constant that changes as a function of a vertical distance from the substrate semiconductor layer.

3. The ferroelectric transistor of claim 1, wherein a portion of the strained ferroelectric gate dielectric layer overlying the strained single crystalline semiconductor layer is single crystalline, and is epitaxially aligned to the strained single crystalline semiconductor layer.

4. The ferroelectric transistor of claim 1, wherein:
   each of the substrate semiconductor layer and the strained single crystalline semiconductor layer comprises silicon atoms at an atomic percentage greater than 50%; and
   at least one of the substrate semiconductor layer and the strained single crystalline semiconductor layer comprises germanium or carbon at an atomic percentage greater than 0.1%.

5. A ferroelectric transistor, comprising:
   a strained single crystalline semiconductor layer;
   a strained ferroelectric gate dielectric layer located on a top surface of the strained single crystalline semiconductor layer;
   a gate electrode located on the strained ferroelectric gate dielectric layer; and
   a source region and a drain region embedded within or in contact with the strained single crystalline semiconductor layer and laterally spaced apart from each other by a semiconductor channel located within the strained single crystalline semiconductor layer and underlying the strained ferroelectric gate dielectric layer;
   wherein the strained ferroelectric gate dielectric layer comprises nanoclusters of a non-polar metallic element that does not form a ferroelectric oxide material upon combination with oxygen at an atomic percentage in a range from 0.01% to 10%.

* * * * *